US012707887B2

(12) United States Patent
Park et al.

(10) Patent No.: US 12,707,887 B2
(45) Date of Patent: Aug. 11, 2026

(54) ORGANIC COMPOUNDS AND ORGANIC LIGHT EMITTING DIODE COMPRISING THE SAME

(71) Applicant: Material Science Co., Ltd., Seoul (KR)

(72) Inventors: Hee-Jun Park, Seoul (KR); Seung-Hyun Kim, Seoul (KR); Sun-Jung Kim, Seoul (KR); Seok-Geun Jin, Seoul (KR)

(73) Assignee: Material Science Co., Ltd., Seoul (KR)

( * ) Notice: Subject to any disclaimer, the term of this patent is extended or adjusted under 35 U.S.C. 154(b) by 292 days.

(21) Appl. No.: 18/243,208

(22) Filed: Sep. 7, 2023

(65) Prior Publication Data

US 2024/0334815 A1 Oct. 3, 2024

(30) Foreign Application Priority Data

Feb. 17, 2023 (KR) ........................ 10-2023-0021174

(51) Int. Cl.

| | |
|---|---|
| ***H10K 85/60*** | (2023.01) |
| ***H10K 50/11*** | (2023.01) |
| ***H10K 50/15*** | (2023.01) |
| ***H10K 50/16*** | (2023.01) |
| ***H10K 50/17*** | (2023.01) |

(52) U.S. Cl.

CPC .......... *H10K 85/631* (2023.02); *H10K 50/11* (2023.02); *H10K 50/15* (2023.02); *H10K 50/16* (2023.02); *H10K 50/171* (2023.02); *H10K 85/6572* (2023.02); *H10K 85/6574* (2023.02); *H10K 85/6576* (2023.02)

(58) Field of Classification Search

CPC ...... H10K 85/631; H10K 50/11; H10K 50/15; H10K 50/16; H10K 50/171; H10K 85/6572; H10K 85/6574; H10K 85/6576; H10K 59/873; H10K 50/842; H10K 59/10; H10K 85/615; H10K 85/633; H10K 85/636

See application file for complete search history.

(56) References Cited

U.S. PATENT DOCUMENTS

| | | | | |
|---|---|---|---|---|
| 9,711,747 B2 | 7/2017 | Han et al. | | |
| 2014/0034942 A1* | 2/2014 | Saito | H10K 85/6576 | 257/40 |
| 2021/0351365 A1 | 11/2021 | Bang et al. | | |
| 2022/0020937 A1* | 1/2022 | Ahn | H10K 50/11 | |
| 2022/0190296 A1 | 6/2022 | Choi et al. | | |

FOREIGN PATENT DOCUMENTS

| | | |
|---|---|---|
| KR | 101905721 B1 | 10/2018 |
| KR | 20220087590 A | 6/2022 |

OTHER PUBLICATIONS

Request for the Submission of an Opinion dated Jun. 13, 2025 issued in Korean Application No. 10-2024-0094622(8 pages).

* cited by examiner

*Primary Examiner* — Moazzam Hossain

(74) *Attorney, Agent, or Firm* — Carter, DeLuca & Farrell, LLP; George Likourezos; Bret P. Shapiro

(57) ABSTRACT

The organic light emitting diode according to an embodiment of the present disclosure includes a first electrode, a second electrode disposed opposite to the first electrode, one or more organic layers positioned on the inside of the first electrode and the second electrode, and a capping layer positioned on at least one outside of the first electrode and the second electrode, wherein a color viewing angle ($\Delta u'v'$) at viewing angles of 30°, 45° and 60° of light produced from the organic layer and emitted through the capping layer, is less than 0.010.

10 Claims, No Drawings

ORGANIC COMPOUNDS AND ORGANIC LIGHT EMITTING DIODE COMPRISING THE SAME

BACKGROUND

1. Field

The present disclosure herein relates to organic compounds and an organic light emitting diode including the same.

2. Description of the Related Art

An organic light emitting diode (OLED) has a simple structure in comparison to other flat panel display devices like a liquid crystal display device (LCD), a plasma display panel (PDP) and a field emission display (FED), various advantages in a manufacturing process, high luminance, excellent viewing angle characteristics, and a low driving voltage, and is actively developed and commercialized to be used as a light source of backlight, lighting, billboard, or the like, in a flat panel display like a wall-mountable television or a display.

An organic light emitting diode is composed of an organic layer between two electrodes. The diode utilizes a principle as follows. Electrons and holes, respectively from the two electrodes are injected into an emitting layer and combined to produce excitons, and the produced excitons emit light during the transition from an excited state to a ground state.

The organic light emitting diode may include an emitting layer at least one layer. Generally, an organic light emitting diode provided with multiple emitting layers includes emitting layers emitting light having different peak wavelengths, and through the combination of the light having different peak wavelengths, a specific color may be accomplished.

However, since the peak of the spectrum of light emitted from the organic light emitting diode changes according to the position where a user looks at an organic electroluminescence display device, and color changes according to the position where a user looks at the display device, and thus, it is difficult to accomplish uniform images.

Meanwhile, according to the tendency of gradually reducing a non-luminous part in an organic electroluminescence display device, the wiring of another panel may be recognized according to a viewing angle, or color change may be recognized according to a viewing angle.

In addition, a user using a display device may look at images displayed on the display device in front of the display device, but may look at a screen on which images are displayed from various angles. Accordingly, it is required to minimize the phenomenon of changing color coordinates so that a user may watch images from various angles.

SUMMARY

An embodiment of the present disclosure is to provide an organic light emitting diode having excellent color viewing angle characteristics.

Embodiments according to the present disclosure may be used for accomplishing other tasks particularly unmentioned, in addition to the above-described task.

The present disclosure is not limited to the aforementioned objects, and unmentioned other objects and advantages may be understood by the explanation below and may be clearly understood by the embodiments of the present disclosure. In addition, it can be easily found that the objects and advantages of the present disclosure may be accomplished by the means and combinations thereof shown in the attached claims.

An organic light emitting diode according to an embodiment of the present disclosure includes a first electrode, a second electrode disposed opposite to the first electrode, one or more organic layers positioned on the inside of the first electrode and the second electrode, and a capping layer positioned on at least one outside of the first electrode and the second electrode.

Here, the capping layer includes a compound represented by Formula 1, and a color viewing angle ($\Delta u'v'$) at viewing angles of 30°, 45° and 60° of light produced from the organic layer and emitted through the capping layer, is less than 0.010.

[Formula 1]

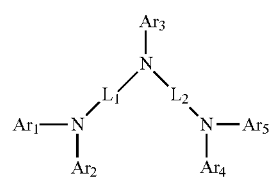

Where $L_1$ and $L_2$ are the same or different, and are each independently selected from the group consisting of a single bond, a substituted or unsubstituted arylene group of 6 to 30 carbon atoms, a substituted or unsubstituted arylalkylene group of 7 to 30 carbon atoms, a substituted or unsubstituted heteroarylene group of 5 to 60 carbon atoms and a substituted or unsubstituted heteroarylalkylene group of 6 to 60 carbon atoms.

$Ar_1$, $Ar_2$, $Ar_3$, $Ar_4$ and $Ar_5$ are the same or different, and are each independently selected from the group consisting of a substituted or unsubstituted aryl group of 6 to 30 carbon atoms, a substituted or unsubstituted arylalkyl group of 7 to 30 carbon atoms, a substituted or unsubstituted heteroaryl group of 5 to 60 carbon atoms, a substituted or unsubstituted heteroarylalkyl group of 6 to 60 carbon atoms, a substituted or unsubstituted arylamino group of 6 to 30 carbon atoms, a substituted or unsubstituted arylalkylamino group of 6 to 30 carbon atoms, a substituted or unsubstituted heteroarylamino group of 5 to 60 carbon atoms, a substituted or unsubstituted arylsilyl group of 6 to 30 carbon atoms and a substituted or unsubstituted aryloxy group of 6 to 30 carbon atoms, or combined with an adjacent group from each other to form a substituted or unsubstituted ring.

The substituents of $L_1$, $L_2$, $Ar_1$, $Ar_2$, $Ar_3$, $Ar_4$ and $Ar_5$ are each independently substituted with one or more substituents selected from the group consisting of deuterium, a cyano group, a trifluoromethyl group, a nitro group, a halogen group, a hydroxyl group, a trimethylsilylethynyl (TMS) group, an alkyl group of 1 to 30 carbon atoms, a cycloalkyl group of 3 to 20 carbon atoms, an alkenyl group of 2 to 30 carbon atoms, a cycloalkenyl group of 3 to 20 carbon atoms, an alkynyl group of 2 to 30 carbon atoms, a cycloalkynyl group of 3 to 20 carbon atoms, an aryl group of 6 to 30 carbon atoms, an arylalkyl group of 7 to 30 carbon atoms, a heteroaryl group of 5 to 60 carbon atoms, a heteroarylalkyl group of 6 to 60 carbon atoms, an amine group, an alkylamino group of 1 to 30 carbon atoms, an arylalkylamino group of 7 to 30 carbon atoms, an arylamino group of 6 to 30 carbon atoms, a heteroarylamino group of 5 to 60 carbon atoms, a silyl group, an alkylsilyl group of 1 to 30 carbon atoms, an arylsilyl group of 6 to 30 carbon atoms, an alkoxy group of 1 to 30 carbon atoms, an aryloxy group of 6 to 30 carbon atoms, an alkylthio group of 1 to 30 carbon atoms and an arylthio group of 6 to 30 carbon atoms, where if multiple substituents are introduced, the multiple substituents are the same or different.

DETAILED DESCRIPTION

Hereinafter, the above objects, features and advantages will be explained in detail, and thus, a person having ordinary knowledge in the technical field in which the present disclosure belongs to can easily conduct the technical spirit of the present disclosure.

In the explanation of the present description, if particular explanation on relevant prior art is considered to obscure the gist of the present description unnecessarily, detailed explanation thereof will be omitted.

In the description, if the terms "comprises", "includes", "consists of", "disposes" or "provides" elements is used, other elements may be added unless "only~" is used. The singular forms of an element are intended to include the plural forms as well unless the context clearly indicates otherwise.

In the interpretation of an element in the description, it could include the margin of error though there is no separate explicit description.

In the description, when an element is referred to as being "on (or under)" or "above (or below)" another arbitrary element, the arbitrary element can be disposed to contact with the top (or bottom) of the element, or intervening elements may also be present between the element and the arbitrary element disposed on (or under) the element.

The organic light emitting diode according to an embodiment of the present disclosure has very excellent color viewing angle characteristics, and a user may not recognize color change according to a viewing angle at all. Also, a capping layer having a high refractive index is included, and light loss due to total reflection may be minimized, and the emission efficiency, external quantum efficiency, stability, driving voltage characteristics and life-characteristics of the diode may be excellent.

The term "halogen group" used in the description includes fluorine, chlorine, bromine and iodine.

The term "alkyl group" used in the description means both a linear alkyl radical and a branched alkyl radical. Unless otherwise specifically limited, the alkyl group contains 1 to 30 carbon atoms, and may include methyl, ethyl, propyl, isopropyl, butyl, sec-butyl, isobutyl, tert-butyl, pentyl, isoamyl, hexyl, or the like, without limitation. In addition, the alkyl group may be arbitrarily substituted.

The term "cycloalkyl group" used in the description means a cyclic alkyl radical. Unless otherwise specifically limited, the cycloalkyl group contains 3 to 20 carbon atoms and may include cyclopropyl, cyclobutyl, cyclopentyl, cyclohexyl, norbornyl, adamantyl, or the like, without limitation. In addition, the cycloalkyl group may be arbitrarily substituted.

The term "alkenyl group" used in the description means a both linear alkene radical and a branched alkene radical, having one or more carbon-carbon double bonds. Unless otherwise specifically limited, the alkenyl group contains 2 to 30 carbon atoms and may include vinyl, allyl, isopropenyl, 2-butenyl, or the like, without limitation. In addition, the alkenyl group may be arbitrarily substituted.

The term "cycloalkenyl group" used in the description means a cyclic alkenyl radical. Unless otherwise specifically limited, the cycloalkenyl group contains 3 to 20 carbon atoms. In addition, the cycloalkenyl group may be arbitrarily substituted.

The term "alkynyl group" used in the description means both a linear alkyne radical and a branched alkyne radical, having one or more carbon-carbon triple bonds. Unless otherwise specifically limited, the alkynyl group contains 2 to 30 carbon atoms and may include ethynyl, 2-propynyl, or the like, without limitation. In addition, the alkynyl group may be arbitrarily substituted.

The term "cycloalkynyl group" used in the description means a cyclic alkynyl radical. Unless otherwise specifically limited, the cycloalkynyl group contains 3 to 20 carbon atoms. In addition, the cycloalkynyl group may be arbitrarily substituted.

The terms "aralkyl group" and "arylalkyl group" used in the description are inter-mixed and mean an alkyl group having an aromatic group as a substituent. In addition, the aralkyl group (arylalkyl group) may be arbitrarily substituted.

The terms "aryl group" and "aromatic group" used in the description are used to have the same meaning, and the aryl group includes both a monocyclic group and a polycyclic group. The polycyclic group may include a "fused ring" of two or more rings, in which two carbon atoms are common in two adjacent rings. In addition, a simple pendant type or a fused type of two or more rings may be included. Unless otherwise specifically limited, the aryl group contains 6 to 30 carbon atoms and may include phenyl, naphthyl, phenanthryl, anthryl, fluorenyl, dimethylfluorenyl, or the like, without limitation. In addition, the aryl group may be arbitrarily substituted.

The terms "heteroaryl group" and "heteroaromatic group" used in the description are used to have the same meaning, and the heteroaryl group includes both a monocyclic group and a polycyclic group. The polycyclic group may include a "fused ring" of two or more rings, in which two carbon atoms or heteroatoms are common in two adjacent rings. In addition, a simple pendant type or a fused type of two or more rings may be included. Unless otherwise specifically limited, the heteroaryl group contains 5 to 60 carbon atoms, where one or more carbon in the rings are substituted with heteroatoms such as Oxygen (O), Nitrogen (N), Sulfur (S), and Selenium (Se), and may include 6-member monocyclic ring such as pyridyl, pyrazinyl, pyrimidinyl, pyridazinyl, and triazinyl, a polycyclic ring such as phenoxathienyl, indolizinyl, indolyl, purinyl, quinolyl, benzothiazolyl, and carbazolyl, 2-furanyl, N-imidazolyl, 2-isoxazolyl, 2-pyridinyl, 2-pyrimidinyl, or the like, without limitation. In addition, the heteroaryl group may be arbitrarily substituted.

The term "heterocyclic group" used in the present description means that at least one of carbon atoms composing an aryl group, a cycloalkyl group, a cycloalkenyl group, a cycloalkynyl group, an arylalkyl group, an arylamino group, or the like is substituted with a heteroatom including oxygen (O), nitrogen (N), sulfur (S), or the like, and may include, referring to the above-described definition, a heteroaryl group, a heterocycloalkyl group, a heterocycloalkenyl group, a heterocycloalkynyl group, a heteroarylalkyl group, a heteroarylamino group, or the like. In addition, the heterocycle may be arbitrarily substituted.

The term "carbon ring" used in the description may be used as a term including all of the "cycloalkyl group", the "cycloalkenyl group", and the "cycloalkynyl group", which are aliphatic cyclic groups, and the "aryl group (aromatic group)", which is an aromatic cyclic group, unless otherwise limited.

The terms used in the description of "heteroalkyl group", "heteroalkenyl group", "heteroalkynyl group" and "heteroarylalkyl group" mean that at least one of constituent carbon atoms is substituted with a heteroatom including oxygen (O), nitrogen (N), sulfur (S), or the like. In addition, the "heteroalkyl group", the "heteroalkenyl group", the "heteroalkynyl group" and the "heteroarylalkyl group" may be arbitrarily substituted.

The terms used in the description of "alkylamino group", "arylalkylamino group", "arylamino group", and "heteroarylamino group" are the alkyl group, the arylalkyl group, the aryl group, and the heteroaryl group that is a heterocycle, substituted with an amine group and include all primary, secondary and tertiary amines. In addition, the alkylamino group, the arylalkylamino group, the arylamino group, and the heteroarylamino group may be arbitrarily substituted.

The terms used in the description of "alkylsilyl group", "arylsilyl group", "alkoxy group", "aryloxy group", "alkylthio group" and "arylthio group" mean the alkyl group and the aryl group, respectively substituted with a silyl group, an oxy group and a thio group. In addition, the alkylsilyl group, the arylsilyl group, the alkoxy group, the aryloxy group, the alkylthio group and the arylthio group may be arbitrarily substituted.

The terms used in the description of "arylene group", "arylalkylene group", "heteroarylene group", and "heteroarylalkylene group" mean divalent substituents, that is, each of the aryl group, the arylalkyl group, the heteroaryl group and the heteroarylalkyl group further includes one substituent. In addition, the arylene group, the arylalkylene group, the heteroarylene group and the heteroarylalkylene group may be arbitrarily substituted.

The term "substituted" used in the description means that a substituent other than hydrogen (H) is bonded to a corresponding carbon atom, and if multiple substituents are present, the substituents may be all the same or different.

In the description, unless otherwise specifically limited, a substitution position is not limited as long as the position is where a hydrogen atom is substituted, i.e., a position where a substituent is substitutable. If multiple substituents of two or more are present, the substituents may be the same or different.

Subjects and substituents defined in the present description may be the same or different, unless otherwise specifically referred to.

Hereinafter, an organic compound and an organic light emitting diode including the same according to the present disclosure will be explained in detail. The organic light emitting diode according to an embodiment of the present disclosure includes a first electrode, a second electrode disposed opposite to the first electrode, one or more organic layers positioned on the inside of the first electrode and the second electrode, and a capping layer positioned on at least one outside of the first electrode and the second electrode.

Here, the capping layer includes a compound represented by Formula 1 below.

[Formula 1]

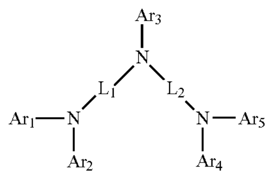

Here, $L_1$ and $L_2$ are the same or different, and are each independently selected from the group consisting of a single bond, a substituted or unsubstituted arylene group of 6 to 30 carbon atoms, a substituted or unsubstituted arylalkylene group of 7 to 30 carbon atoms, a substituted or unsubstituted heteroarylene group of 5 to 60 carbon atoms and a substituted or unsubstituted heteroarylalkylene group of 6 to 60 carbon atoms.

$Ar_1$, $Ar_2$, $Ar_3$, $Ar_4$ and $Ar_5$ are the same or different, and are each independently selected from the group consisting of a substituted or unsubstituted aryl group of 6 to 30 carbon atoms, a substituted or unsubstituted arylalkyl group of 7 to 30 carbon atoms, a substituted or unsubstituted heteroaryl group of 5 to 60 carbon atoms, a substituted or unsubstituted heteroarylalkyl group of 6 to 60 carbon atoms, a substituted or unsubstituted arylamino group of 6 to 30 carbon atoms, a substituted or unsubstituted arylalkylamino group of 6 to 30 carbon atoms, a substituted or unsubstituted heteroarylamino group of 5 to 60 carbon atoms, a substituted or unsubstituted arylsilyl group of 6 to 30 carbon atoms and a substituted or unsubstituted aryloxy group of 6 to 30 carbon atoms, or combined with an adjacent group from each other to form a substituted or unsubstituted ring.

The substituents of $L_1$, $L_2$, $Ar_1$, $Ar_2$, $Ar_3$, $Ar_4$ and $Ar_5$ are each independently substituted with one or more substituents selected from the group consisting of deuterium, a cyano group, a trifluoromethyl group, a nitro group, a halogen group, a hydroxyl group, a trimethylsilylethynyl (TMS) group, an alkyl group of 1 to 30 carbon atoms, a cycloalkyl group of 3 to 20 carbon atoms, an alkenyl group of 2 to 30 carbon atoms, a cycloalkenyl group of 3 to 20 carbon atoms, an alkynyl group of 2 to 30 carbon atoms, a cycloalkynyl group of 3 to 20 carbon atoms, an aryl group of 6 to 30 carbon atoms, an arylalkyl group of 7 to 30 carbon atoms, a heteroaryl group of 5 to 60 carbon atoms, a heteroarylalkyl group of 6 to 60 carbon atoms, an amine group, an alkylamino group of 1 to 30 carbon atoms, an arylalkylamino group of 7 to 30 carbon atoms, an arylamino group of 6 to 30 carbon atoms, a heteroarylamino group of 5 to 60 carbon atoms, a silyl group, an alkylsilyl group of 1 to 30 carbon atoms, an arylsilyl group of 6 to 30 carbon atoms, an alkoxy group of 1 to 30 carbon atoms, an aryloxy group of 6 to 30 carbon atoms, an alkylthio group of 1 to 30 carbon atoms and an arylthio group of 6 to 30 carbon atoms, where if multiple substituents are introduced, the multiple substituents are the same or different.

Here, the color viewing angle ($\Delta u'v'$) at viewing angles of 30°, 45° and 60° of light emitted from the organic light emitting diode is less than 0.010. In this case, the light emitted from the organic light emitting diode may mean light produced at an organic layer and emitted through a capping layer to the outside of the organic light emitting diode.

In the compound represented by Formula 1, $L_1$ and $L_2$ may be the same or different and may be each independently selected from the group consisting of a substituted or unsubstituted arylene group of 6 to 15 carbon atoms, a substituted or unsubstituted arylalkylene group of 7 to 16 carbon atoms, a substituted or unsubstituted heteroarylene group of 5 to 30 carbon atoms and a substituted or unsubstituted heteroarylalkylene group of 6 to 31 carbon atoms.

Particularly, $L_1$ and $L_2$ may be each independently selected from the group consisting of a substituted or unsubstituted arylene group of 6 to 10 carbon atoms, a substituted or unsubstituted arylalkylene group of 7 to 11 carbon atoms, a substituted or unsubstituted heteroarylene group of 5 to 10 carbon atoms and a substituted or unsubstituted heteroarylalkylene group of 6 to 11 carbon atoms.

In the compound represented by Formula 1, $Ar_1$, $Ar_2$, $Ar_3$, $Ar_4$ and $Ar_5$ may be the same or different and may be each independently selected from the group consisting of a substituted or unsubstituted aryl group of 6 to 26 carbon atoms, a substituted or unsubstituted arylalkyl group of 7 to 26 carbon atoms, a substituted or unsubstituted heteroaryl group of 5 to 32 carbon atoms, a substituted or unsubstituted heteroarylalkyl group of 6 to 32 carbon atoms, a substituted or unsubstituted arylamino group of 6 to 26 carbon atoms, a substituted or unsubstituted arylalkylamino group of 6 to 26 carbon atoms, a substituted or unsubstituted heteroarylamino group of 5 to 32 carbon atoms, a substituted or unsubstituted arylsilyl group of 6 to 26 carbon atoms and a substituted or unsubstituted aryloxy group of 6 to 26 carbon atoms.

Particularly, $Ar_1$, $Ar_2$, $Ar_3$, $Ar_4$ and $Ar_5$ may be each independently selected from the group consisting of a substituted or unsubstituted aryl group of 6 to 18 carbon atoms, a substituted or unsubstituted arylalkyl group of 7 to 18 carbon atoms, a substituted or unsubstituted heteroaryl group of 5 to 21 carbon atoms, a substituted or unsubstituted heteroarylalkyl group of 6 to 21 carbon atoms, a substituted or unsubstituted arylamino group of 6 to 18 carbon atoms, a substituted or unsubstituted arylalkylamino group of 6 to 18 carbon atoms, a substituted or unsubstituted heteroarylamino group of 5 to 21 carbon atoms, a substituted or unsubstituted arylsilyl group of 6 to 18 carbon atoms and a substituted or unsubstituted aryloxy group of 6 to 18 carbon atoms.

In the compound represented by Formula 1, $Ar_1$, $Ar_2$, $Ar_4$ and $Ar_5$ may be the same or different and may be each independently selected from Formula 2 or Formula 3 below.

[Formula 2]

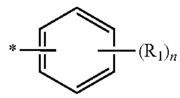

[Formula 3]

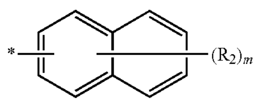

Here, "*" means a bonding part.

"n" is an integer of 0 to 5.

"m" is an integer of 0 to 7.

$R_1$ and $R_2$ may be each independently selected from the group consisting of hydrogen, deuterium, an alkyl group of 1 to 30 carbon atoms, an aryl group of 6 to 30 carbon atoms and a heteroaryl group of 5 to 60 carbon atoms.

In the compound represented by Formula 1, $Ar_3$ may be selected from the group consisting of Formula 4 to Formula 9 below.

[Formula 4]

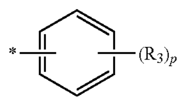

[Formula 5]

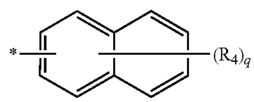

-continued

[Formula 6]

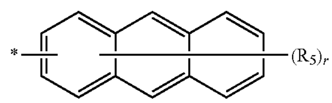

[Formula 7]

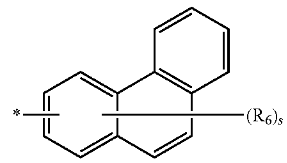

[Formula 8]

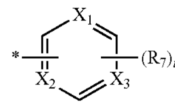

[Formula 9]

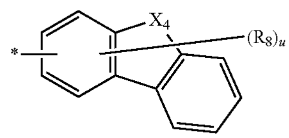

Here, "*" means a bonding part.

"p" is an integer of 0 to 5.

"q" is an integer of 0 to 7.

"r" is an integer of 0 to 9.

"s" is an integer of 0 to 9.

"(" is an integer of 0 to 2.

"u" is an integer of 0 to 7.

$X_1$, $X_2$, $X_3$ and $X_4$ are each independently selected from the group consisting of $C(R_9)$, $C(R_{10})(R_{11})$, N, $N(R_{12})$, O and S.

$R_3$, $R_4$, $R_5$, $R_6$, $R_7$, $R_8$, $R_9$, $R_{10}$, $R_{11}$ and $R_{12}$ are each independently selected from the group consisting of hydrogen, deuterium, an alkyl group of 1 to 30 carbon atoms, an aryl group of 6 to 30 carbon atoms and a heteroaryl group of 5 to 60 carbon atoms.

In the compound represented by Formula 1, $Ar_1$ and $Ar_5$ may be the same, and $Ar_2$ and $Ar_4$ may be the same. In this case, in the compound represented by Formula 1, $Ar_1$ and $Ar_2$, and $Ar_4$ and $Ar_5$ may form symmetric structures based on nitrogen (N) in the center.

A compound having a structure in which $Ar_1$ and $Ar_5$ are the same, and $Ar_2$ and $Ar_4$ are the same, may reduce one or more steps in its synthetic steps when compared to a compound in which $Ar_1$ and $Ar_5$ are different, or a compound in which $Ar_2$ and $Ar_4$ are different, and may be advantageous in forming a uniform thin film due to the symmetricity of the compound. In addition, it can be more advantageous for the manufacture of a large-size product requiring uniform thin film formation. Accordingly, in the synthetic process of a material, the forming of a thin film or the forming of a diode, economic feasibility may be improved, thin film uniformity may be improved, the emission efficiency and external quantum efficiency (EQE) of a diode may be increased, and the life-characteristics of a diode may become excellent.

According to an embodiment, in the compound represented by Formula 1, $Ar_1$, $Ar_2$, $Ar_3$, $Ar_4$ and $Ar_5$ may be the same or different and may be each independently a substituted or unsubstituted aryl group of 6 to 15 carbon atoms, or a substituted or unsubstituted heteroaryl group of 5 to 30 carbon atoms, particularly, a substituted or unsubstituted aryl group of 6 to 12 carbon atoms, or a substituted or unsubstituted heteroaryl group of 5 to 15 carbon atoms.

In addition, according to an embodiment, in the compound represented by Formula 1, $Ar_1$, $Ar_2$, $Ar_3$, $Ar_4$ and $Ar_5$ may be each independently an aryl group of three or less rings, or a heteroaryl group of three or less rings. In this case, a high glass transition temperature (Tg) may be achieved even with a low molecular weight, and a deposition temperature may be lowered. Accordingly, the thermal stability of a compound may be improved during deposition and operation. For example, $Ar_1$, $Ar_2$, $Ar_3$, $Ar_4$ and $Ar_5$ may be each independently a phenyl group, a biphenyl group, a naphthyl group, an anthracenyl group, a phenanthrenyl group, a carbazolyl group, a pyridinyl group, a dibenzofuranyl group, a dibenzothiophenyl group, a pyrimidinyl group, a quinolinyl group, an isoquinolinyl group, a benzoxazolyl group, a benzothiazolyl group, a benzoimidazolyl group or combinations thereof, without limitation.

According to an embodiment, in the compound represented by Formula 1, $Ar_1$ and $Ar_2$ may be combined with each other to form a substituted or unsubstituted heteroaryl group of 5 to 60 carbon atoms, and $Ar_4$ and $Ar_5$ may be combined with each other to form a substituted or unsubstituted heteroaryl group of 5 to 60 carbon atoms. Here, the heteroaryl group formed by the combination of $Ar_1$ and $Ar_2$, and the heteroaryl group formed by the combination of $Ar_4$ and $Ar_5$, may be the same. In this case, the synthetic steps may be reduced, and the formation of a uniform thin film may be advantageous due to the symmetricity of the compound. Accordingly, in the formation of a thin film or the formation of a diode, economic feasibility may be improved, thin film uniformity may be improved, the emission efficiency and external quantum efficiency (EQE) of a diode may be increased, and the life-characteristics of a diode may become excellent.

According to an embodiment, the compound of Formula 1 may be a compound of Formula 10.

[Formula 10]

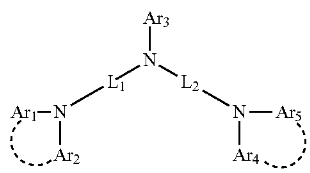

Here, $L_1$, $L_2$, $Ar_1$, $Ar_2$, $Ar_3$, $Ar_4$ and $Ar_5$ are the same as defined in Formula 1.

$Ar_1$ and $Ar_2$ may be connected through the dotted line to form a ring or not, and $Ar_4$ and $Ar_5$ may be connected through the dotted line to form a ring or not.

According to an embodiment, the compound of Formula 1 may be a compound of Formula 11.

[Formula 11]

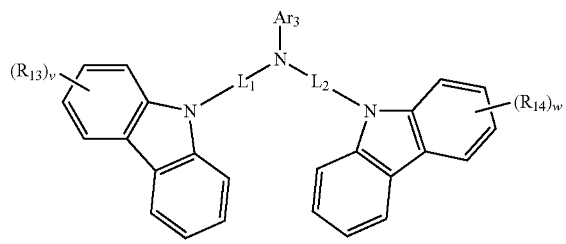

Here, $L_1$, $L_2$ and $Ar_3$ are the same as defined in Formula 1.

Here, "v" and "w" are integers of 0 to 7, $R_{13}$ and $R_{14}$ may be each independently selected from the group consisting of hydrogen, deuterium, an alkyl group of 1 to 30 carbon atoms, an aryl group of 6 to 30 carbon atoms and a heteroaryl group of 5 to 60 carbon atoms. Formula 11 is a carbazole type in which additional covalent bonds of the aryl groups of the arylamines are included, and even higher thermal stability may be achieved.

In the compounds represented by Formula 3 to Formula 11, $R_1$, $R_2$, $R_3$, $R_4$, $R_5$, $R_6$, $R_7$, $R_8$, $R_9$, $R_{10}$, $R_{11}$, $R_{12}$, $R_{13}$ and $R_{14}$ may be selected from the group consisting of an alkyl group of 1 to 15 carbon atoms, an aryl group of 6 to 15 carbon atoms and a heteroaryl group of 5 to 30 carbon atoms.

Particularly, $R_1$, $R_2$, $R_3$, $R_4$, $R_5$, $R_6$, $R_7$, $R_8$, $R_9$, $R_{10}$, $R_{11}$, $R_{12}$, $R_{13}$ and $R_{14}$ may be selected from the group consisting of an alkyl group of 1 to 10 carbon atoms, an aryl group of 6 to 10 carbon atoms and a heteroaryl group of 5 to 10 carbon atoms.

The compound represented by Formula 1 may be selected from the group consisting of the compounds below, without limitation.

1

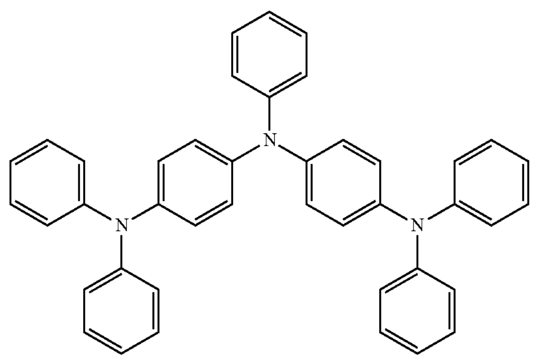

2

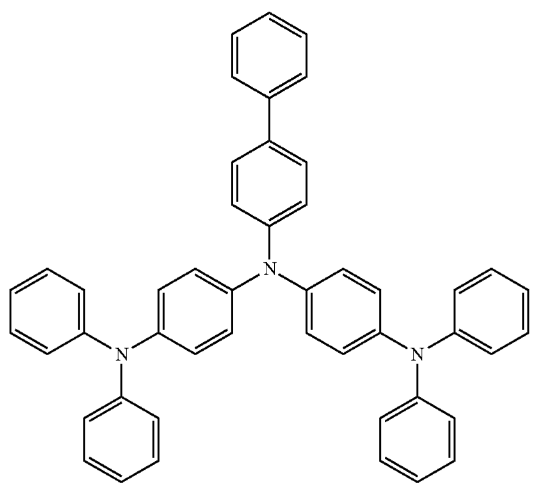

-continued
3
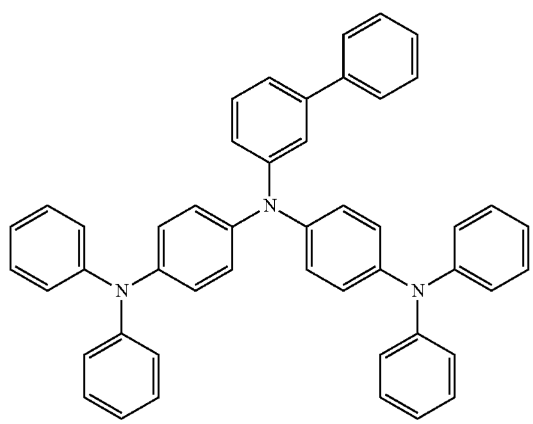
4
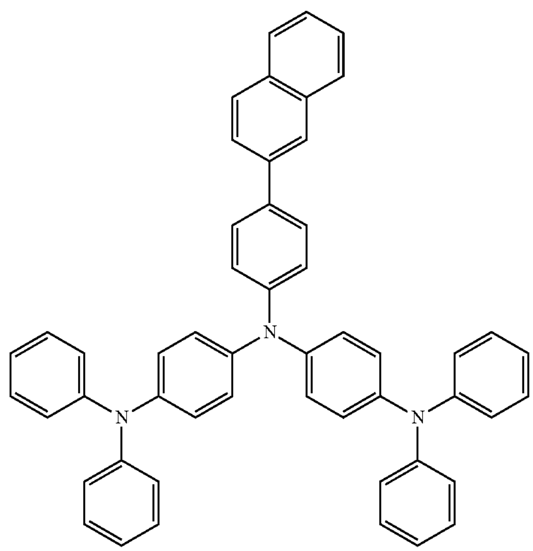
5
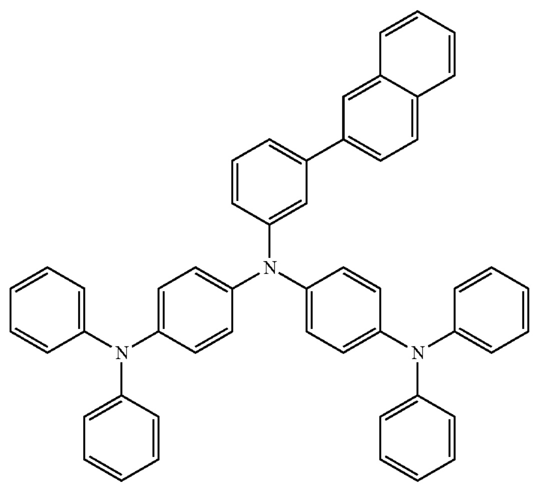
-continued
6
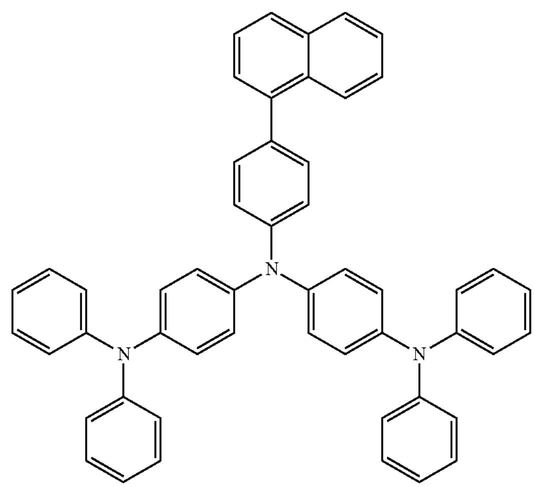
7
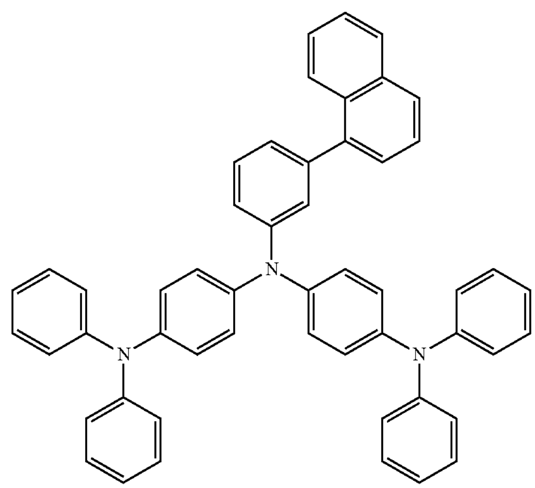
8
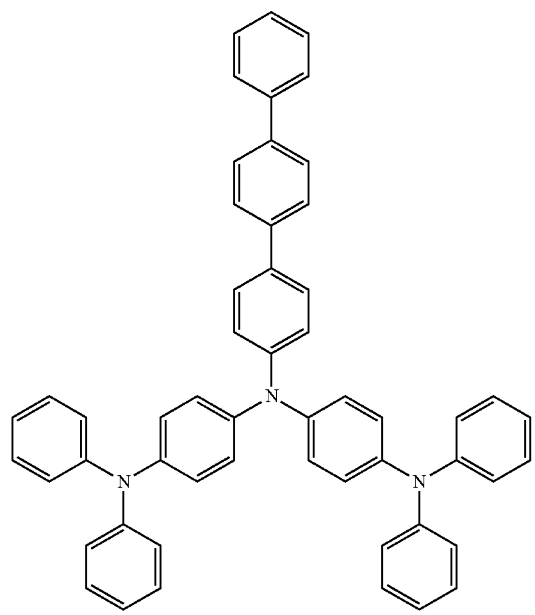

-continued
9
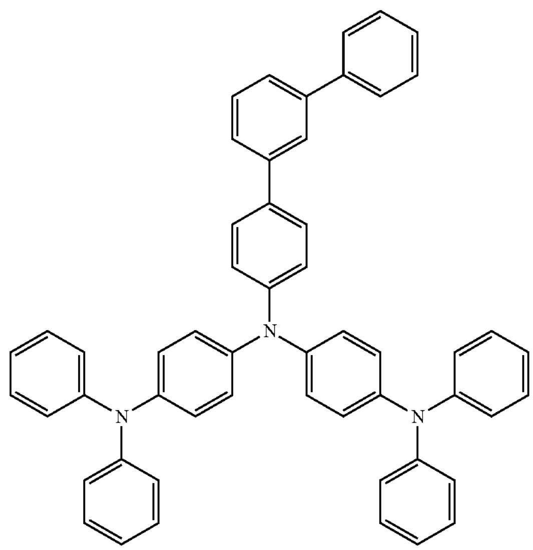
10
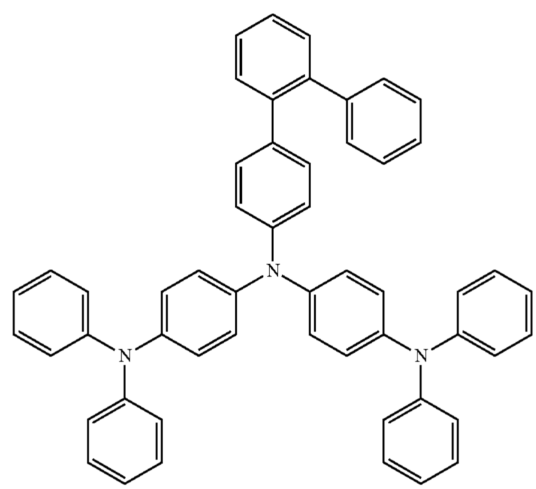
11
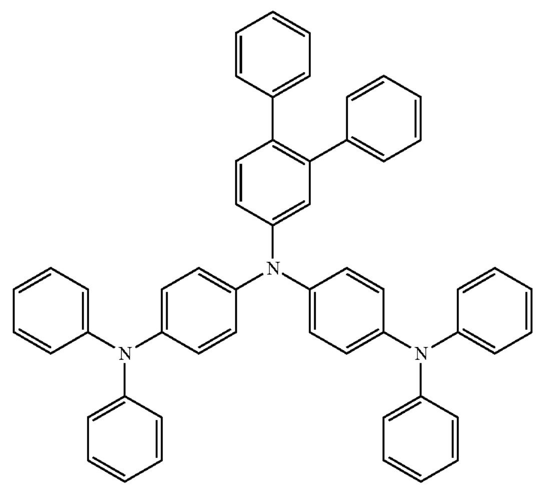
-continued
12
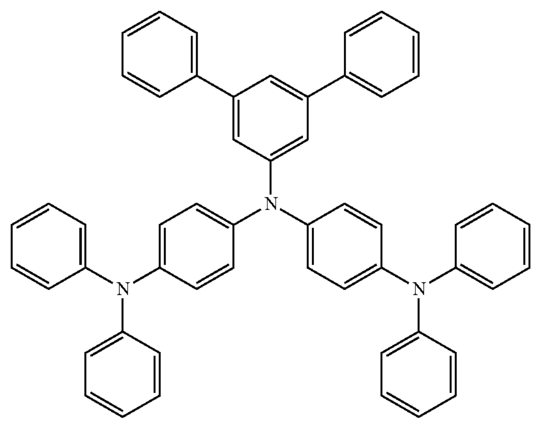
13
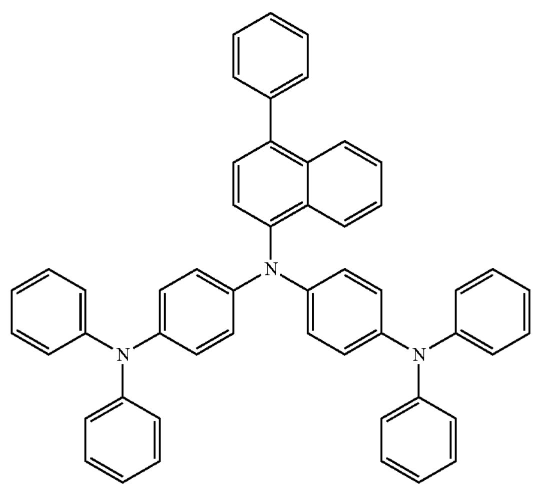
14
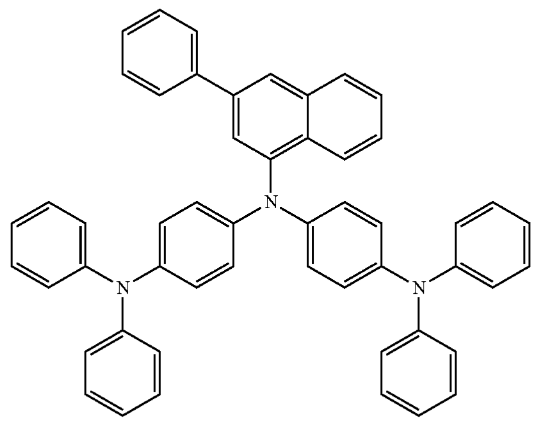

-continued
15
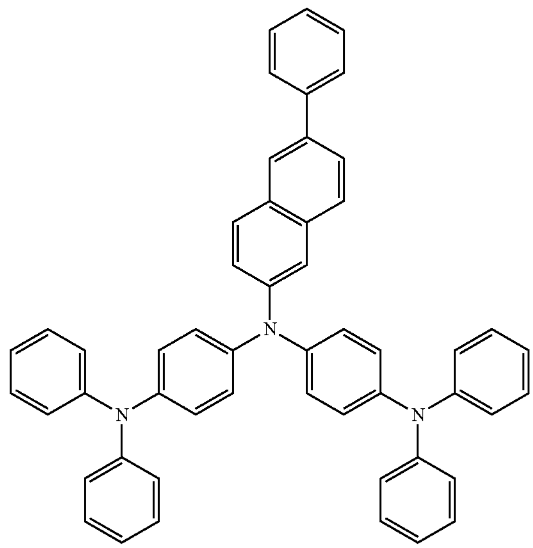
16
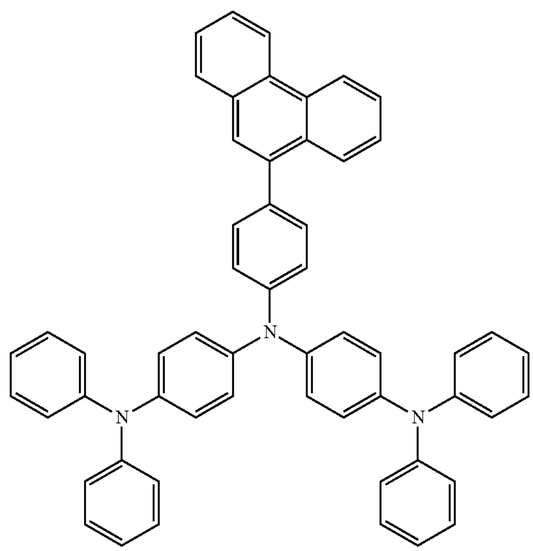
17
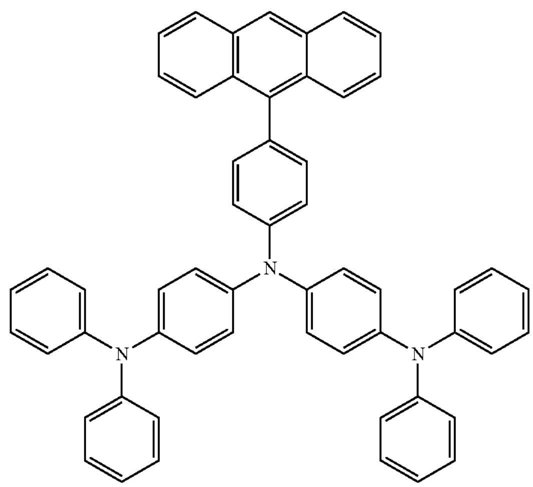
-continued
18
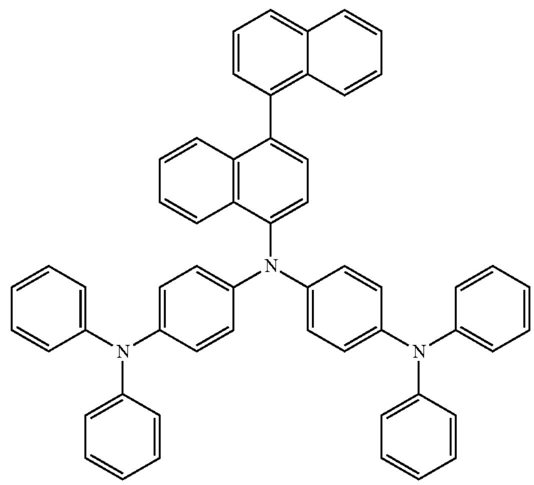
19
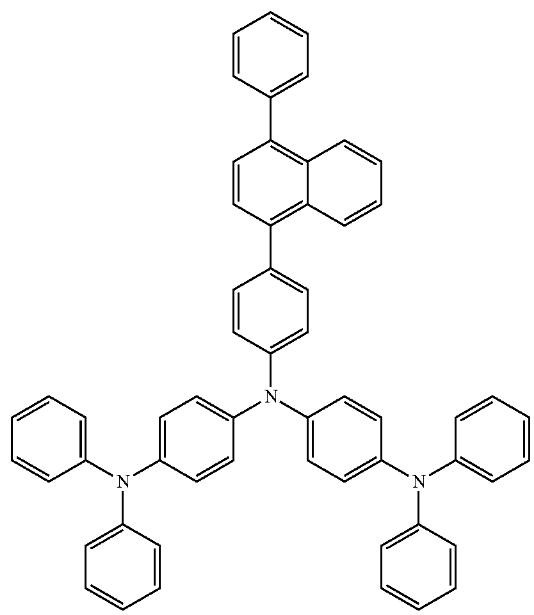

-continued
20
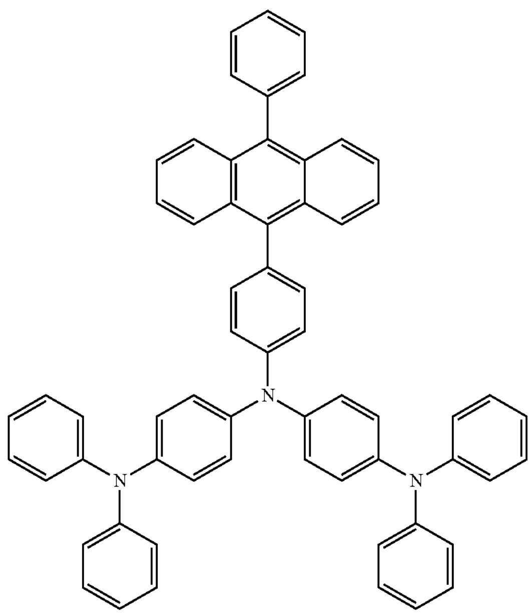
21
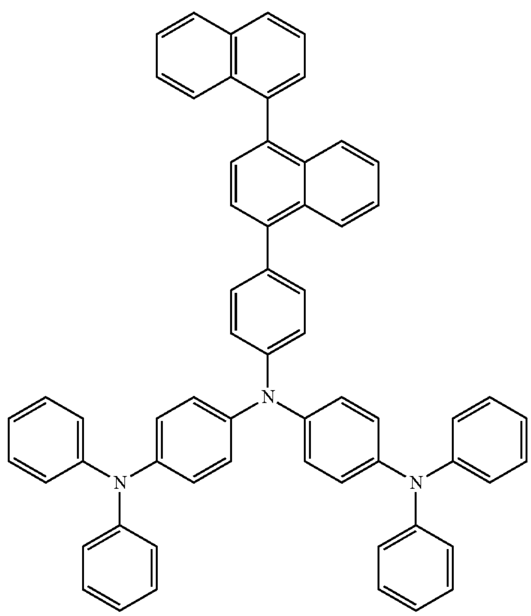
-continued
22
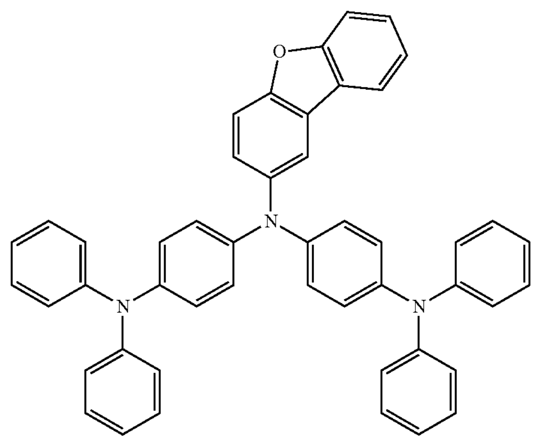
23
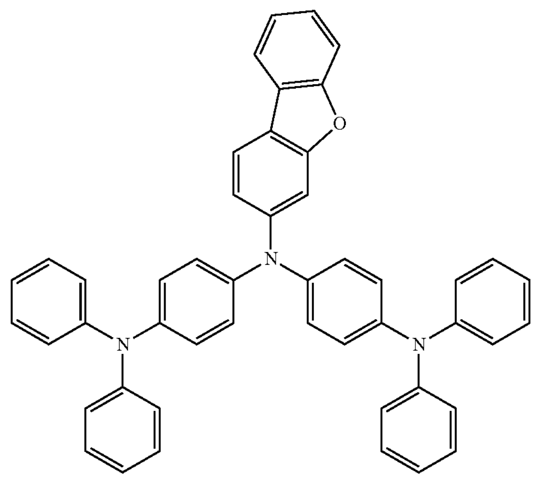
24
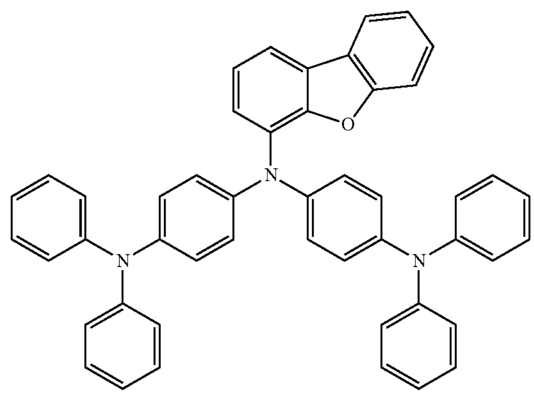

-continued
25
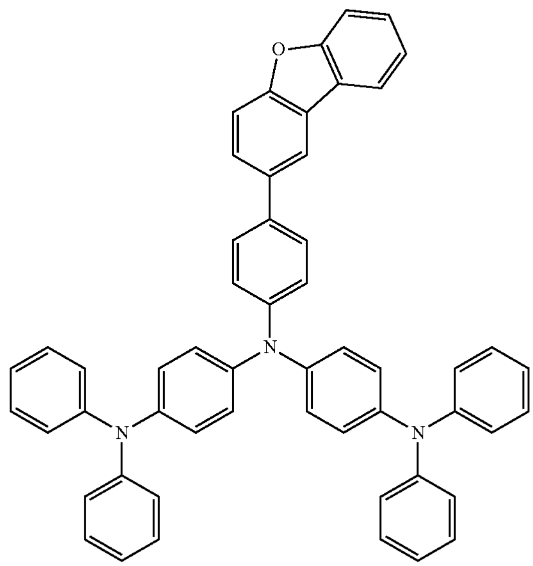
26
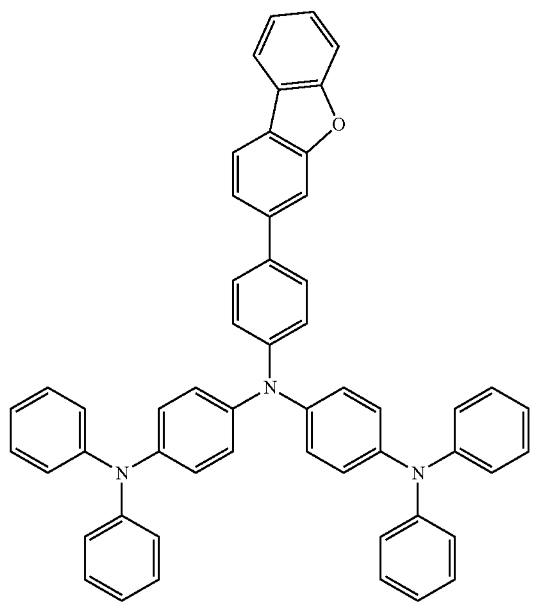
-continued
27
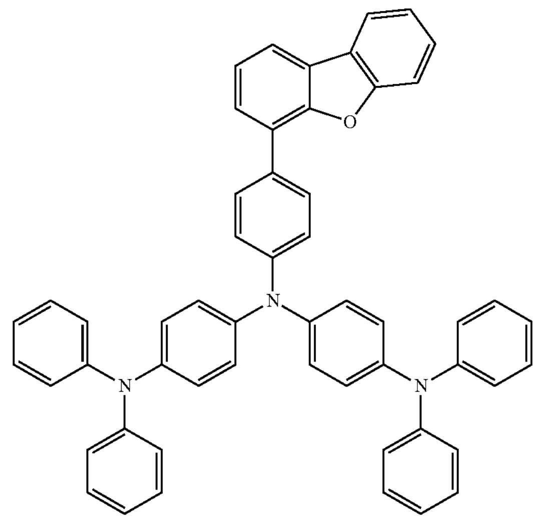
28
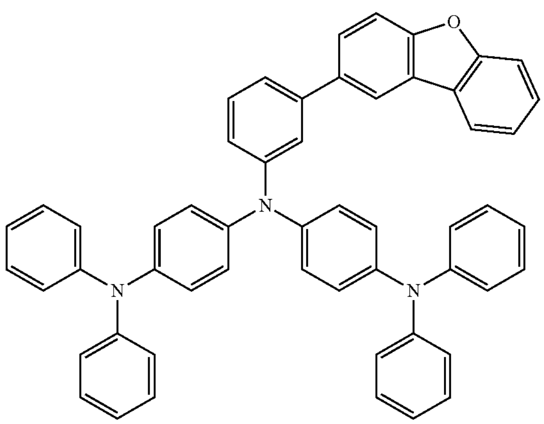
29
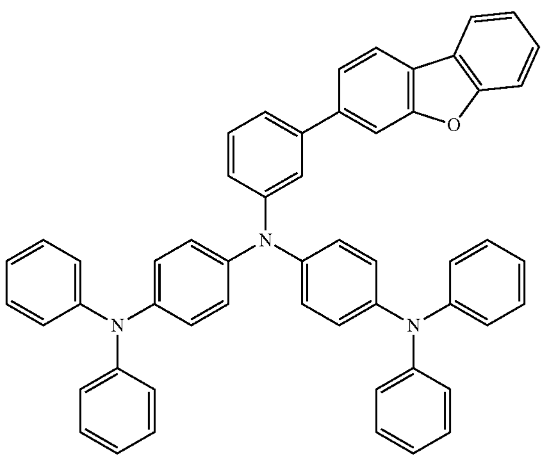

30
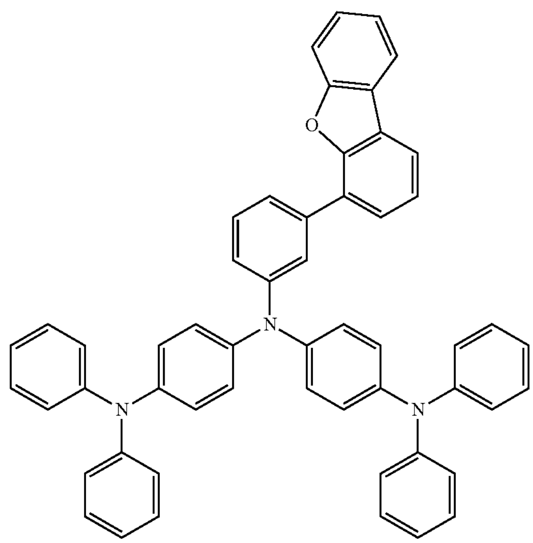
31
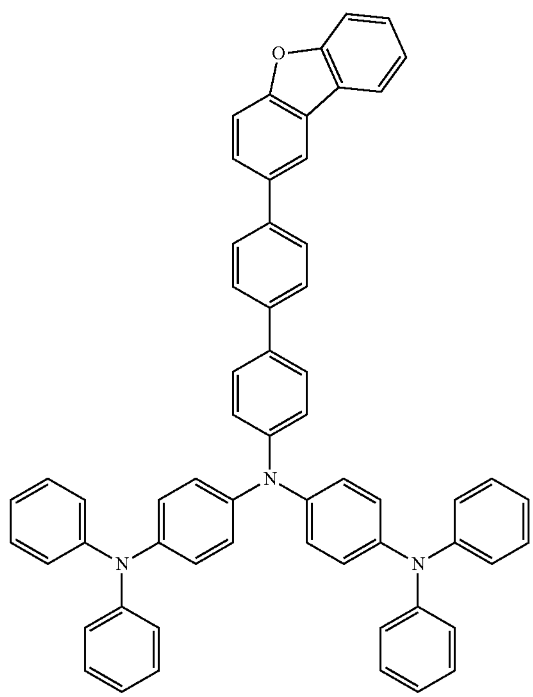
32
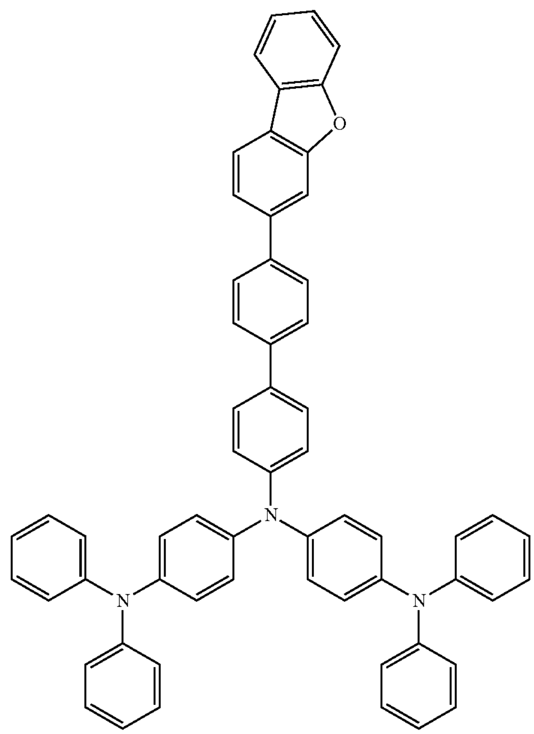
33
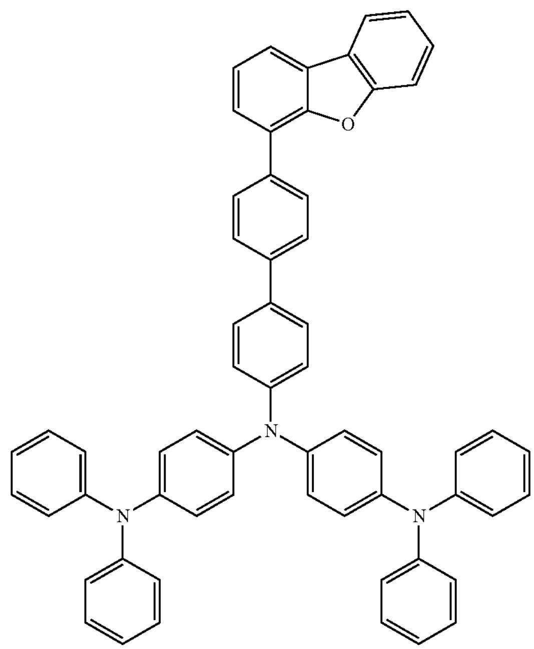

-continued
34
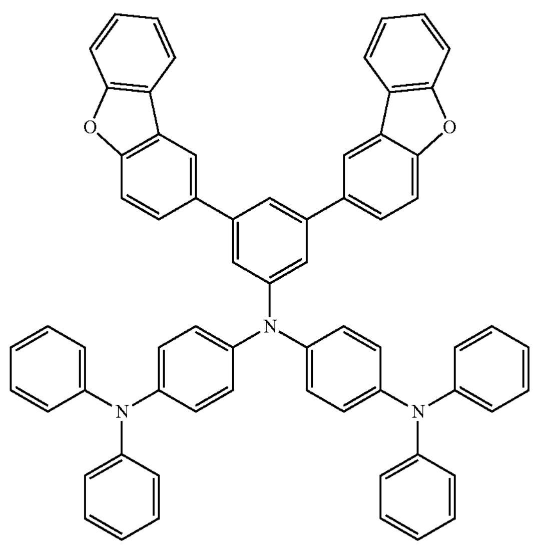
35
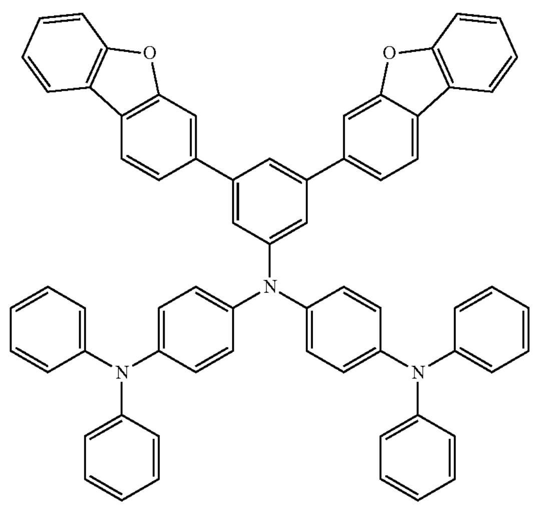
36
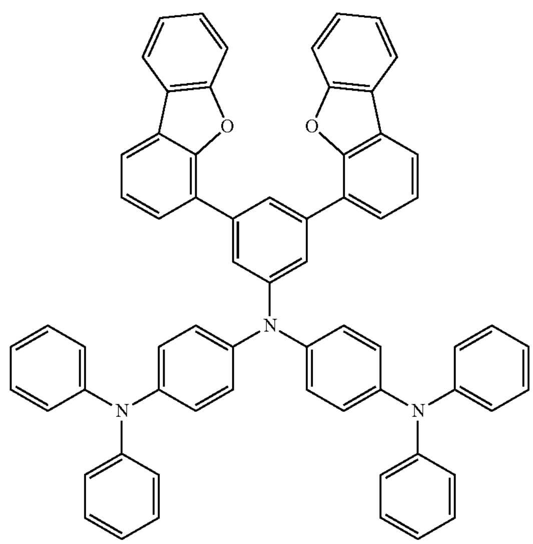
-continued
37
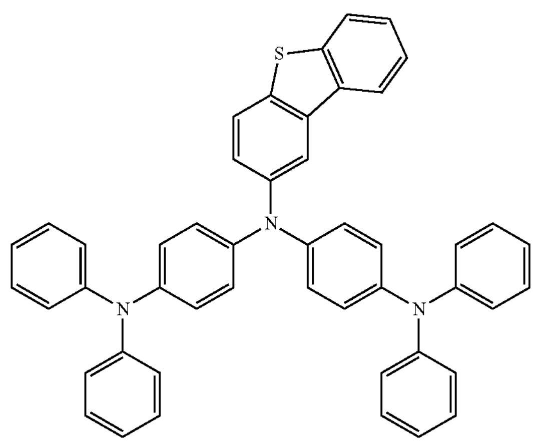
38
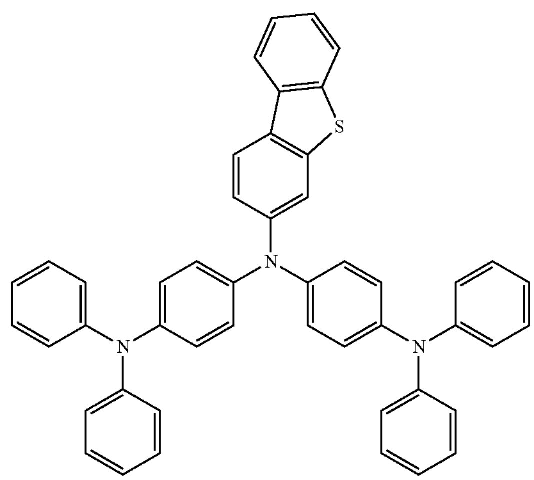
39
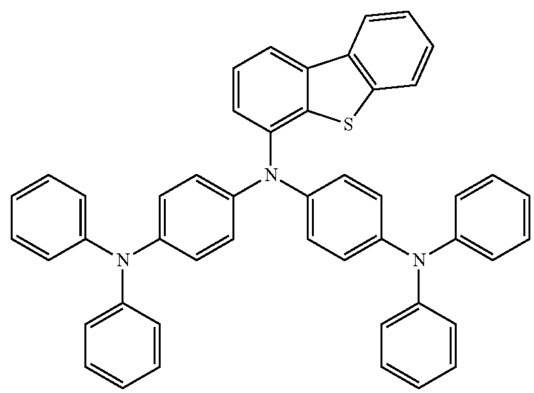

-continued
40
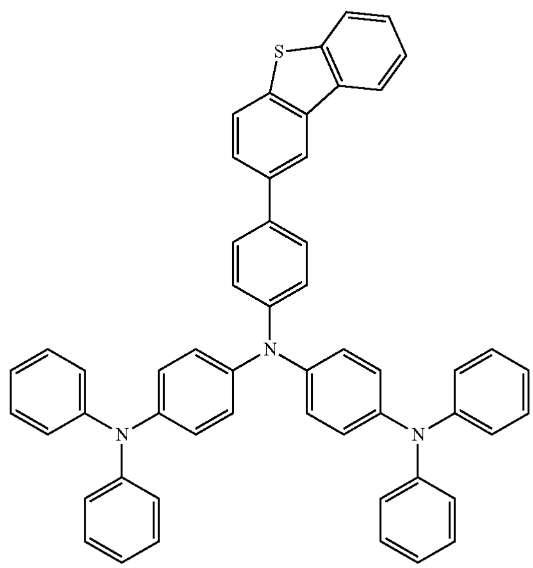
41
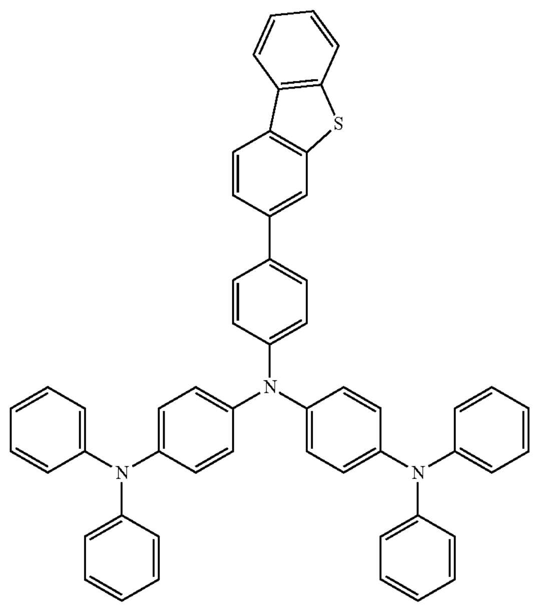
-continued
42
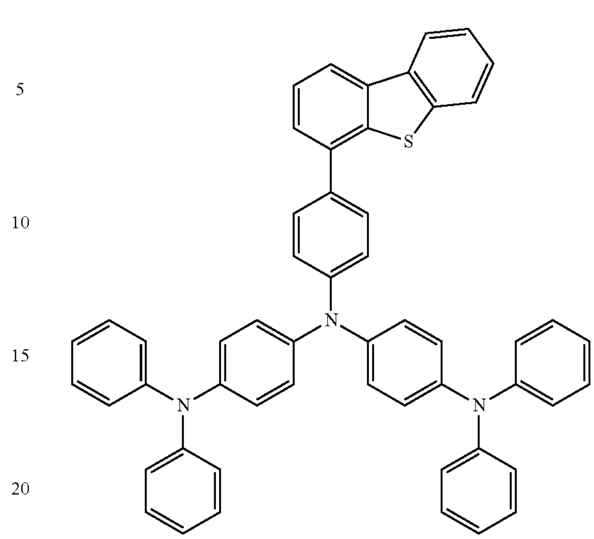
43
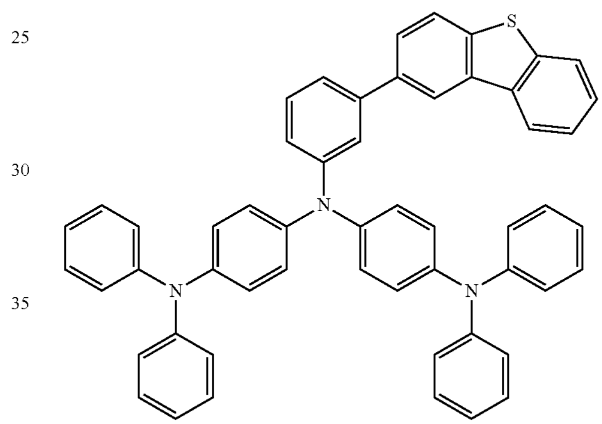
44
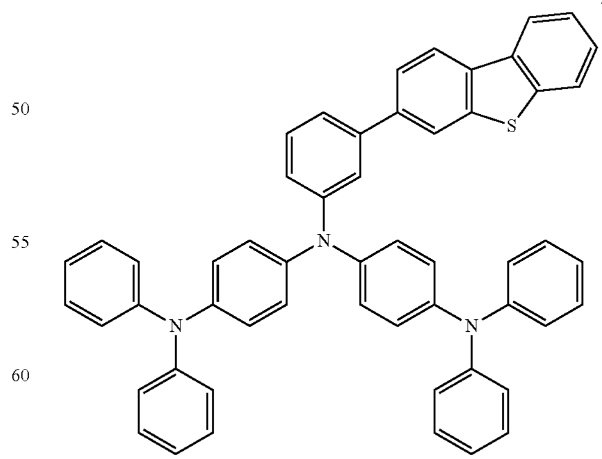

-continued
45
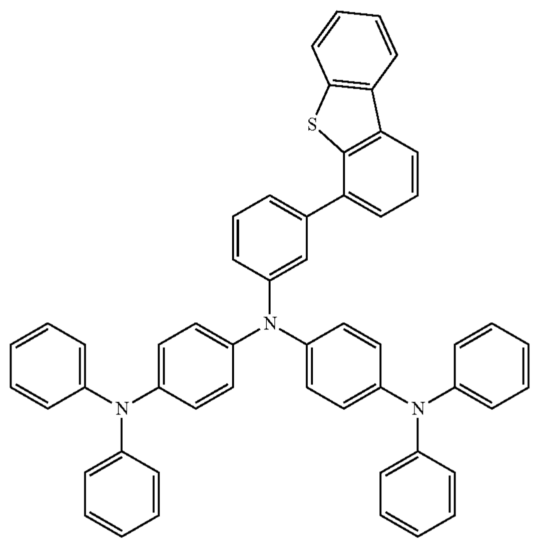
46
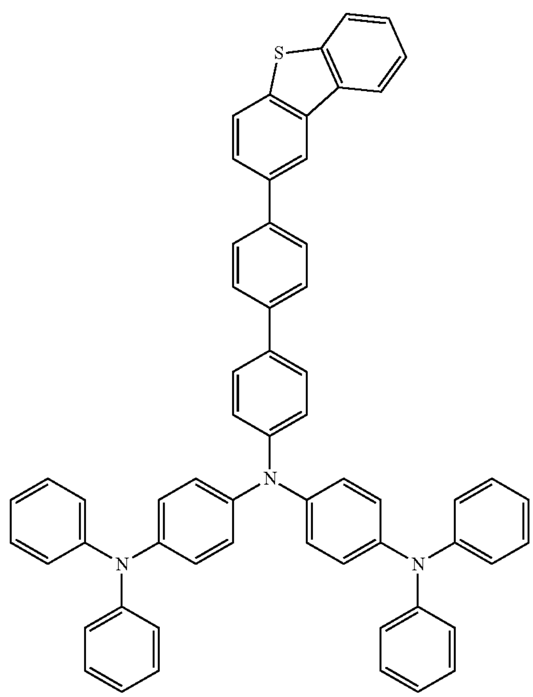
-continued
47
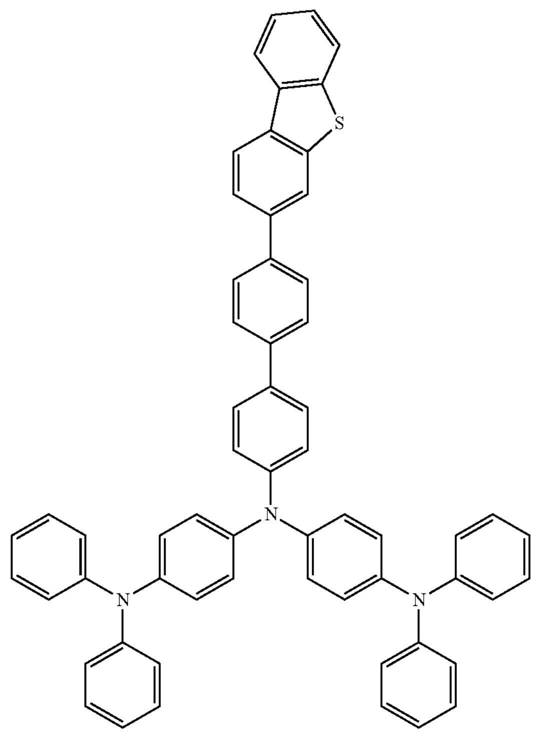
48
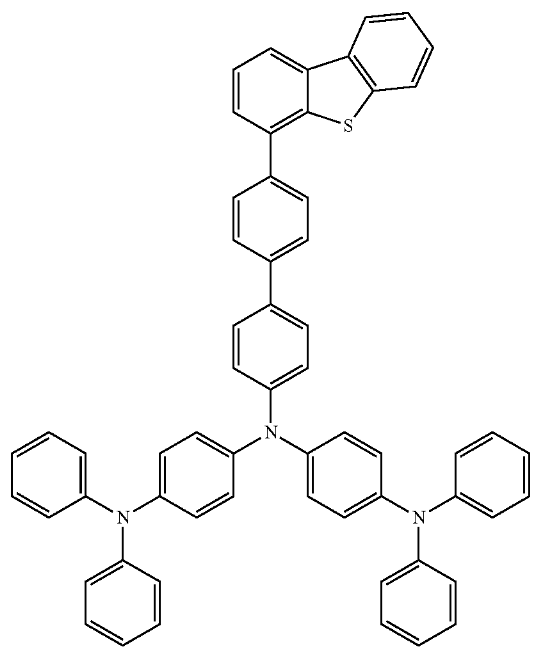

-continued
49
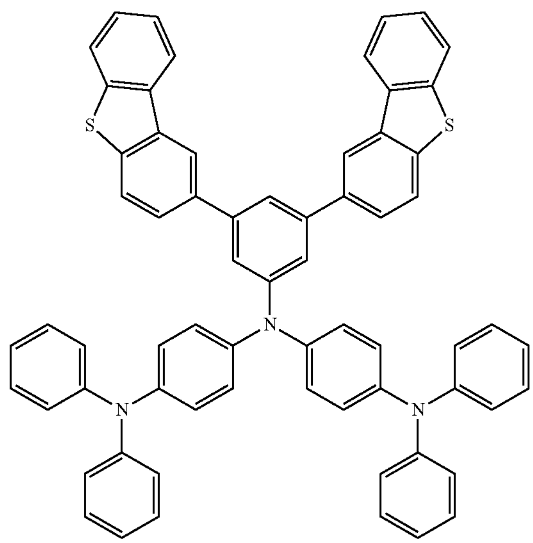
50
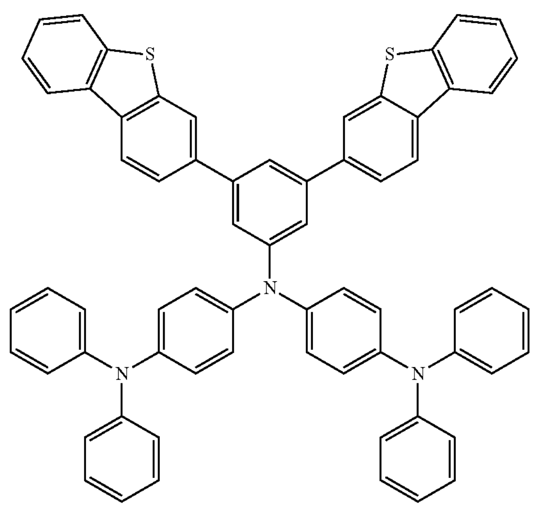
51
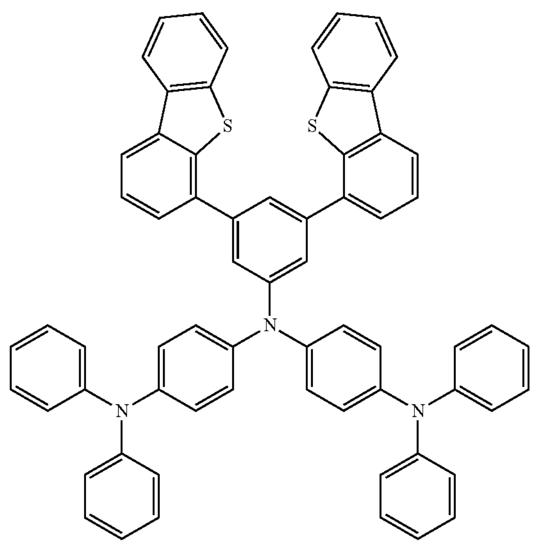
-continued
52
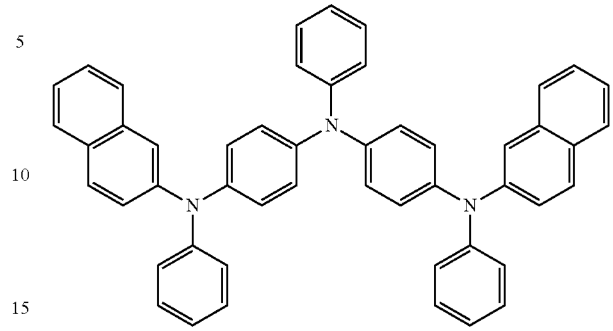
53
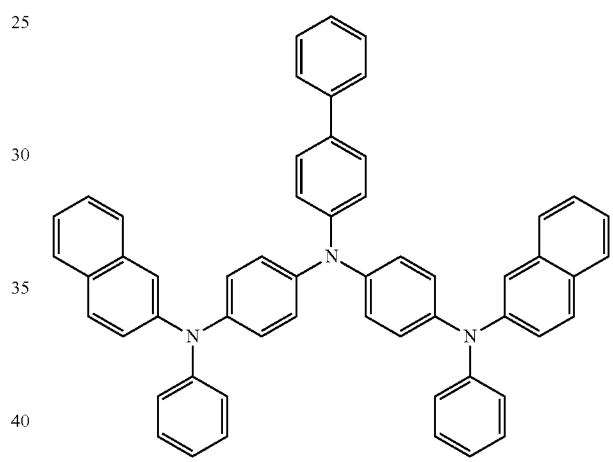
54
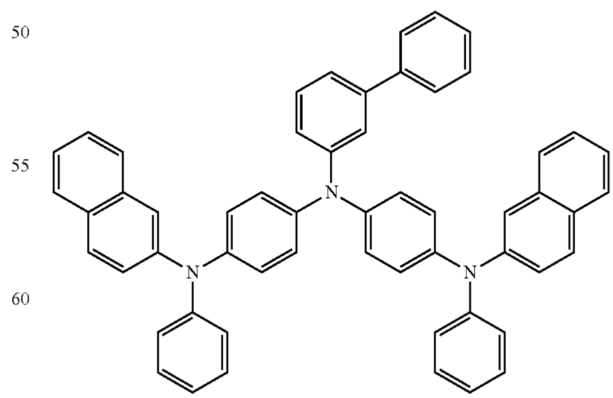

-continued
55
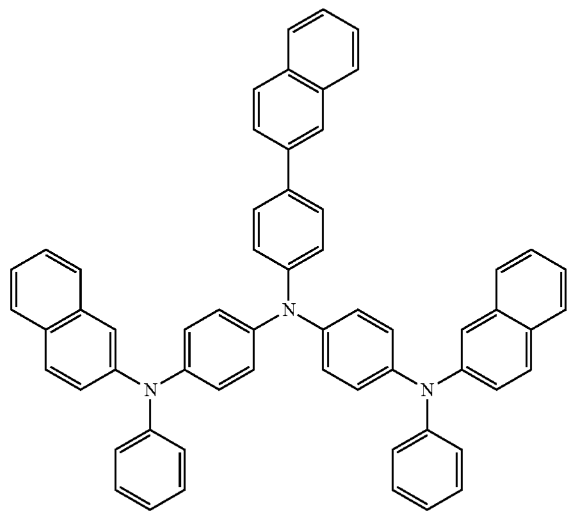
56
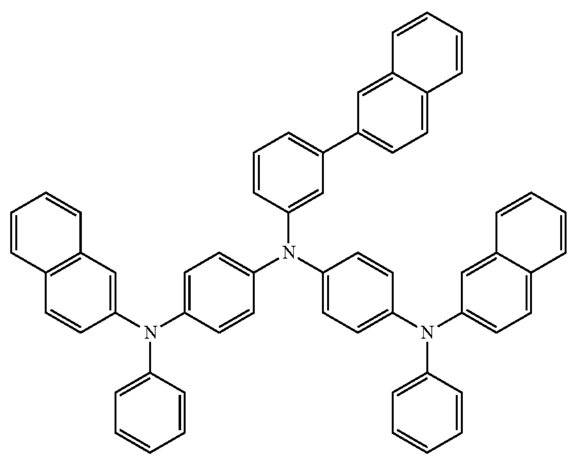
57
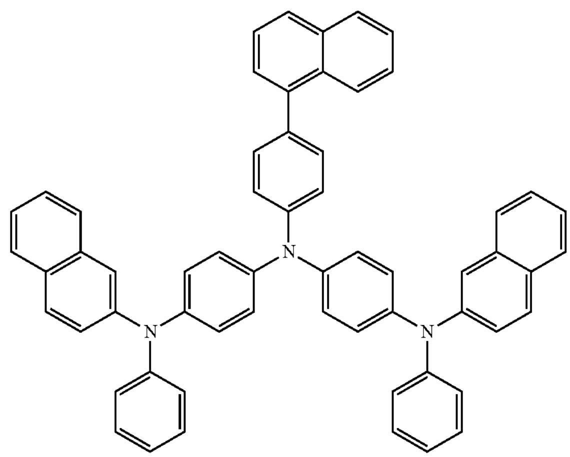
-continued
58
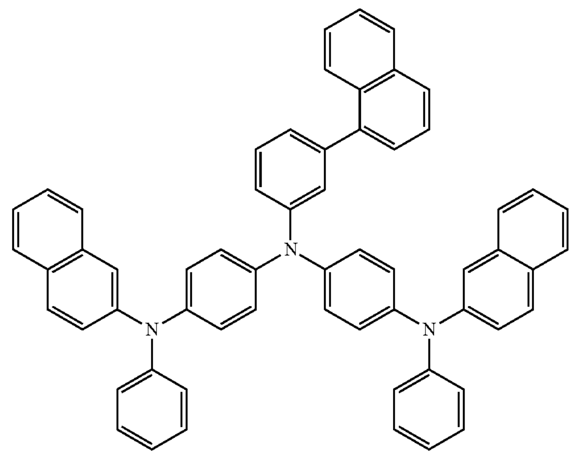
59
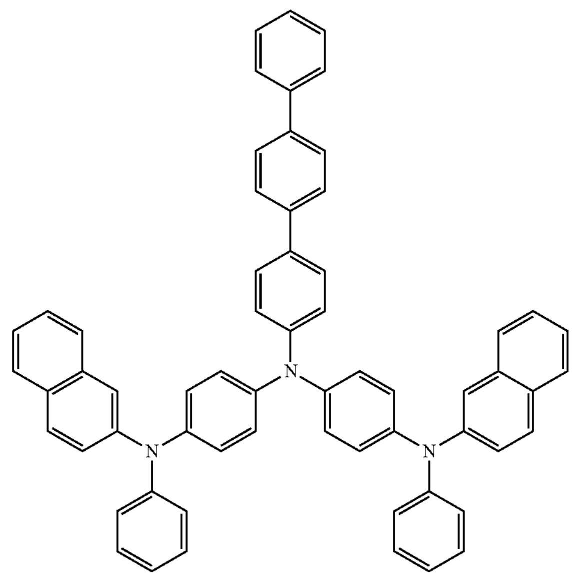
60
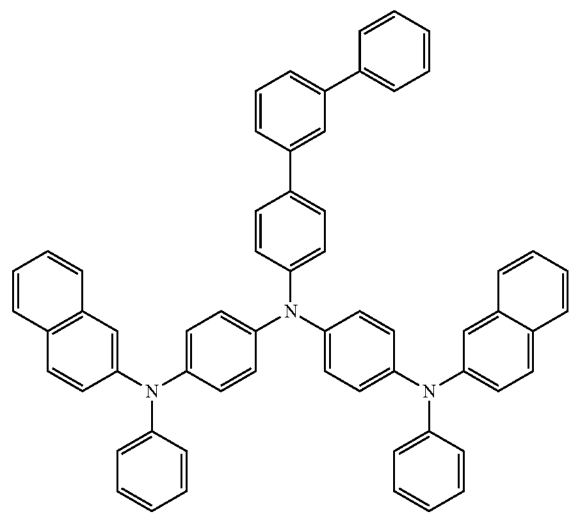

-continued
61
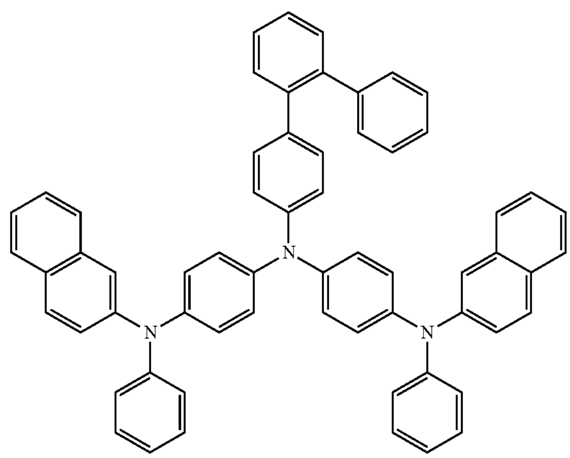
62
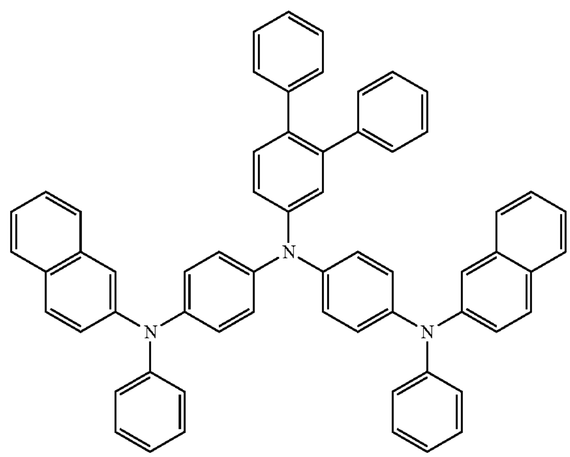
63
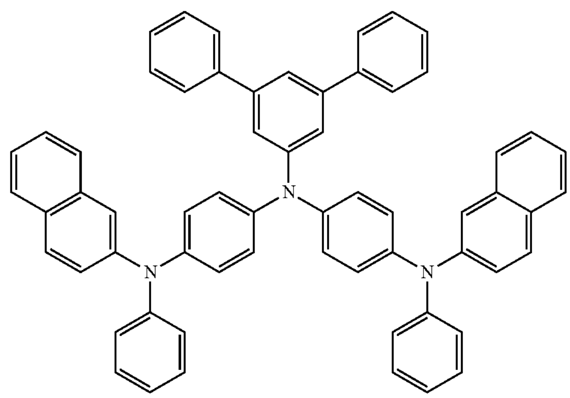
-continued
64
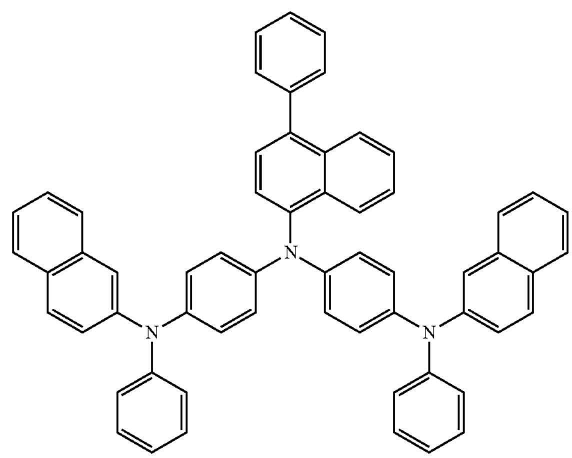
65
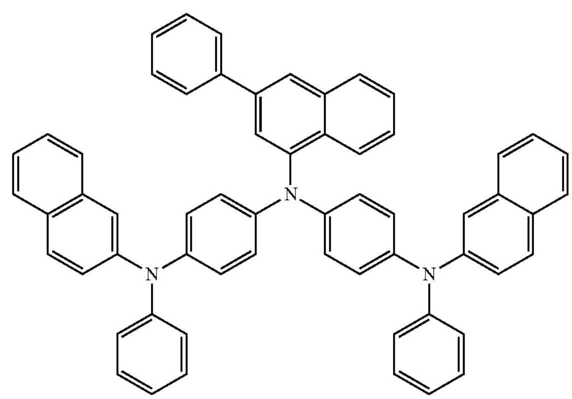
66
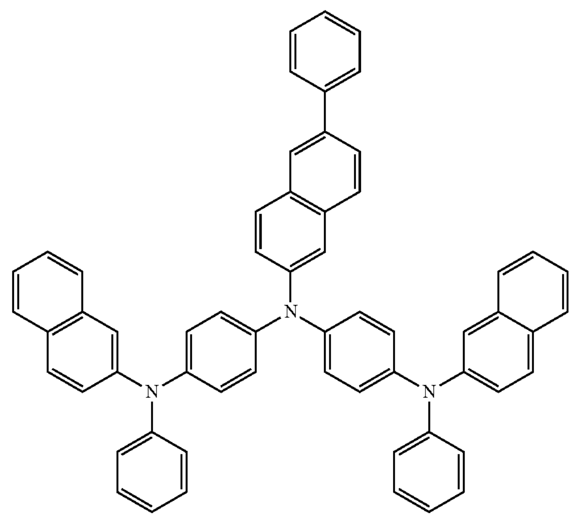

-continued
67
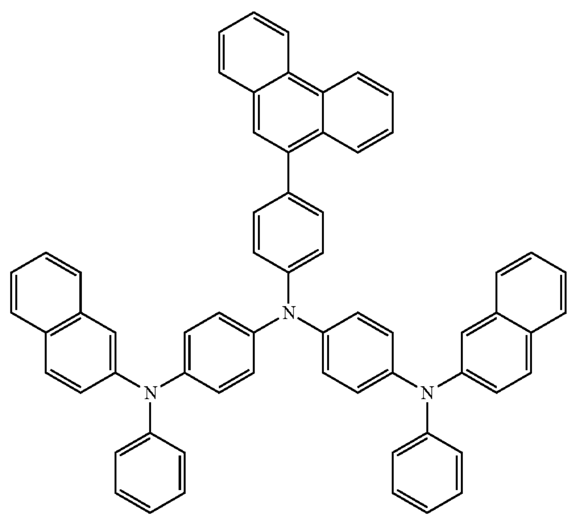
68
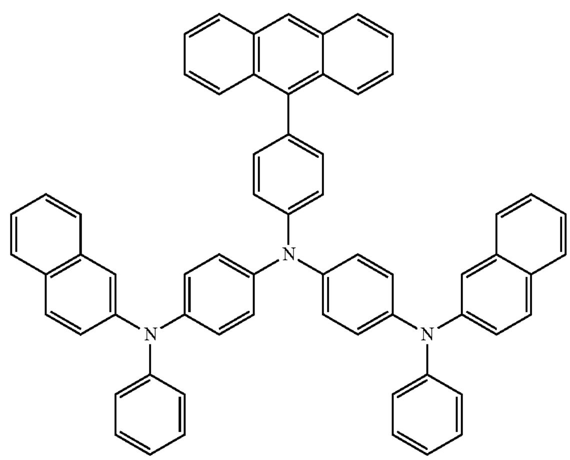
69
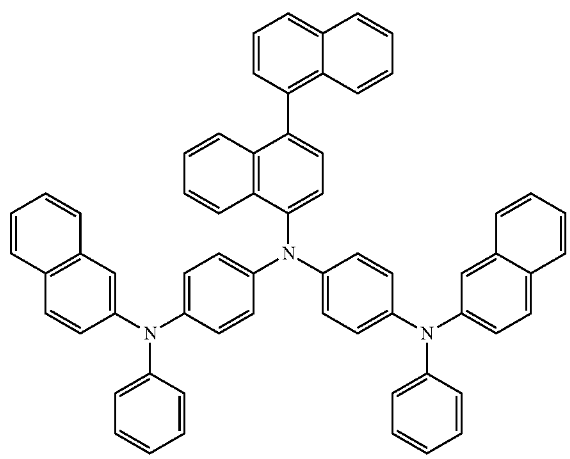
-continued
70
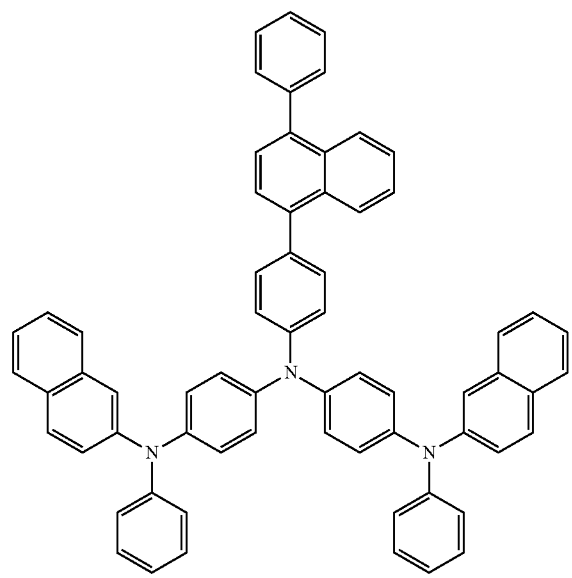
71
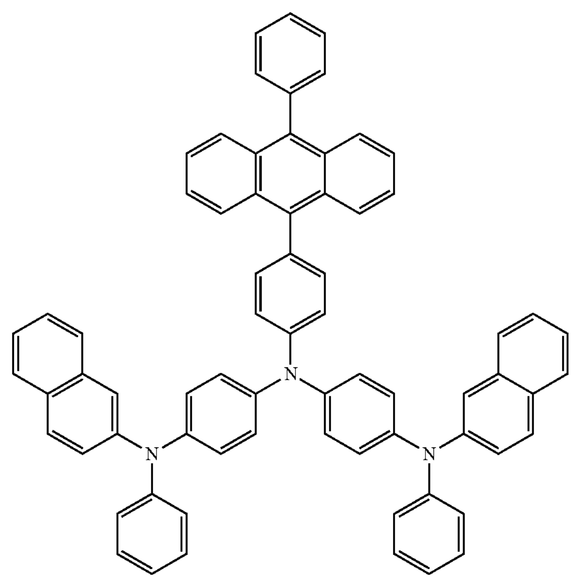

-continued
72
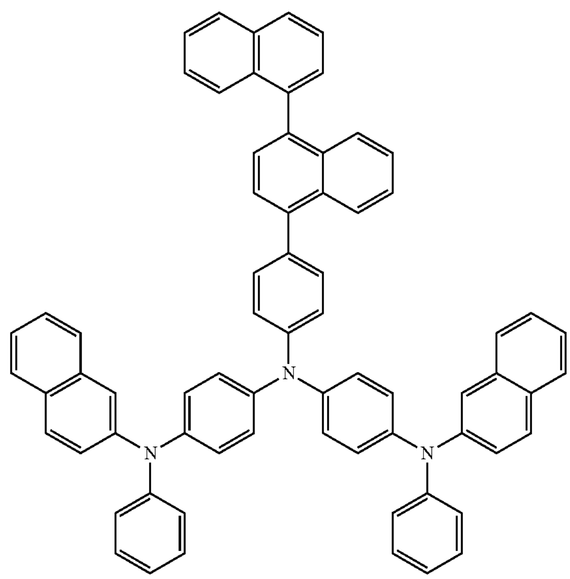
73
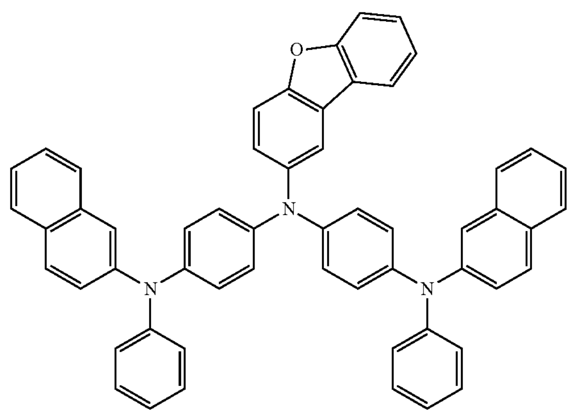
74
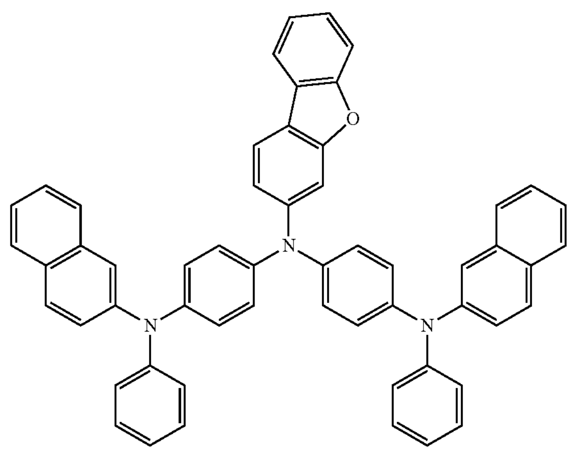
-continued
75
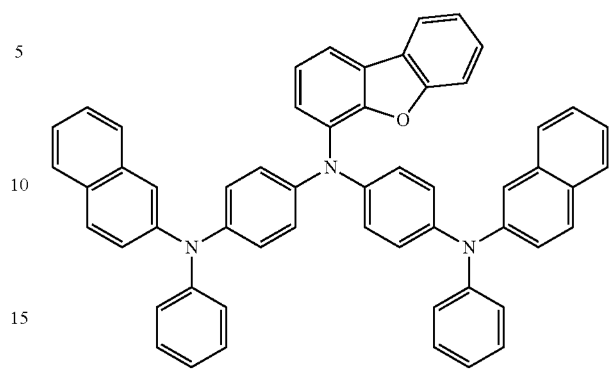
76
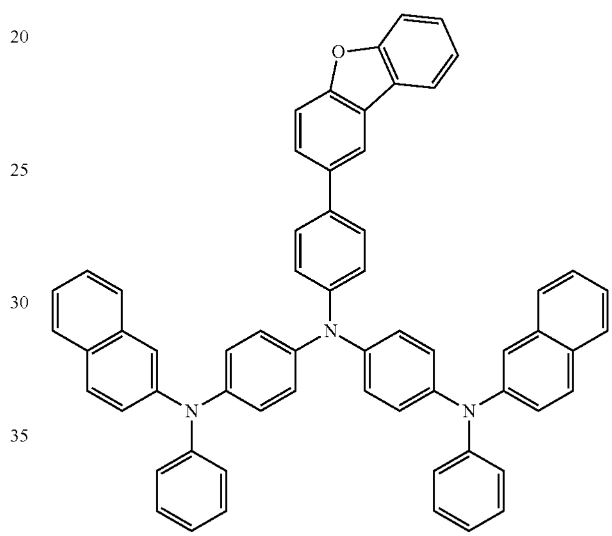
77
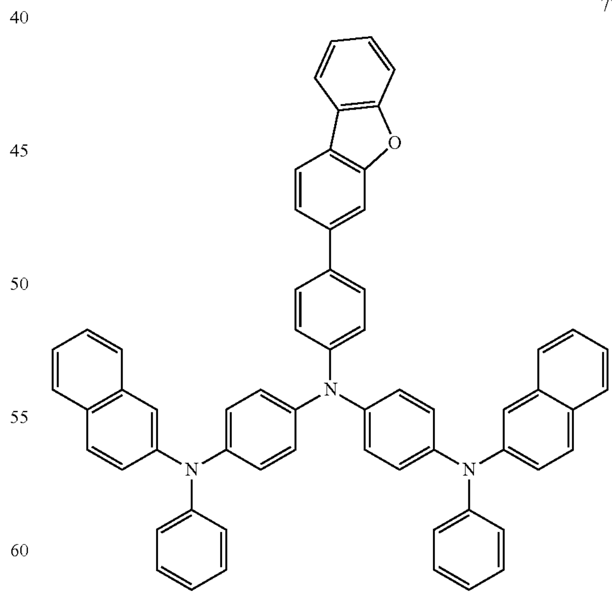

-continued
78
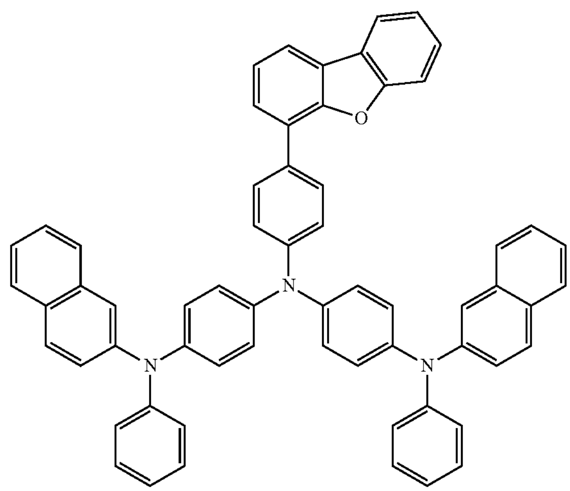
79
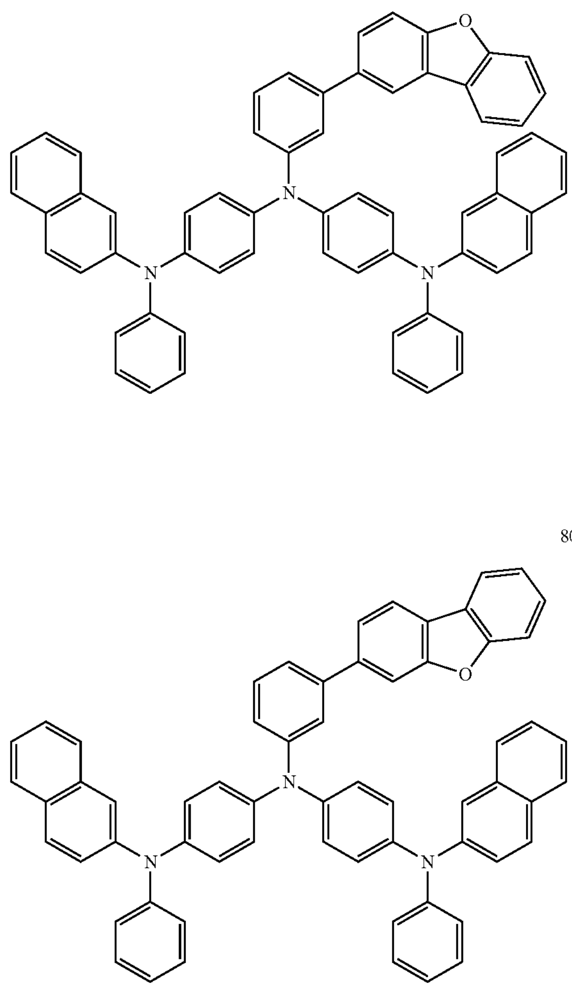
80
-continued
81
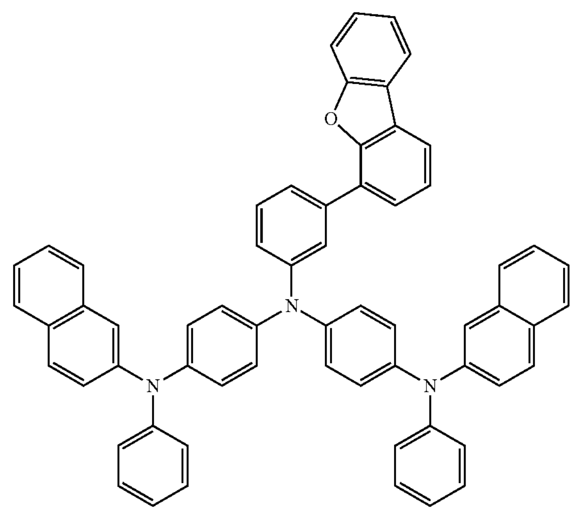
82
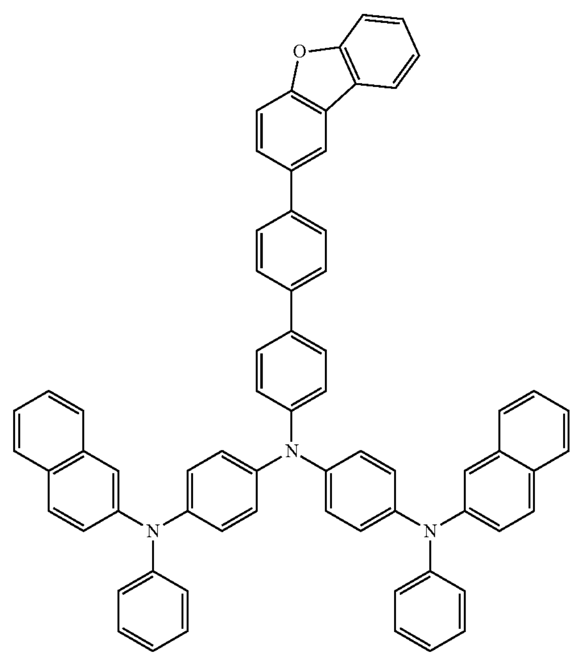

-continued
83
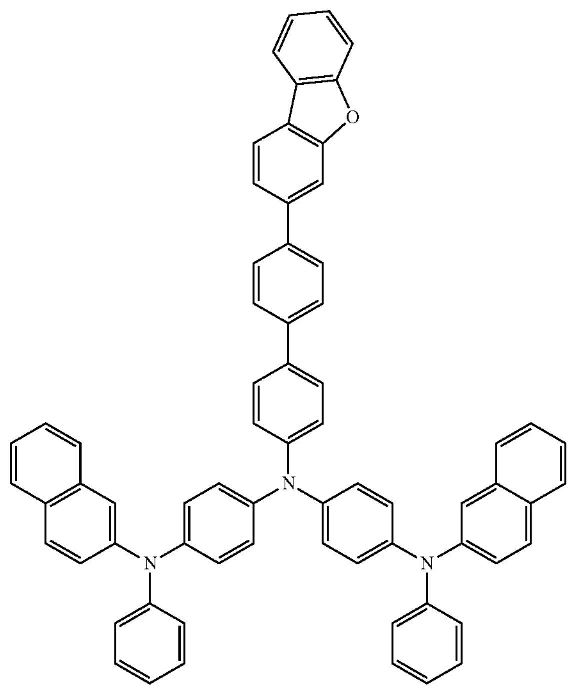
84
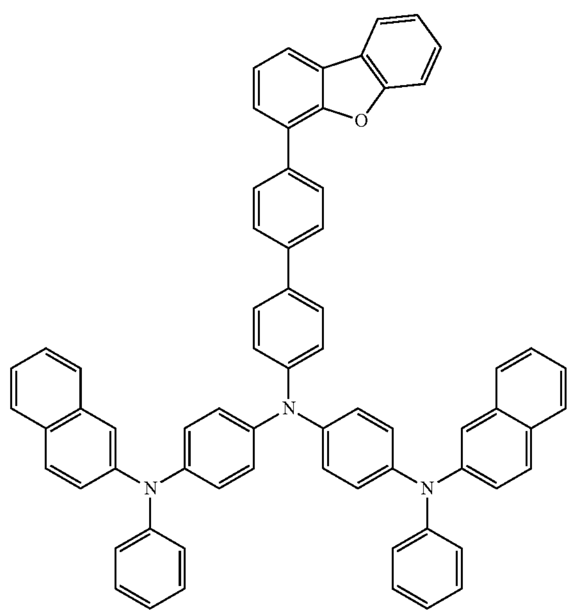
-continued
85
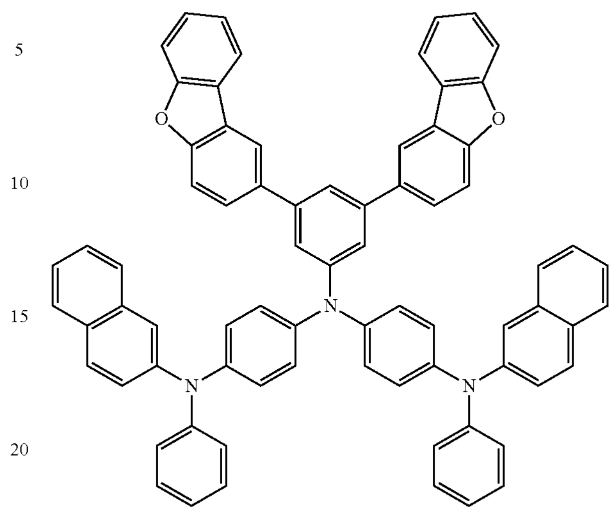
86
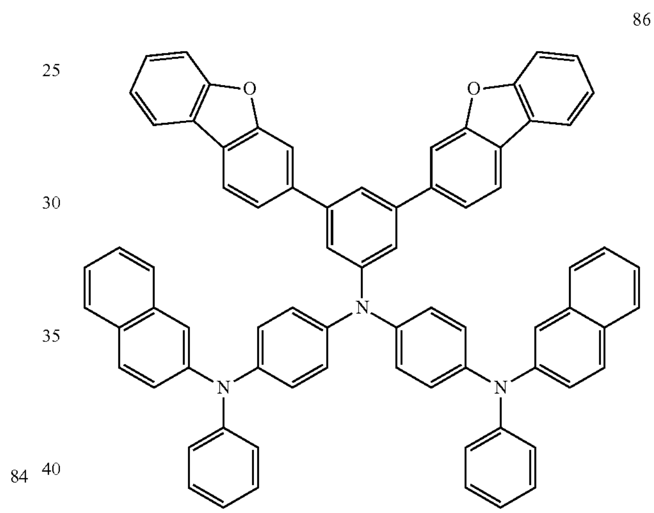
87
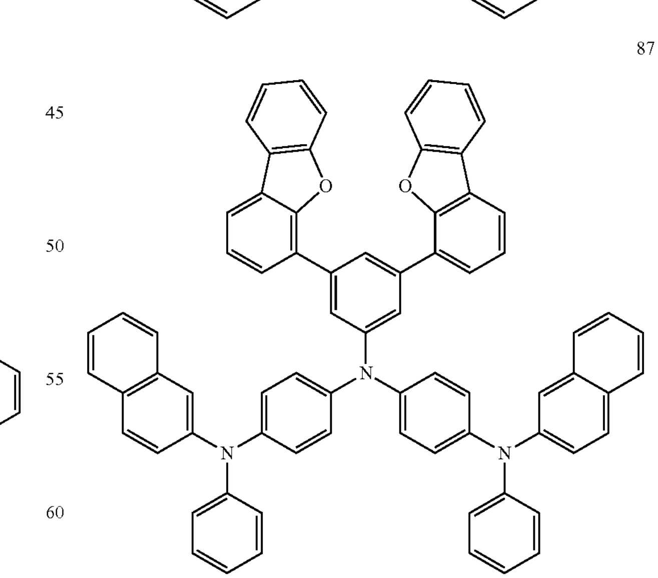

-continued
88
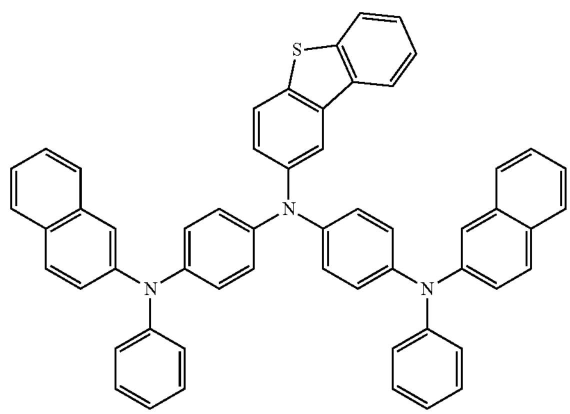
89
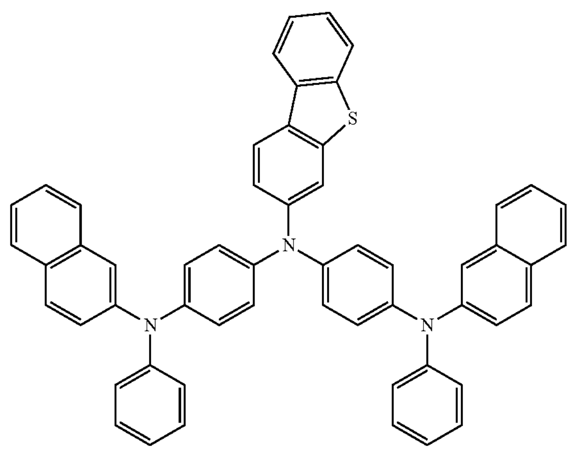
90
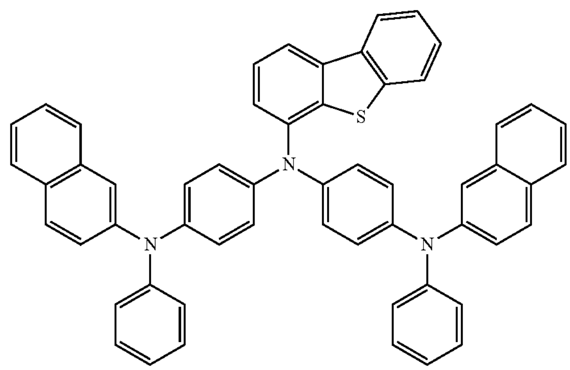
-continued
91
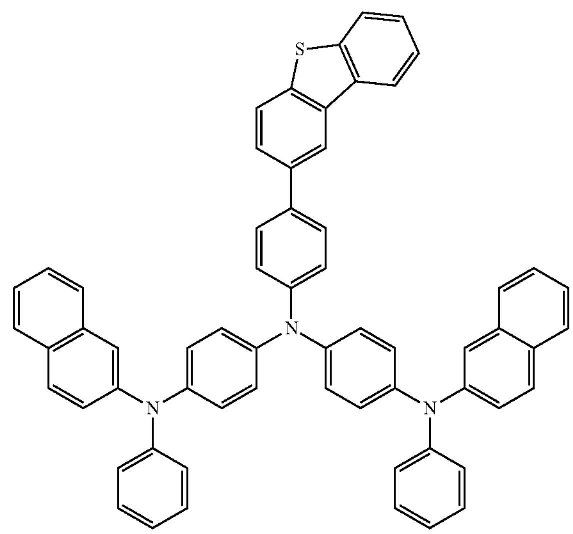
92
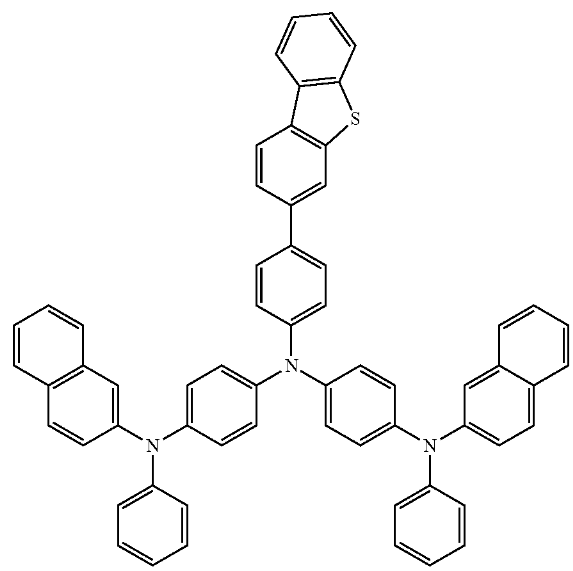
93
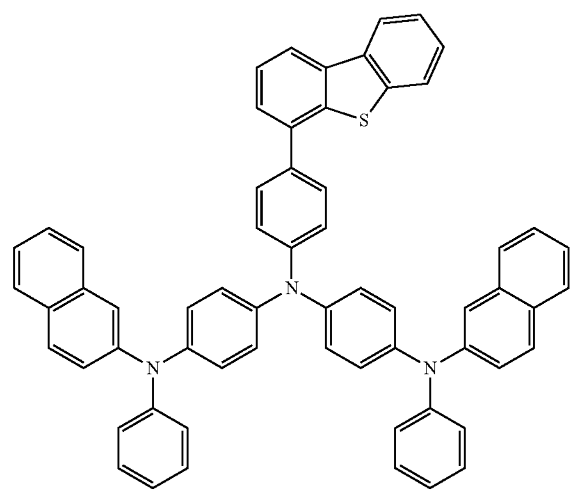

-continued
94
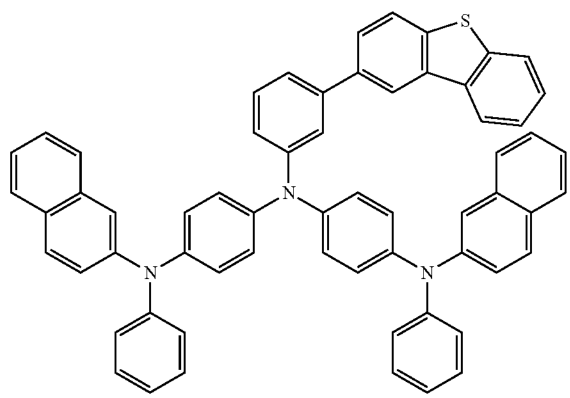
95
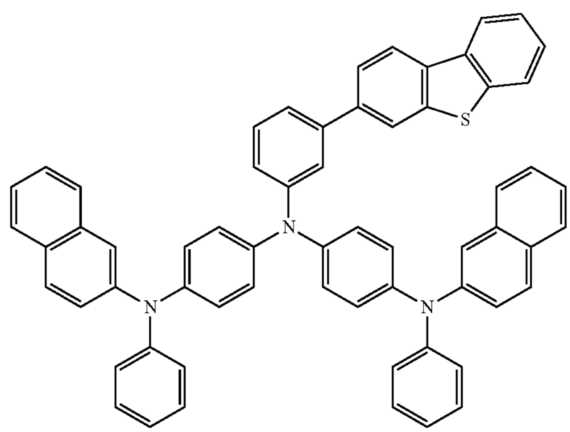
96
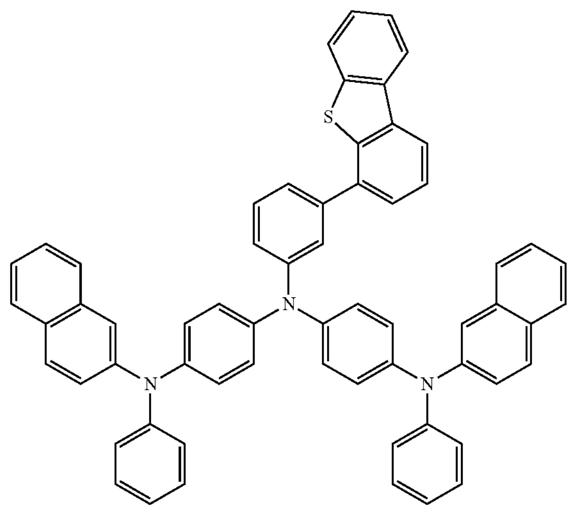
-continued
97
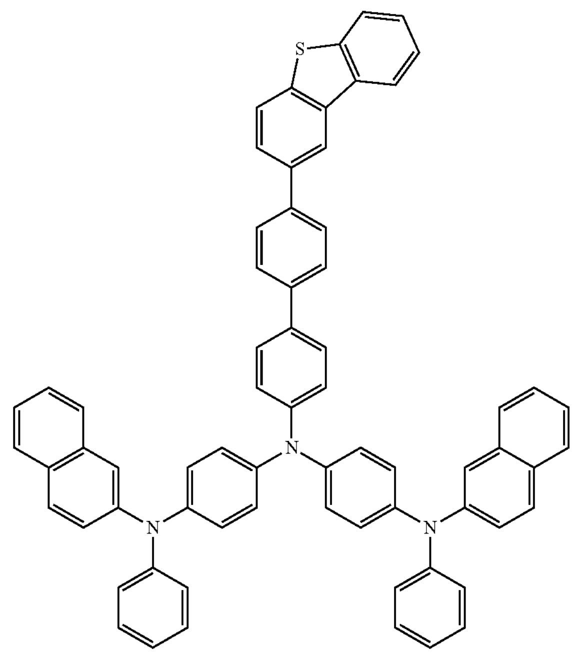
98
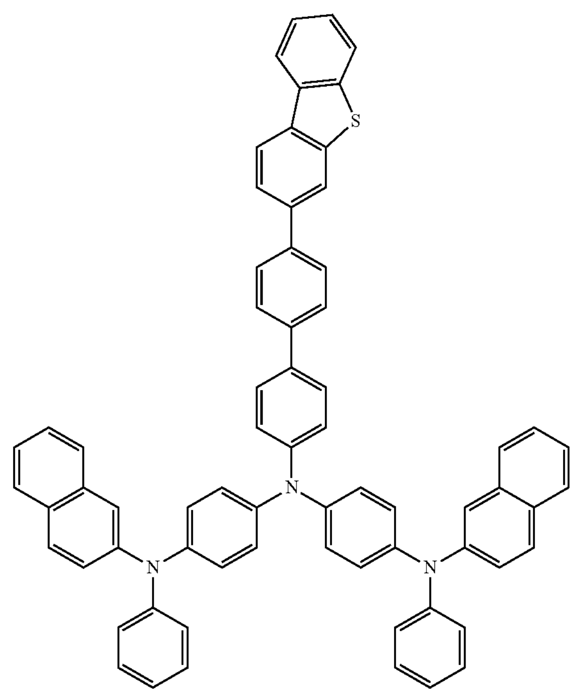

-continued
99
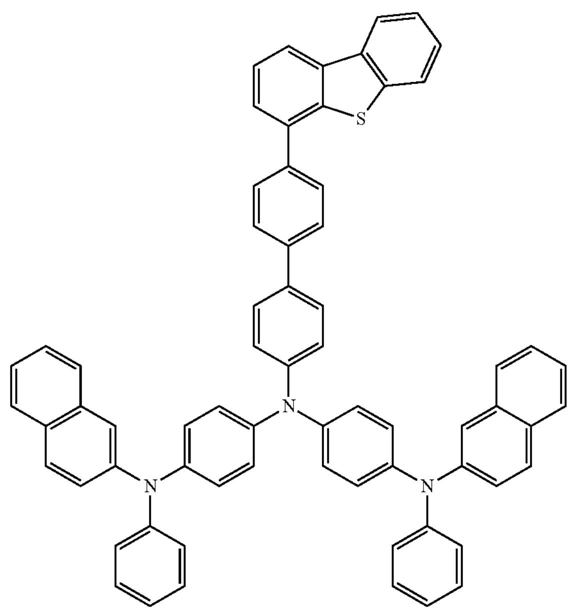
100
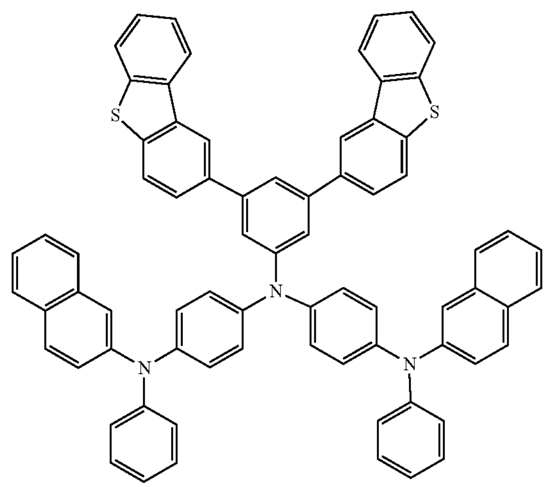
-continued
101
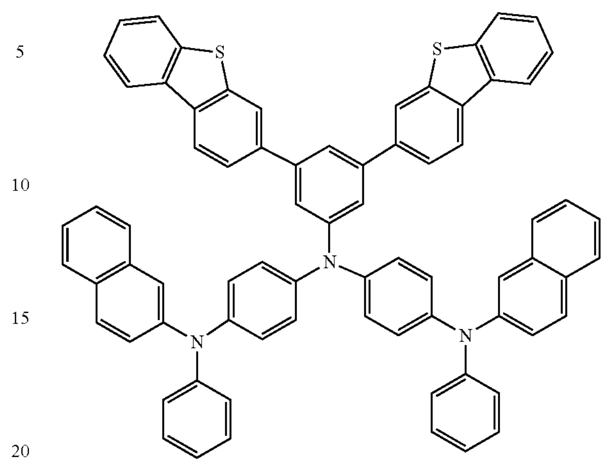
102
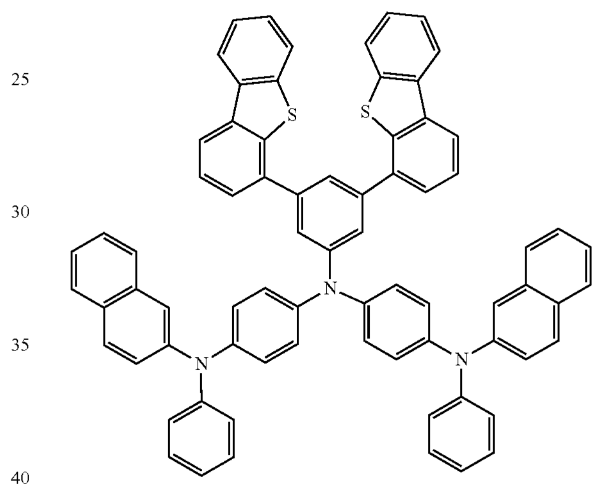
103
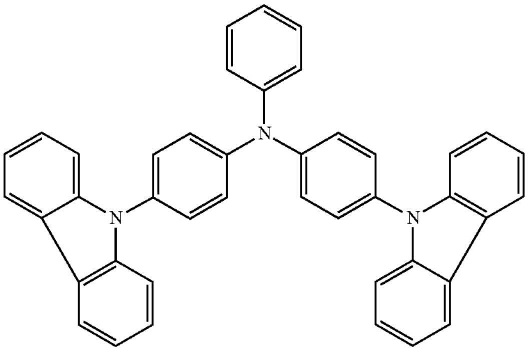

-continued
104
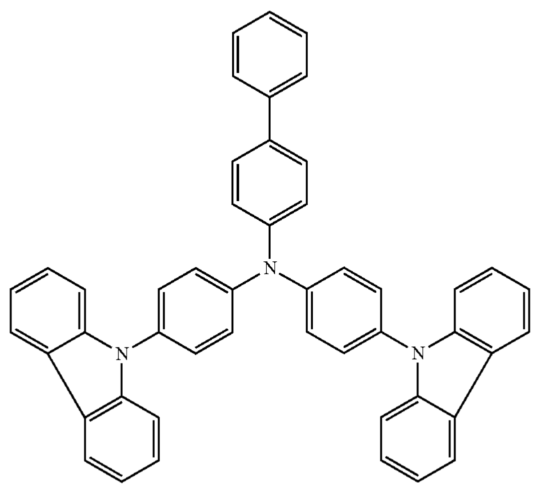
105
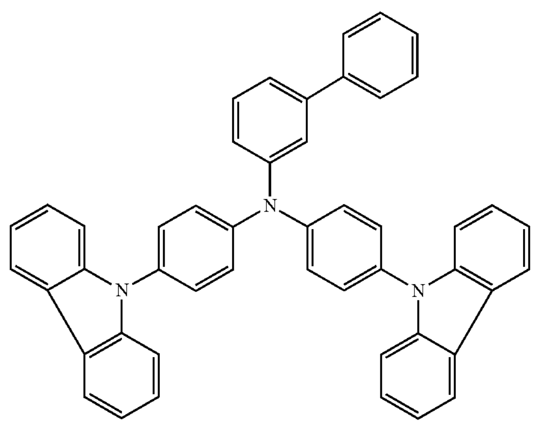
106
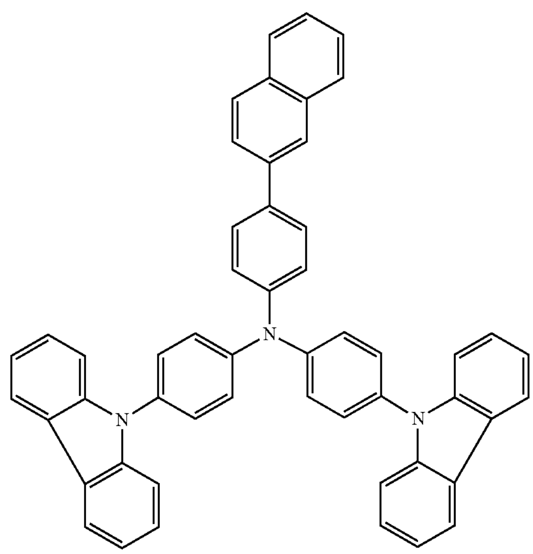
-continued
107
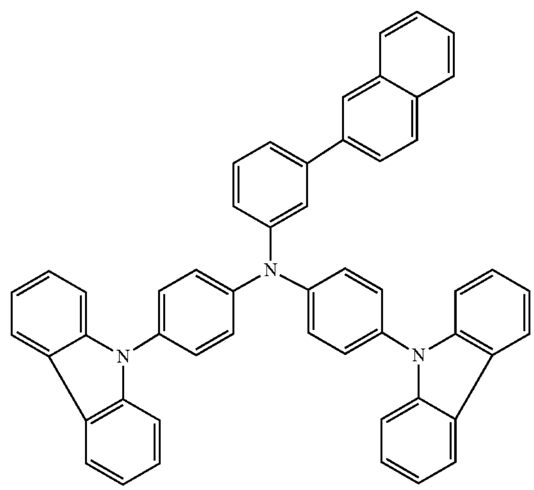
108
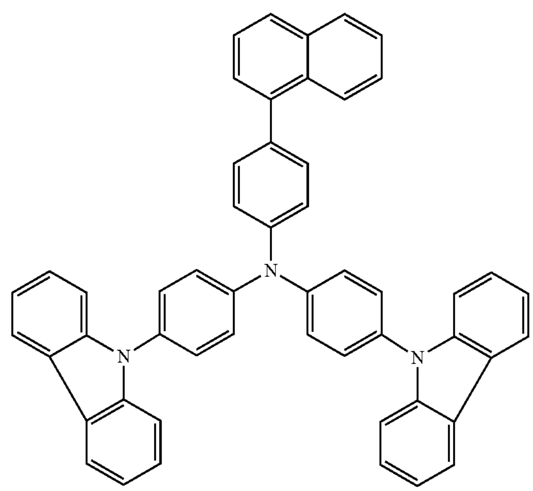
109
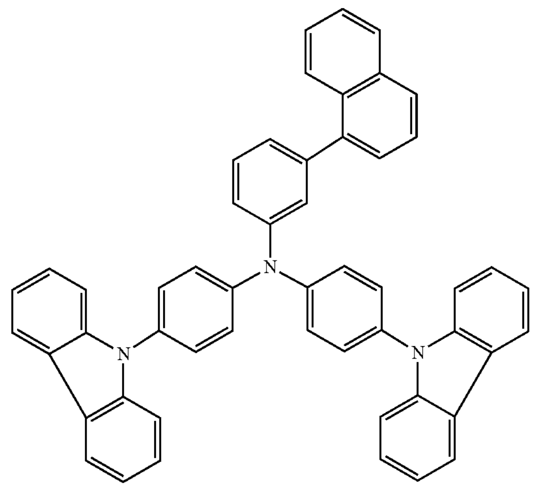

110
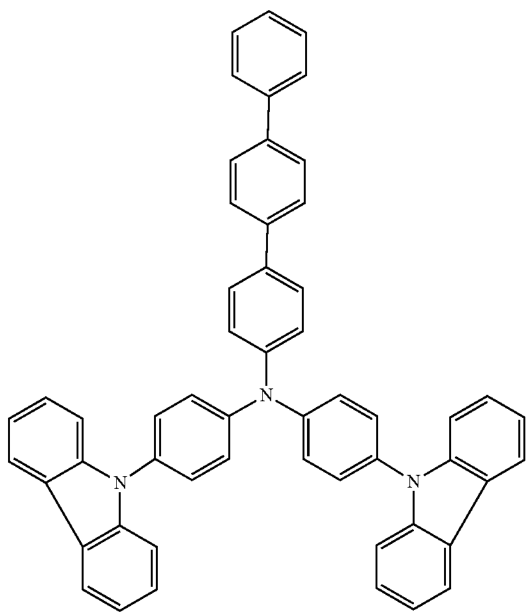
111
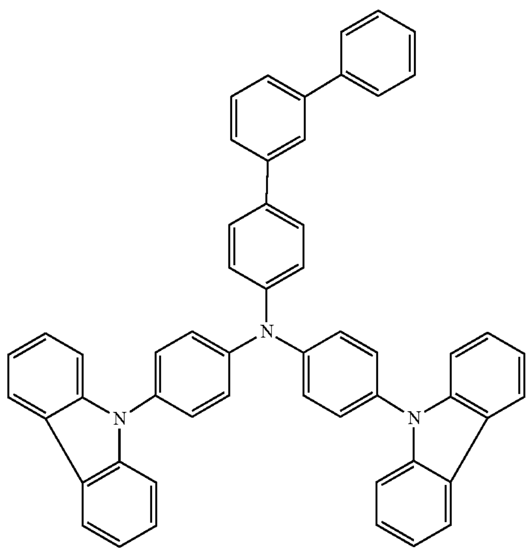
112
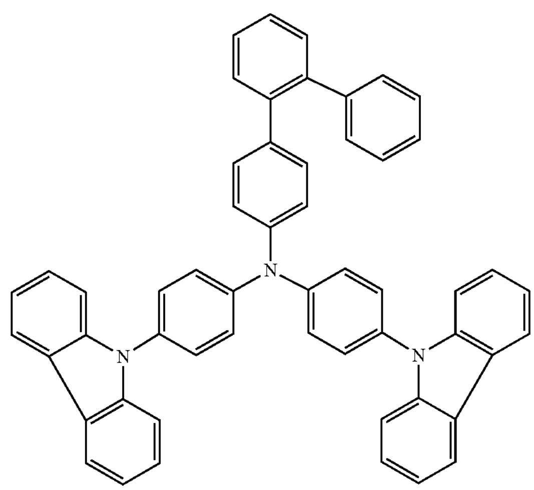
113
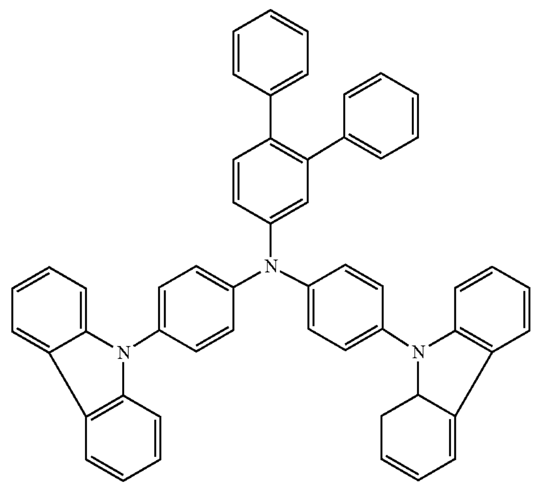
114
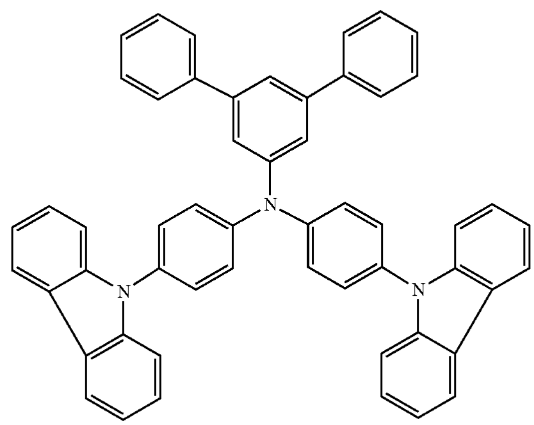

-continued
115
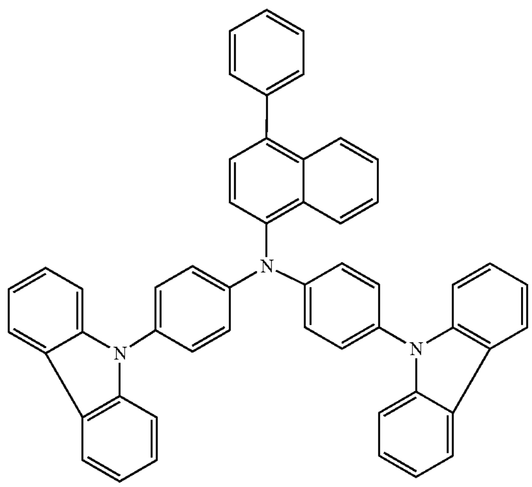
116
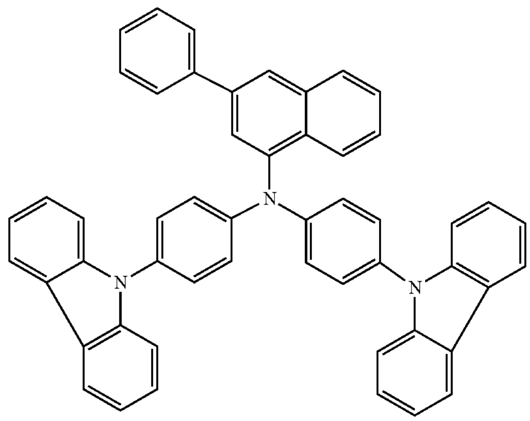
117
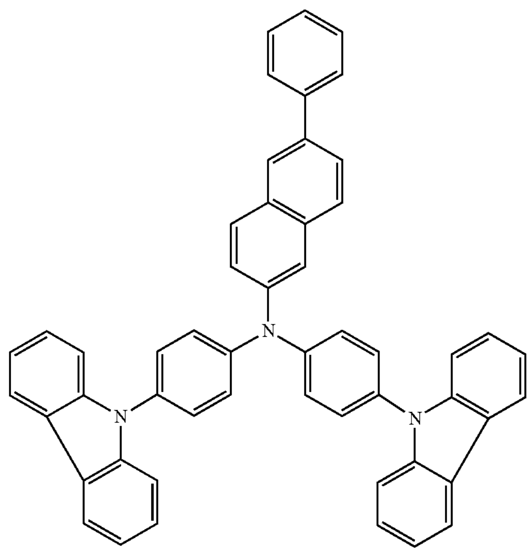
-continued
118
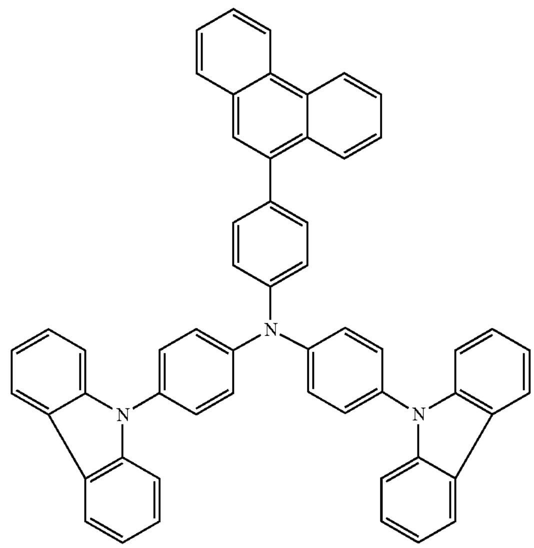
119
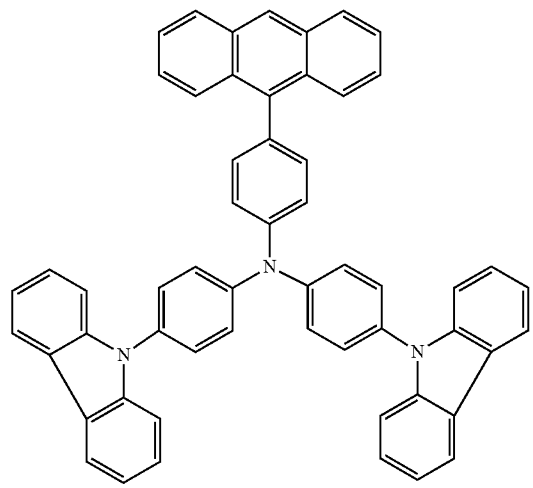
120
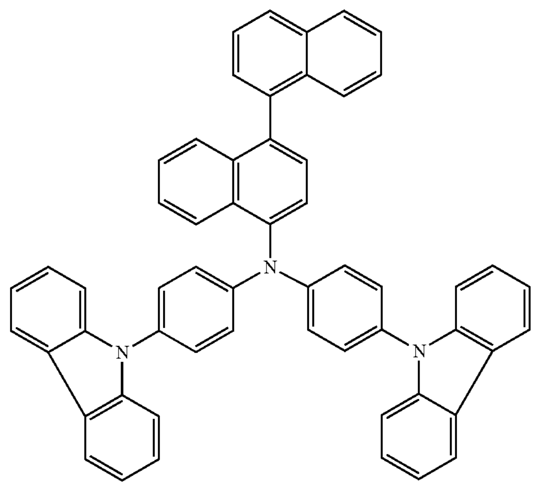

-continued
121
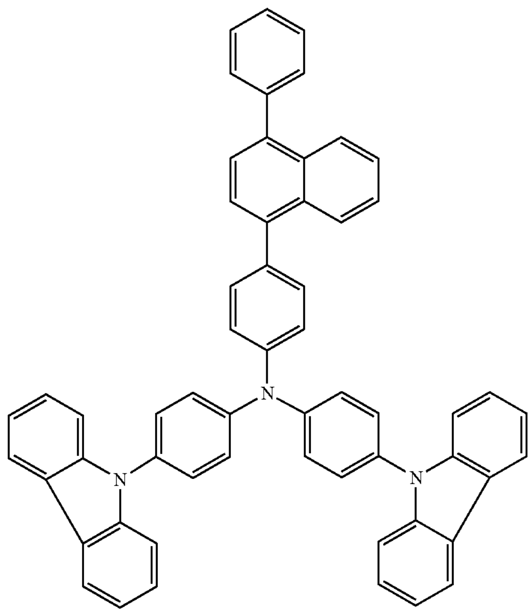
122
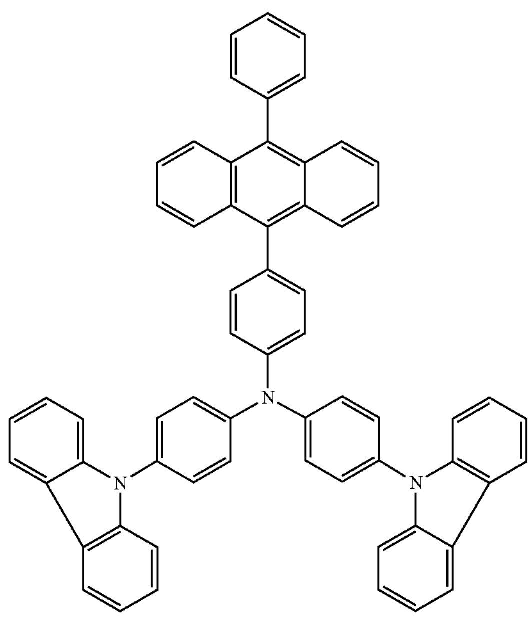
-continued
123
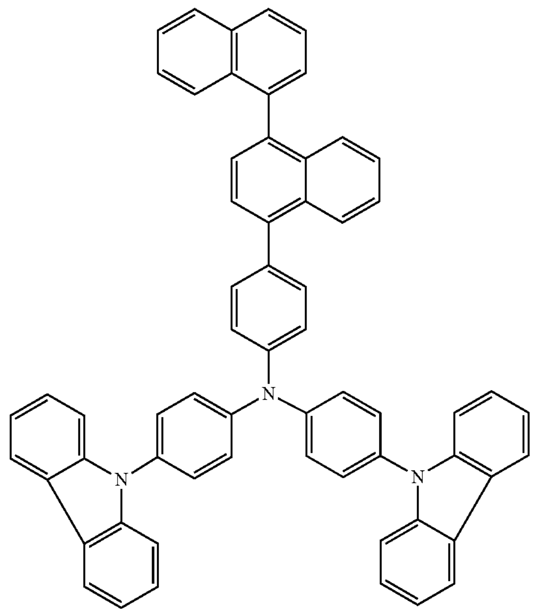
124
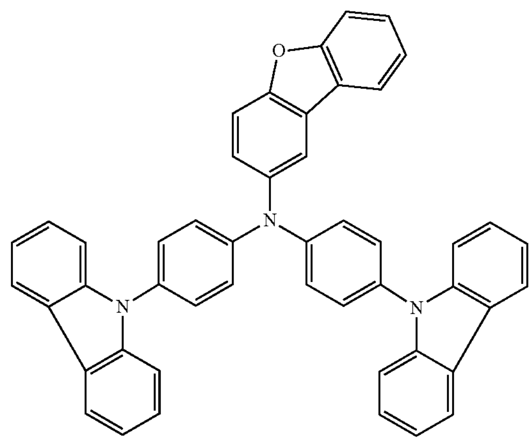
125
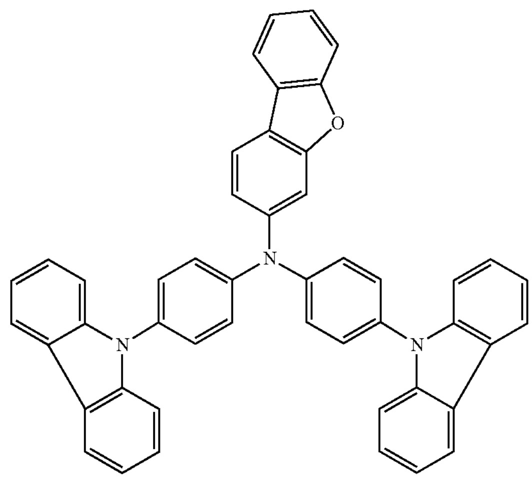

-continued
126
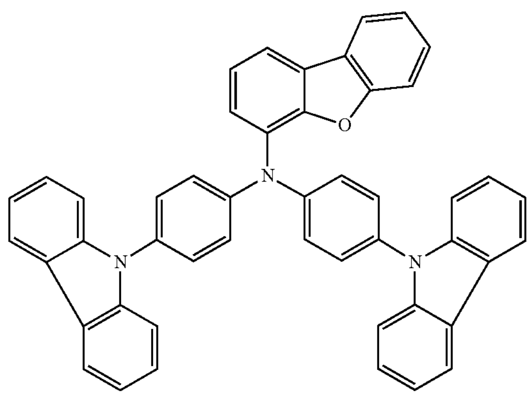
127
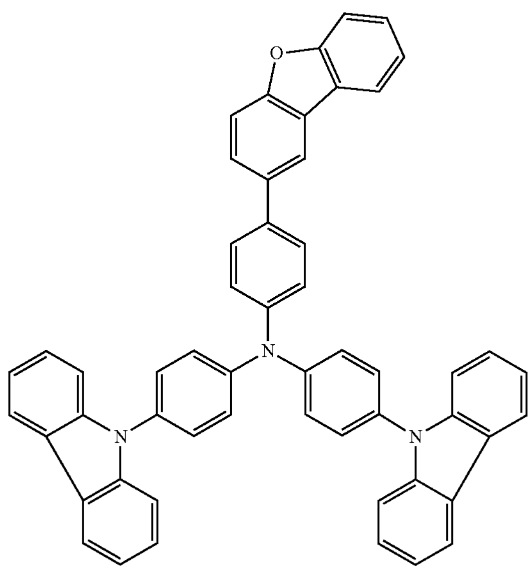
128
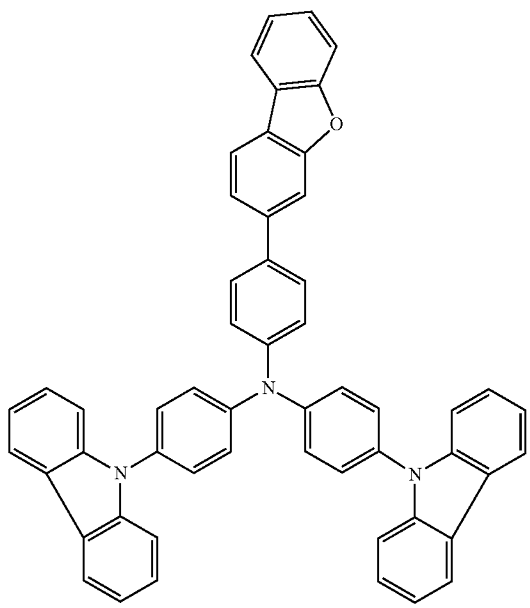
-continued
129
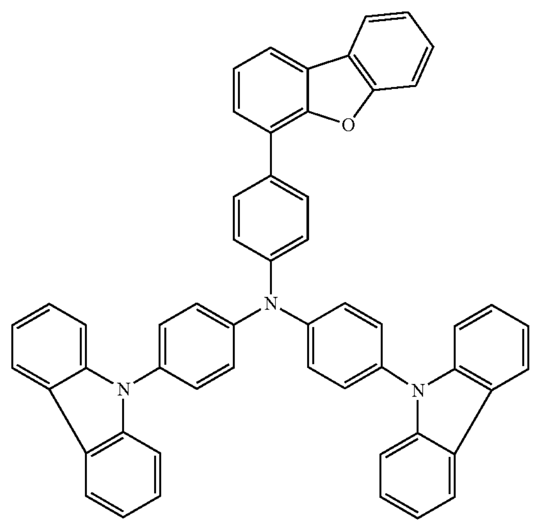
130
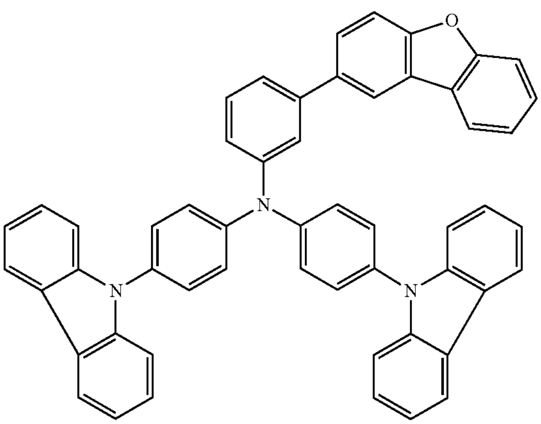
131
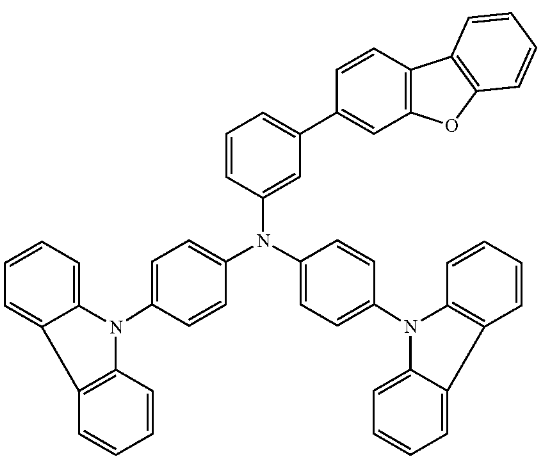

-continued
132
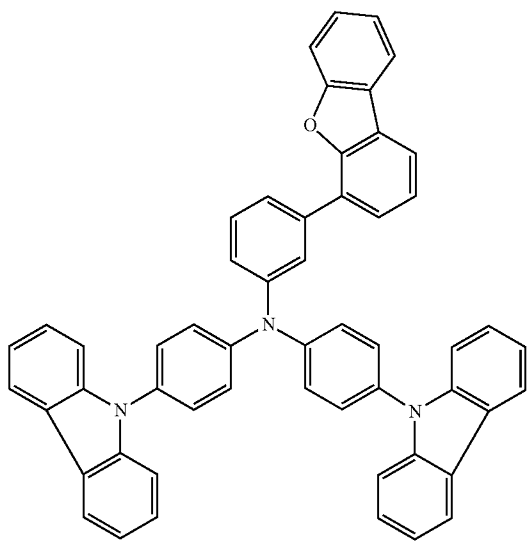
133
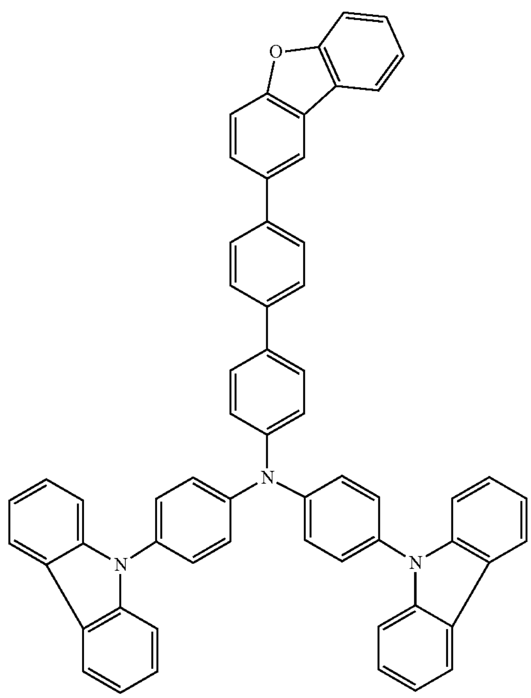
-continued
134
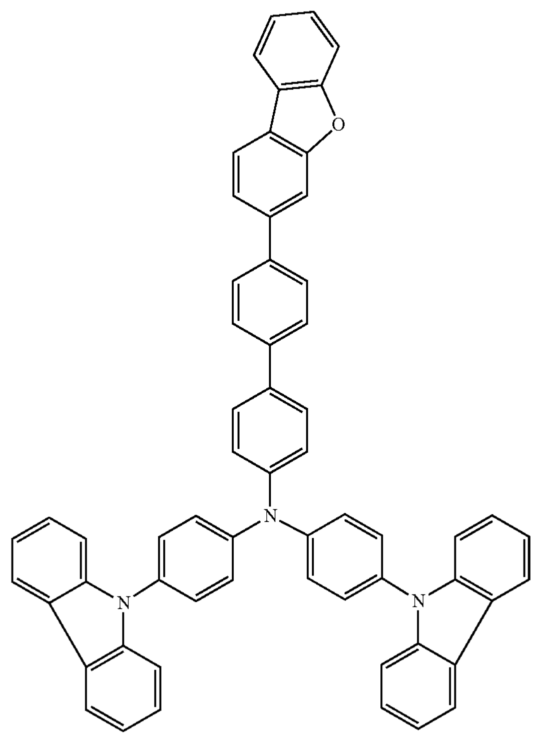
135
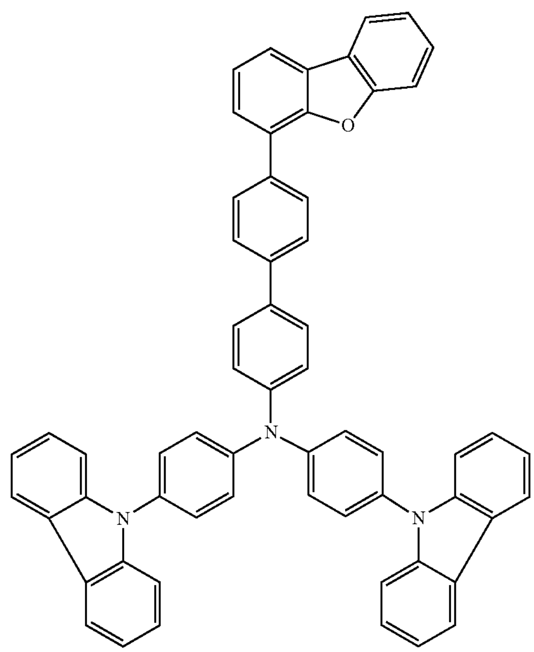

136
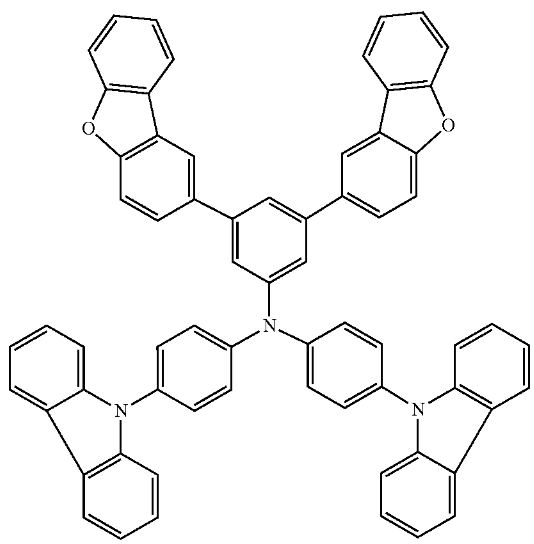
137
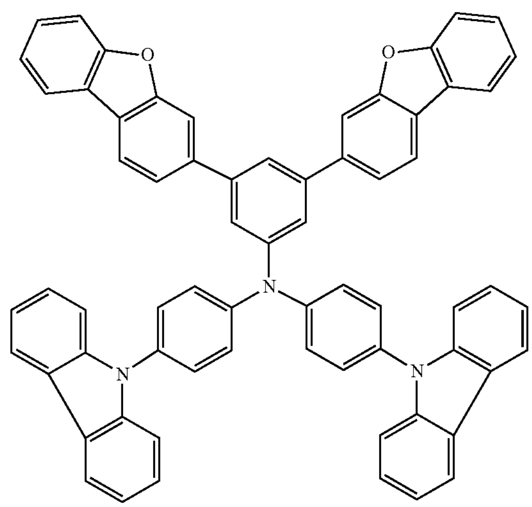
138
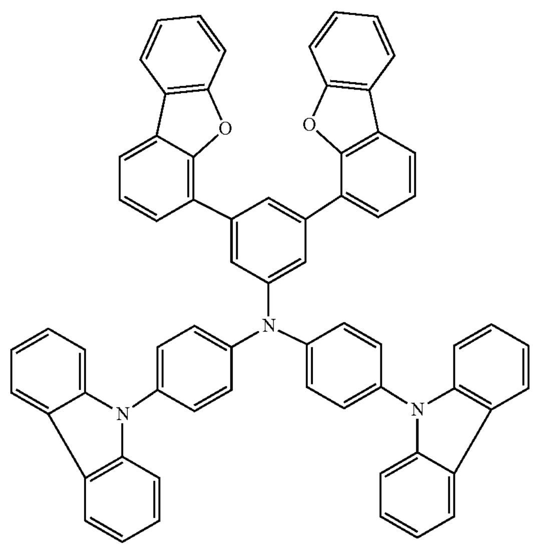
139
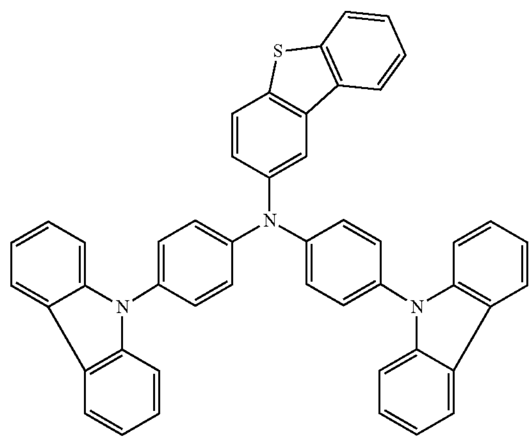
140
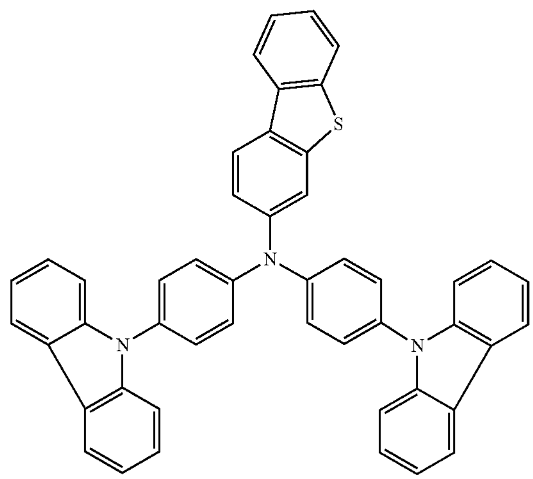
141
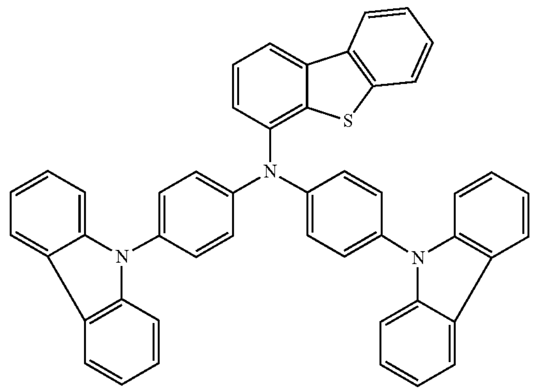

-continued
142
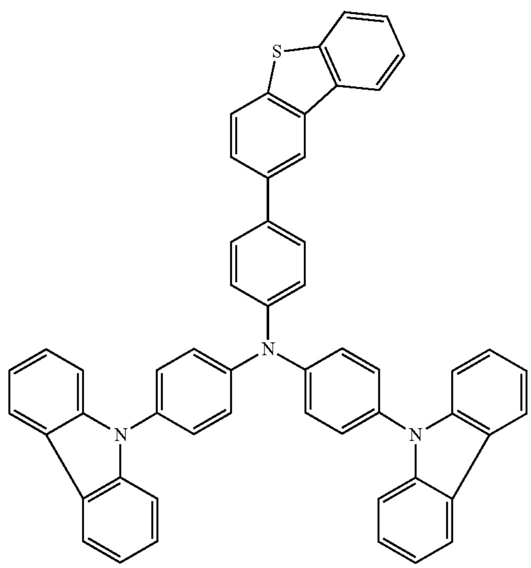
143
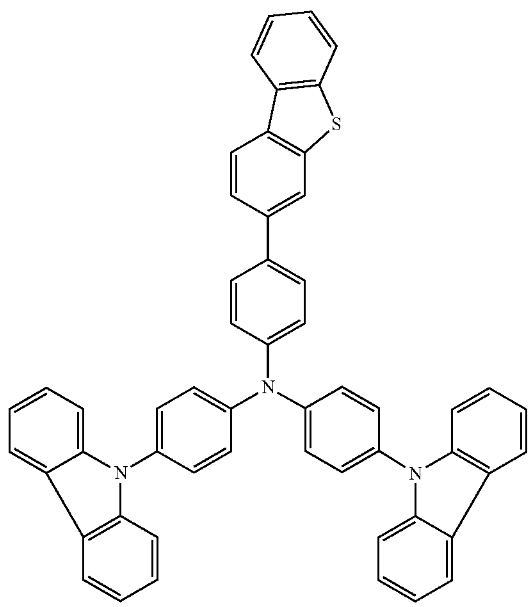
-continued
144
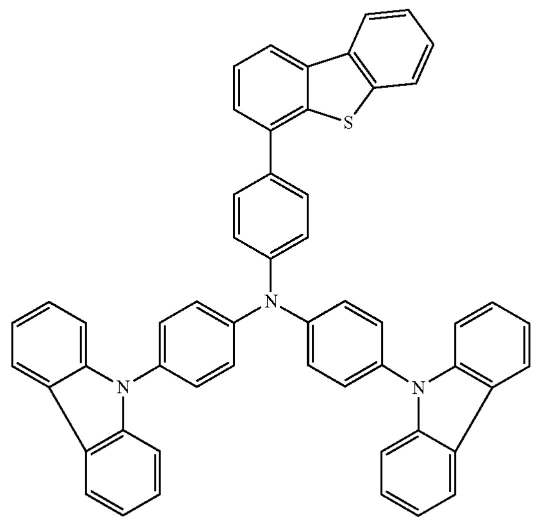
145
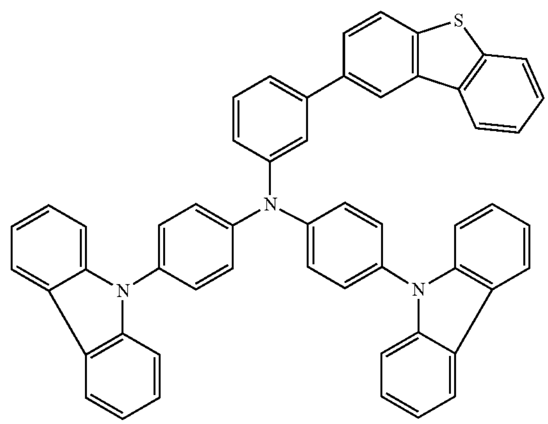
146
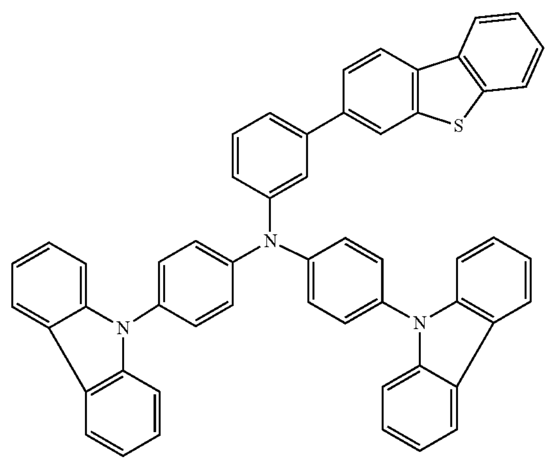

-continued
147
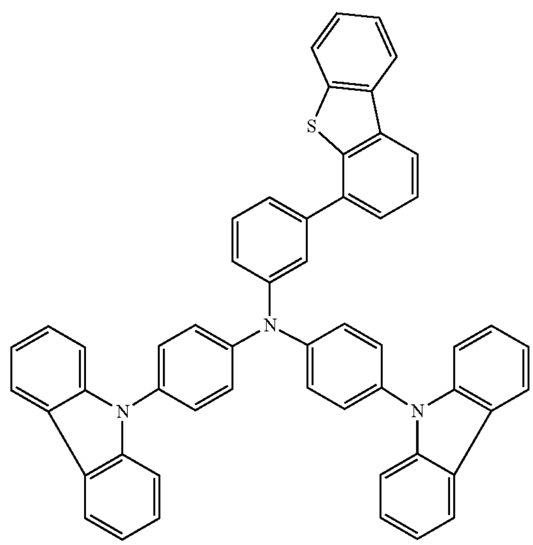
148
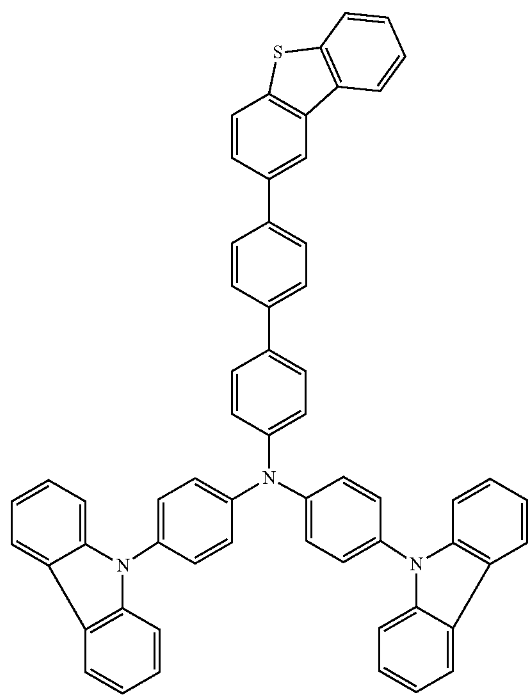
-continued
149
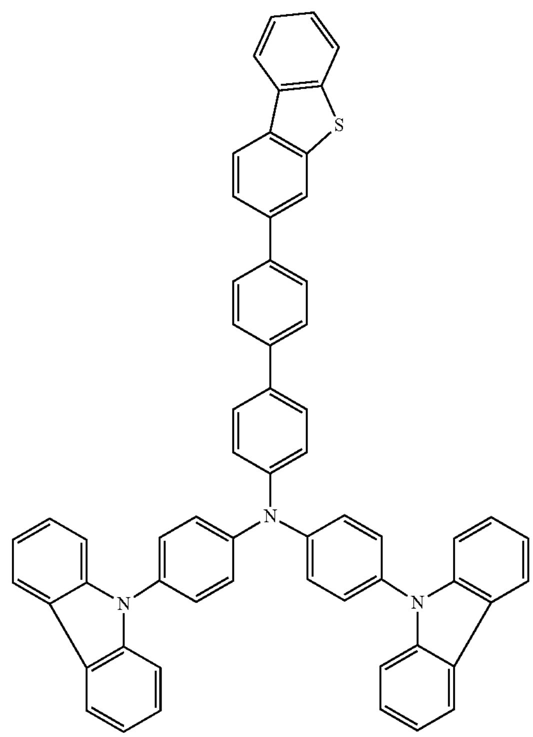
150
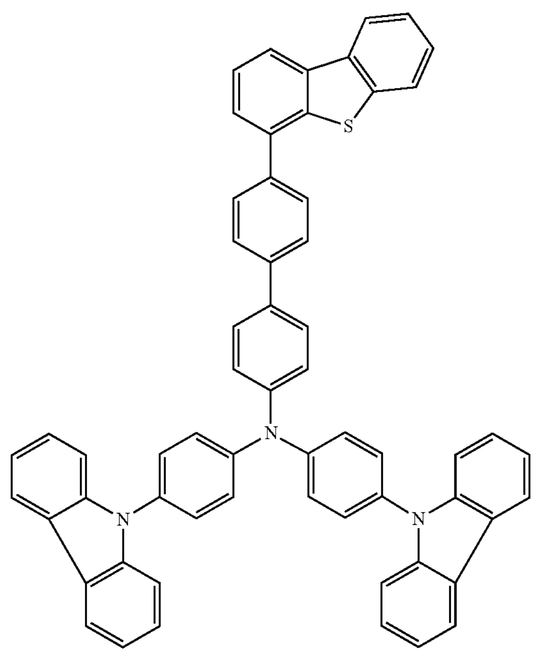

-continued
151
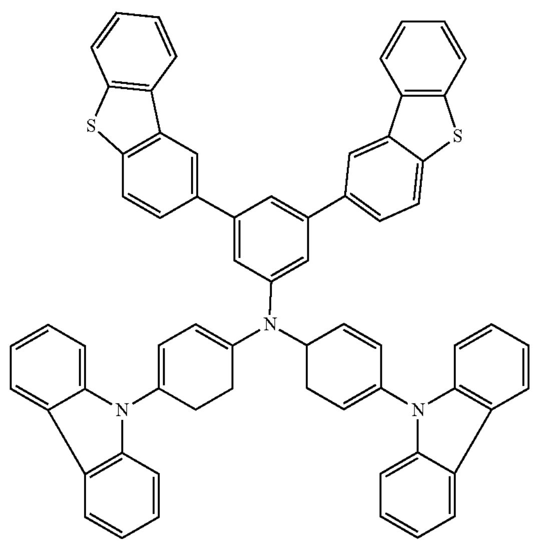
152
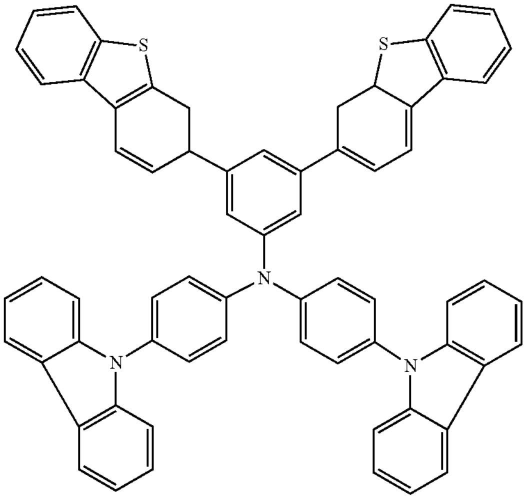
153
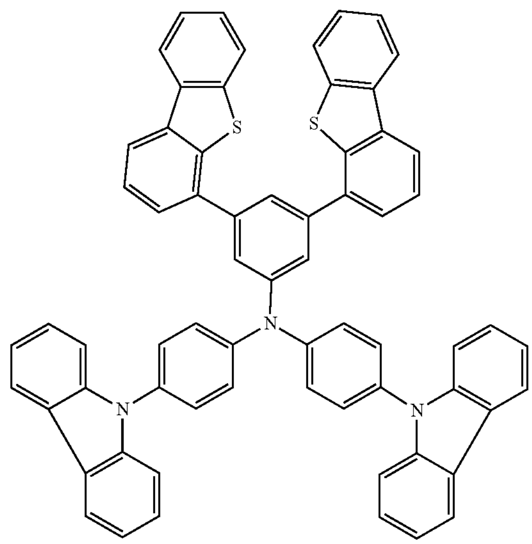
-continued
154
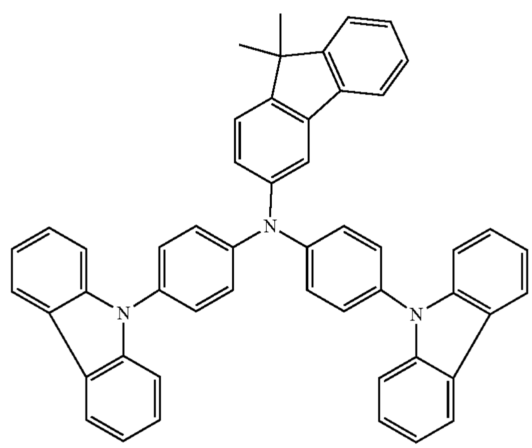
155
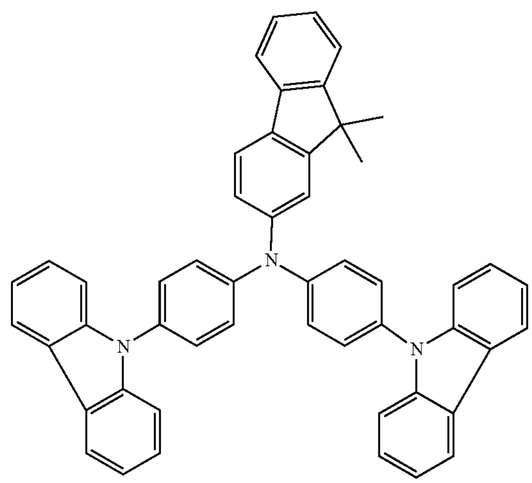
156
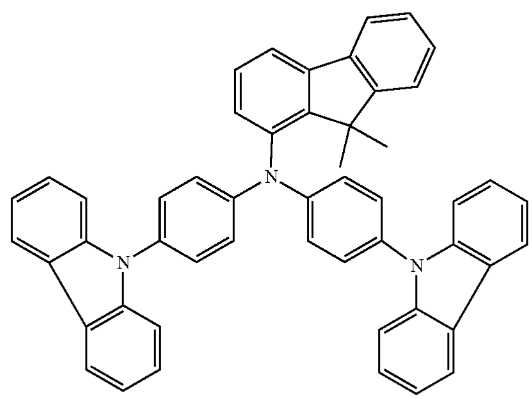

-continued
157
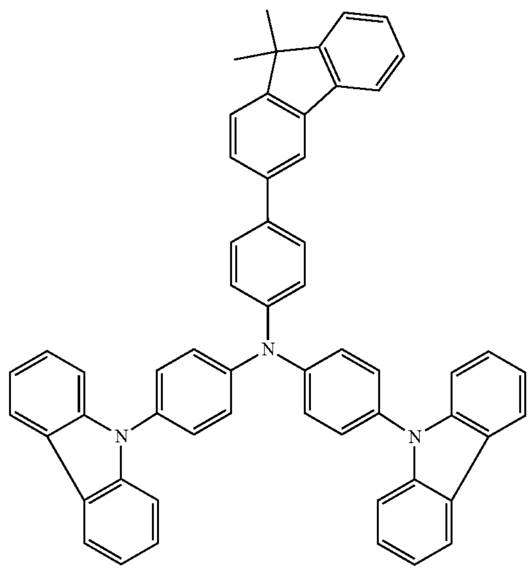
158
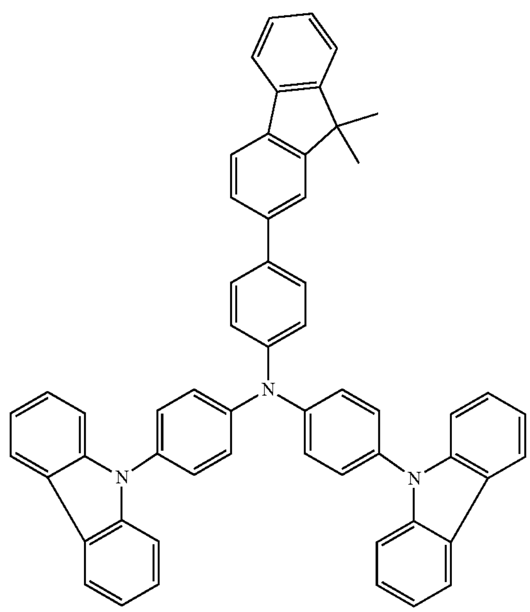
-continued
159
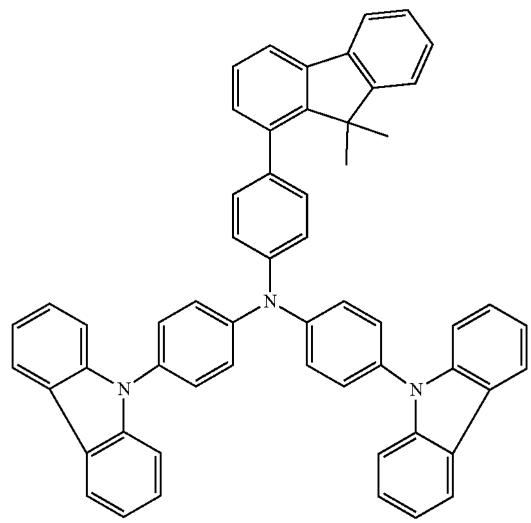
160
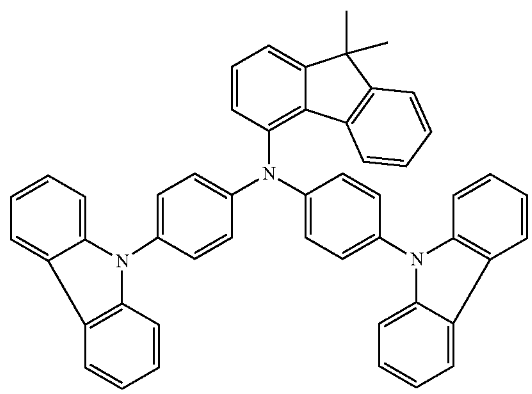
161
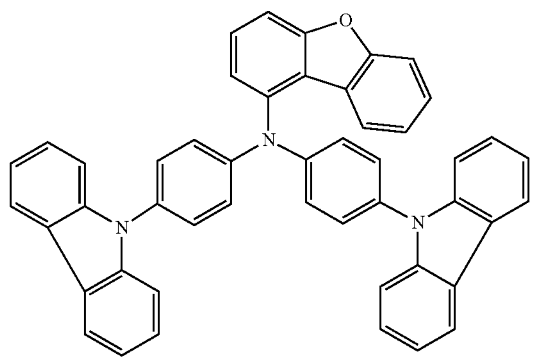
162
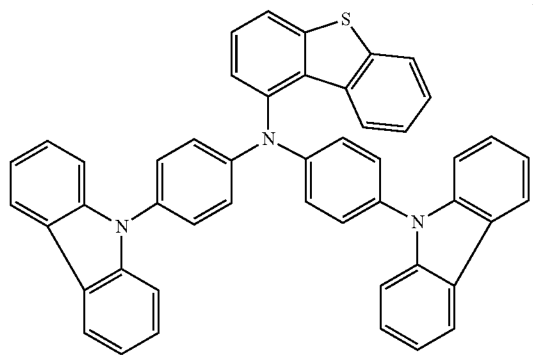

-continued
163
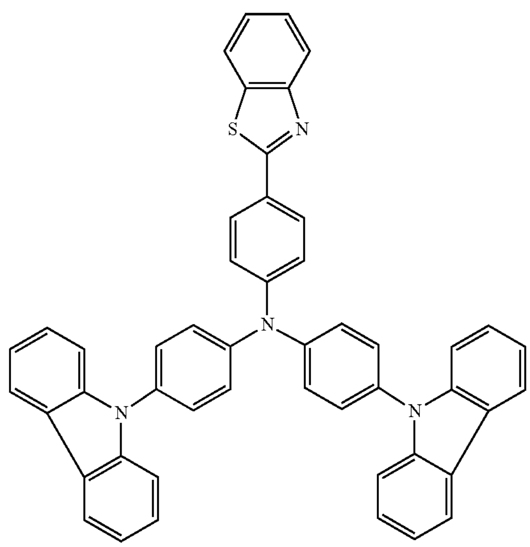
164
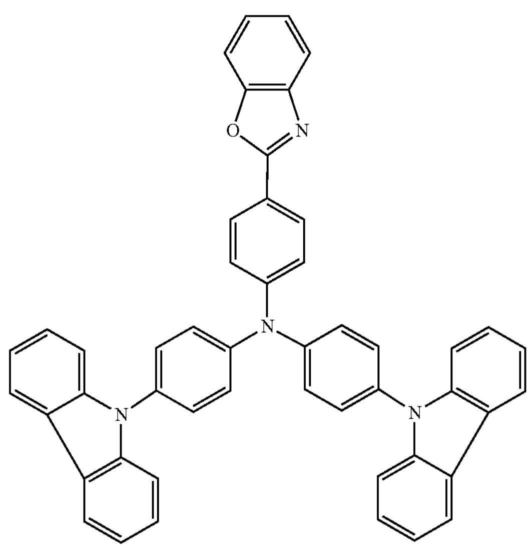
-continued
165
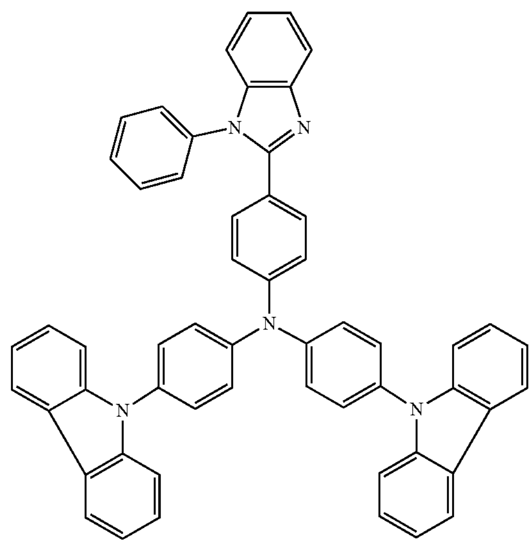
166
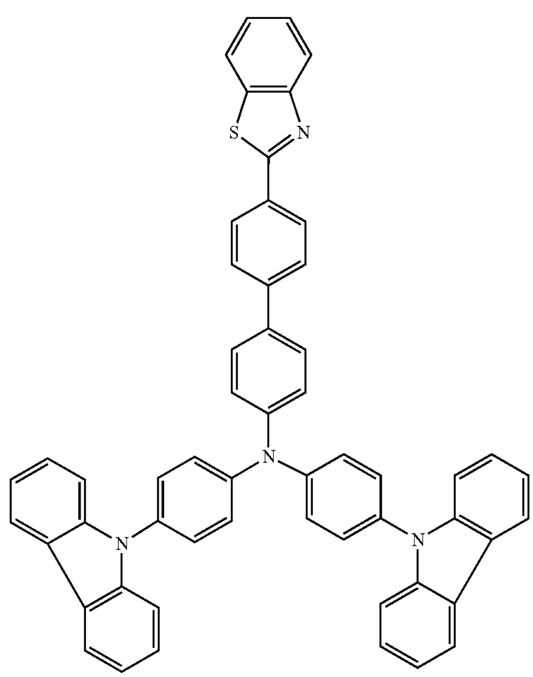

-continued
167
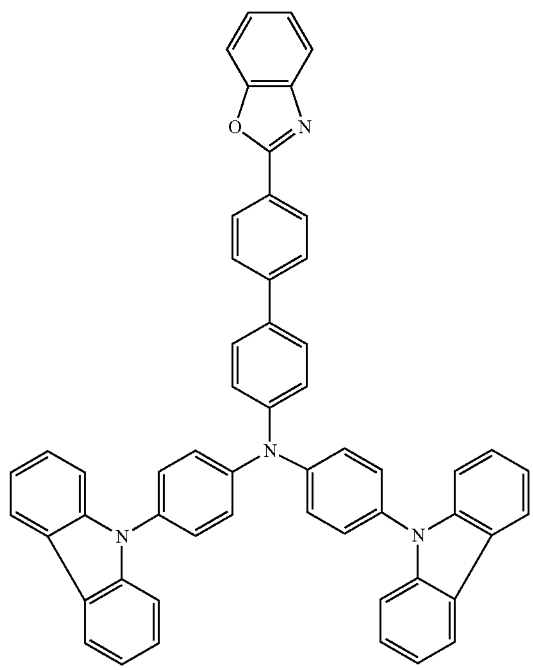
168
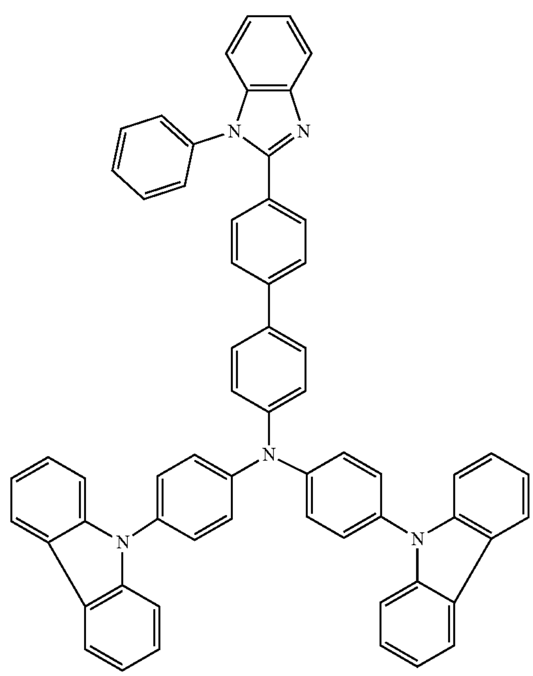
-continued
169
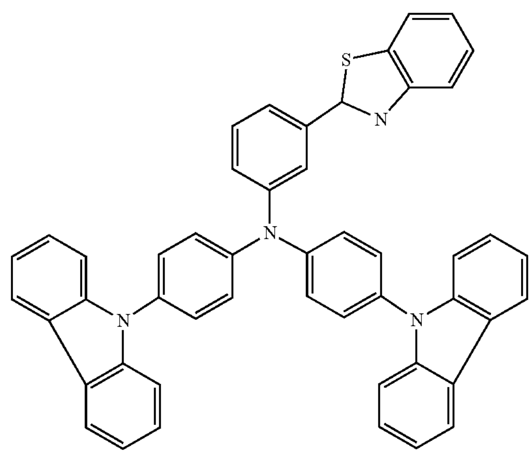
170
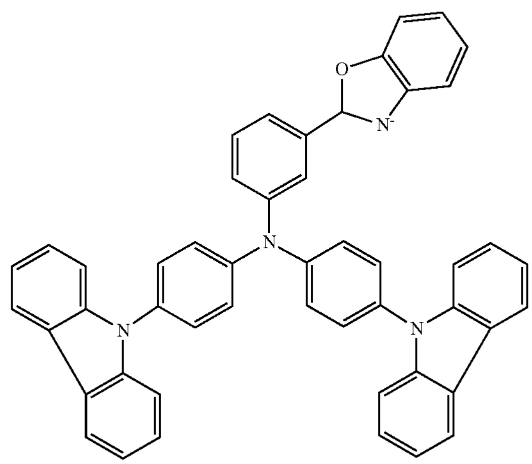
171
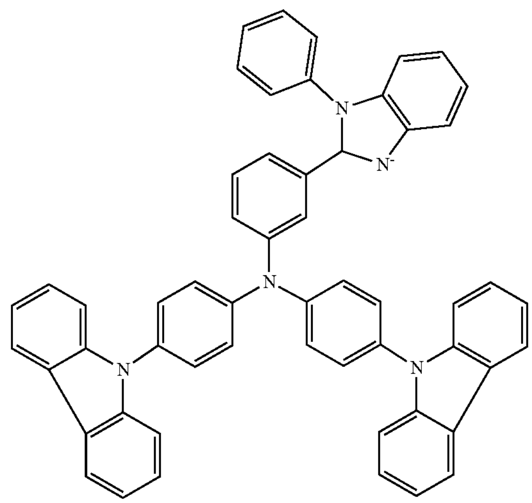

-continued
172
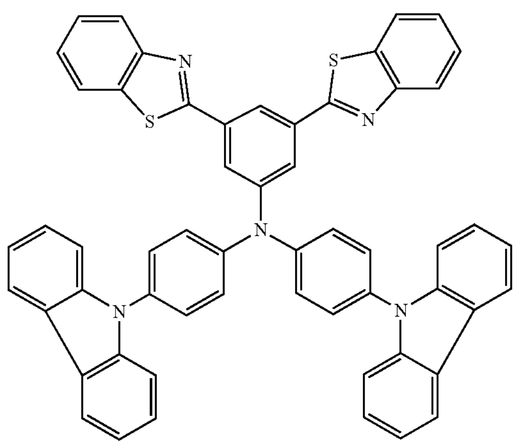
173
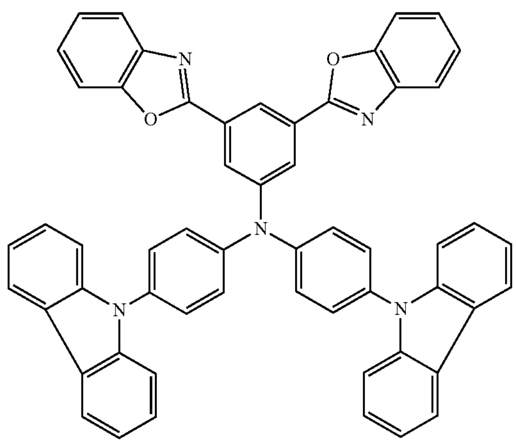
174
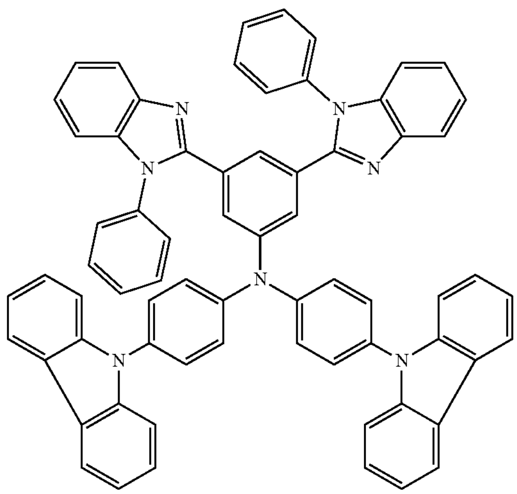
-continued
175
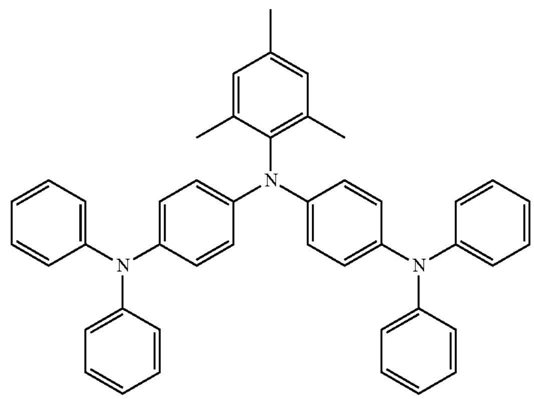
176
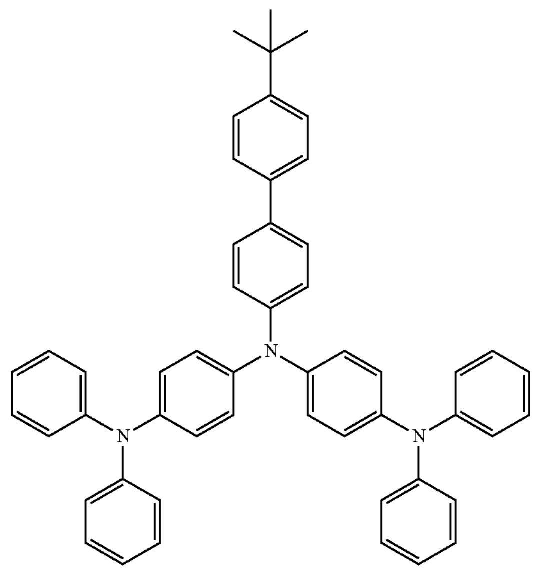
177
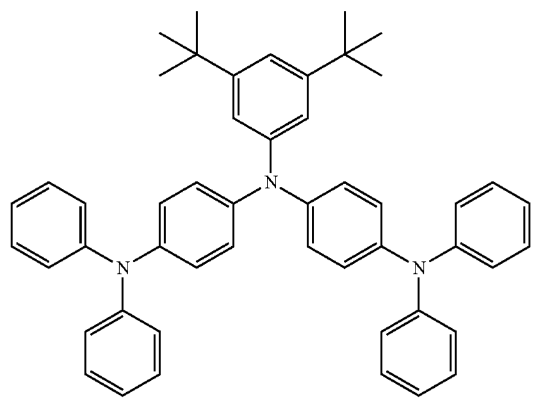

-continued
178
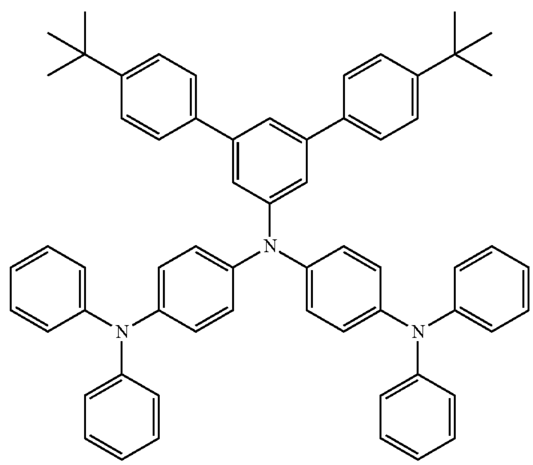
179
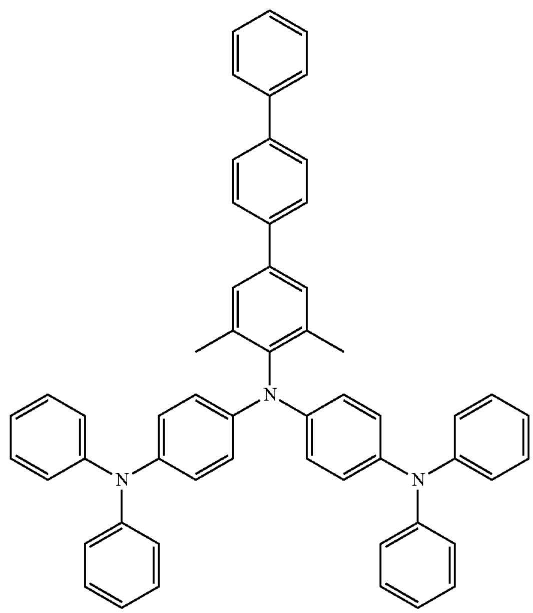
180
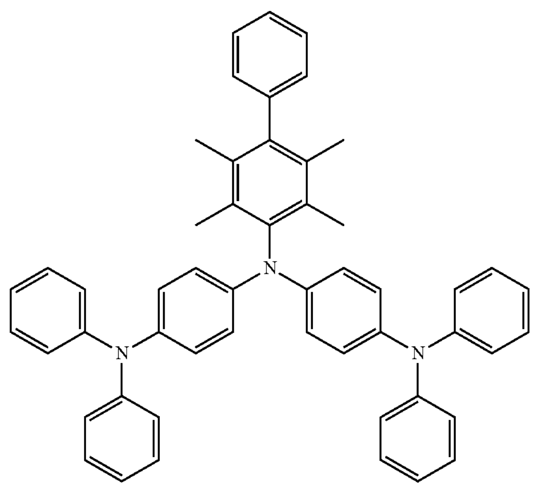
-continued
181
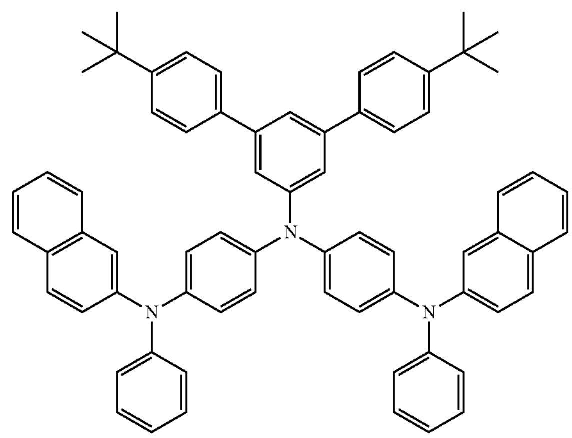
182
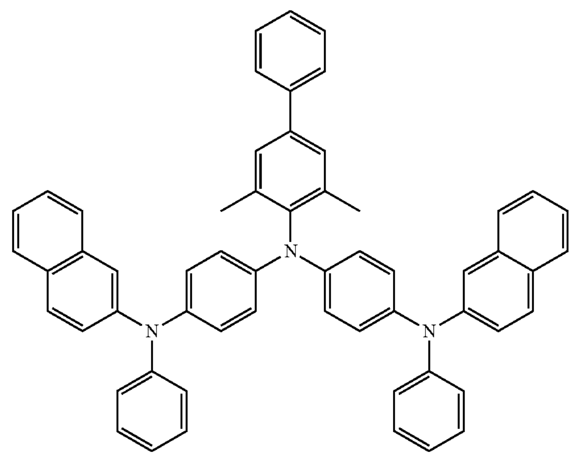
183
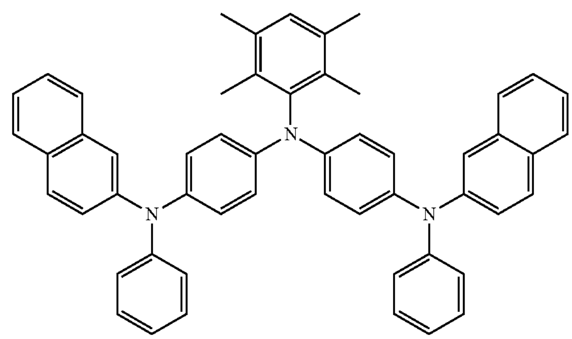

-continued
184
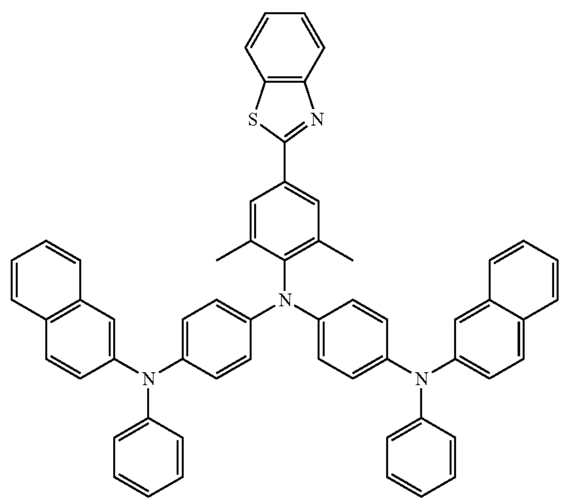
185
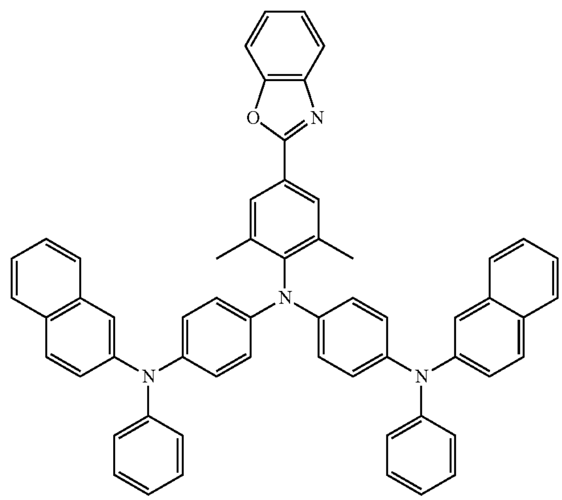
186
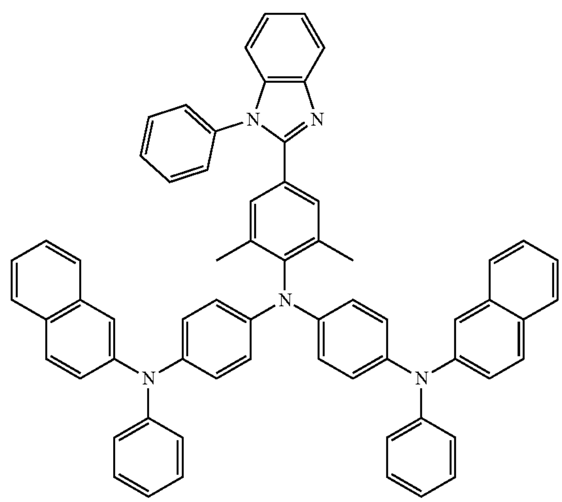
-continued
187
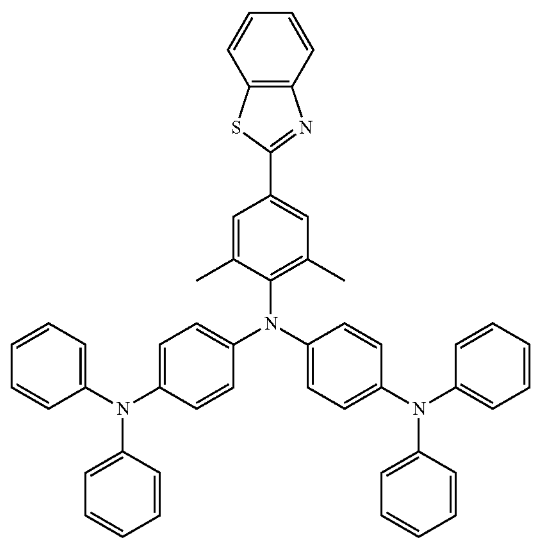
188
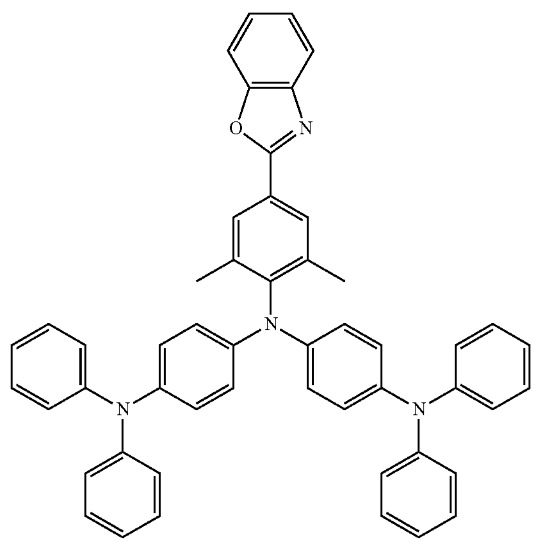
189
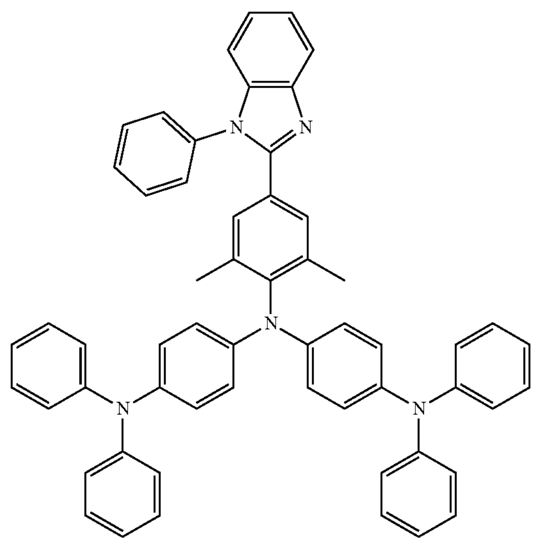

-continued
190
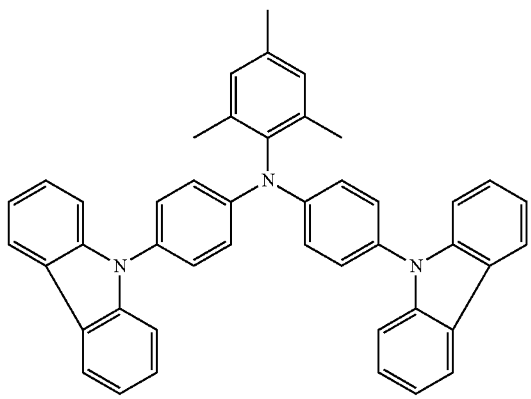
191
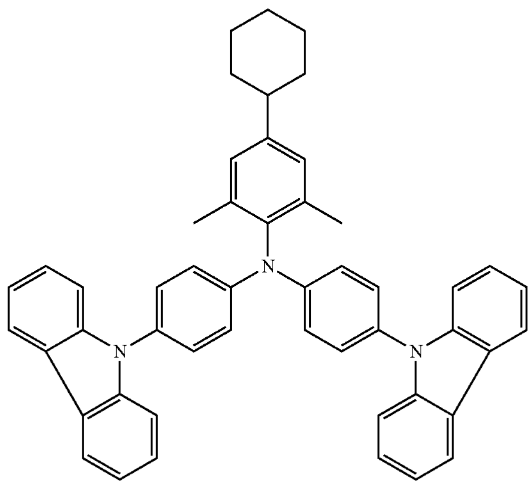
192
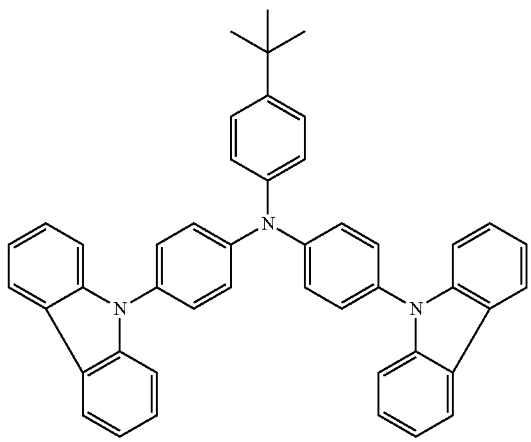
-continued
193
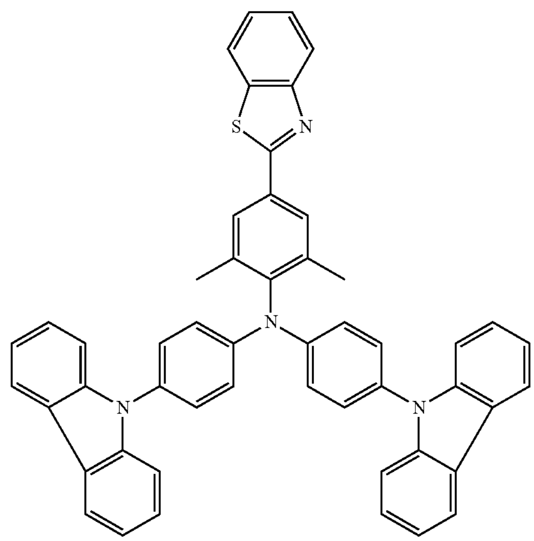
194
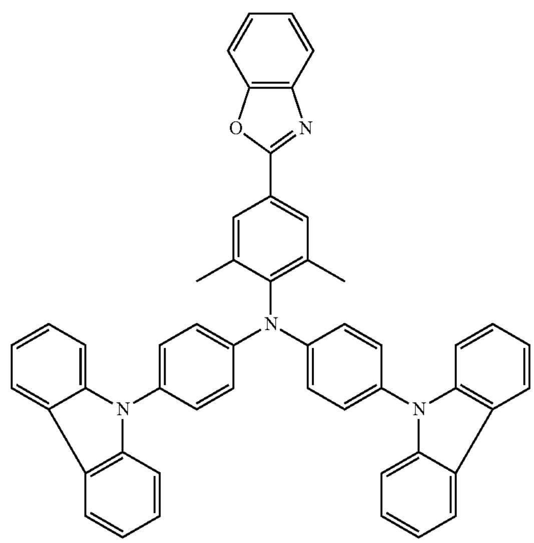
195
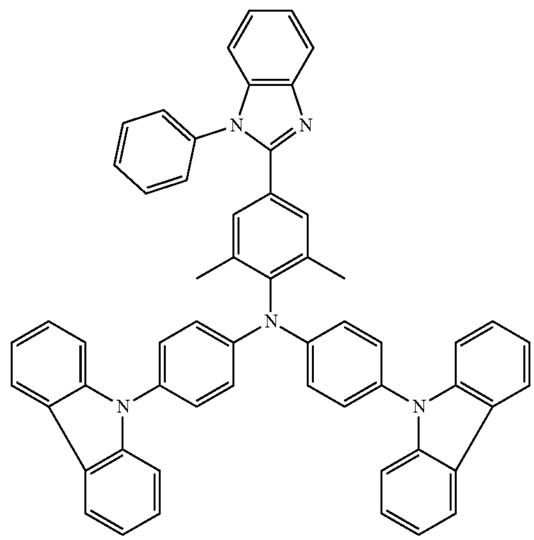

-continued
196
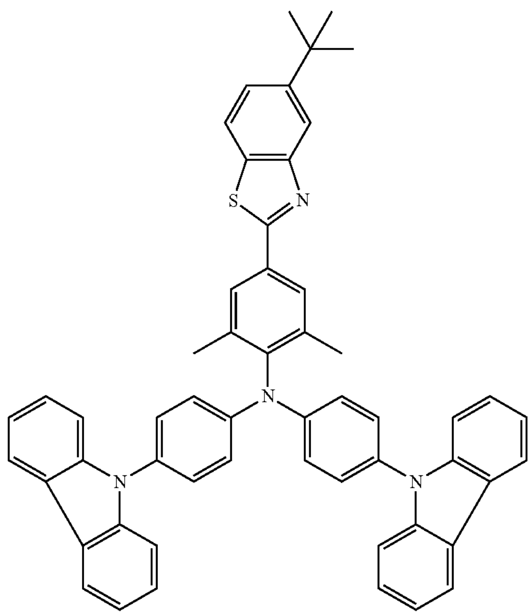
197
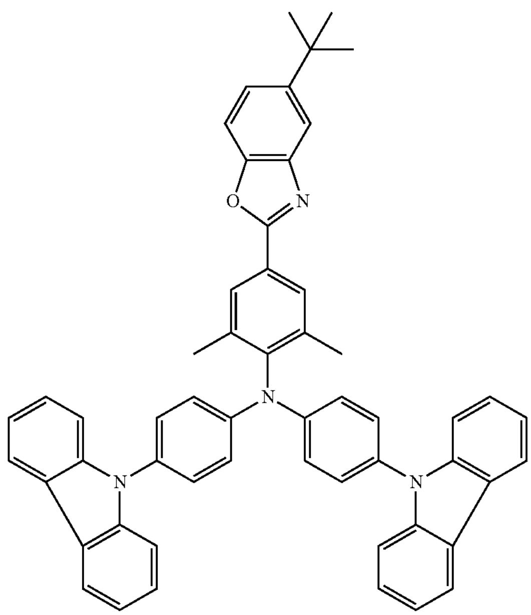
-continued
198
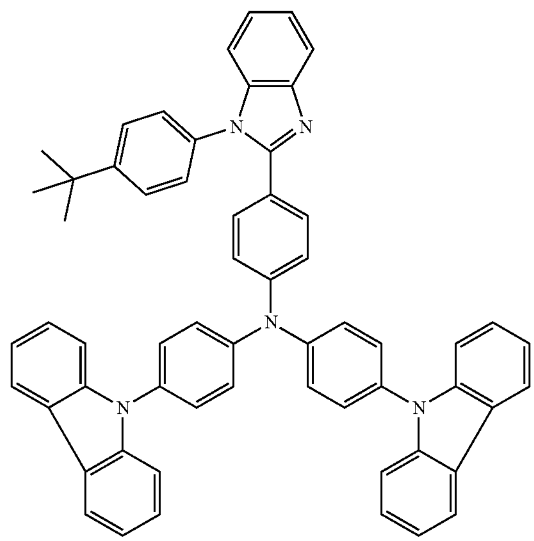
199
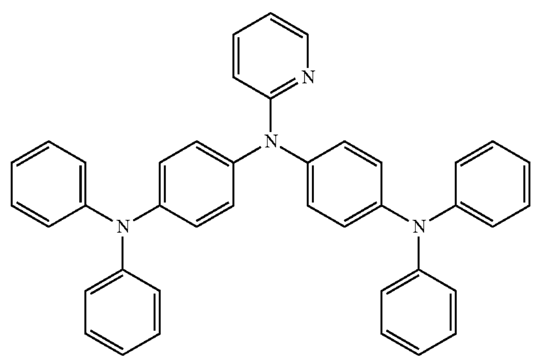
200
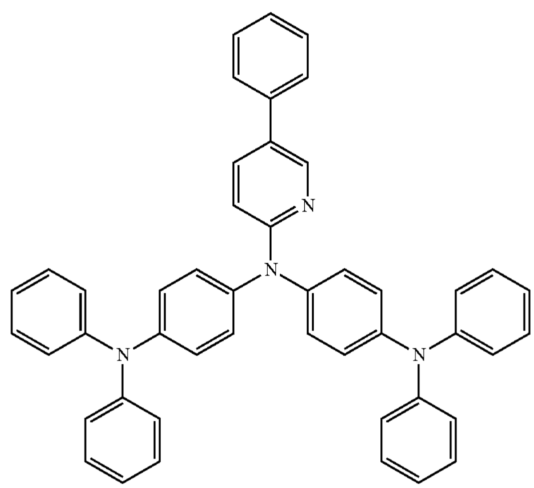

-continued
201
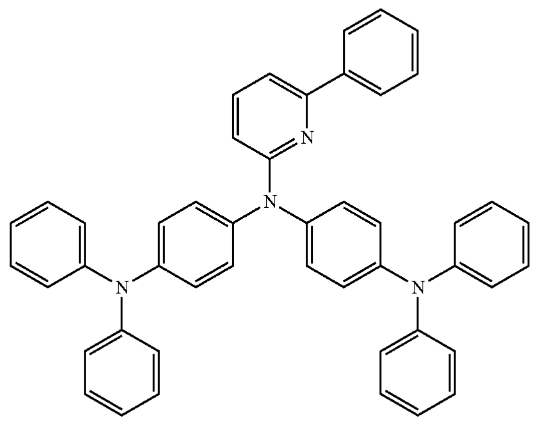
202
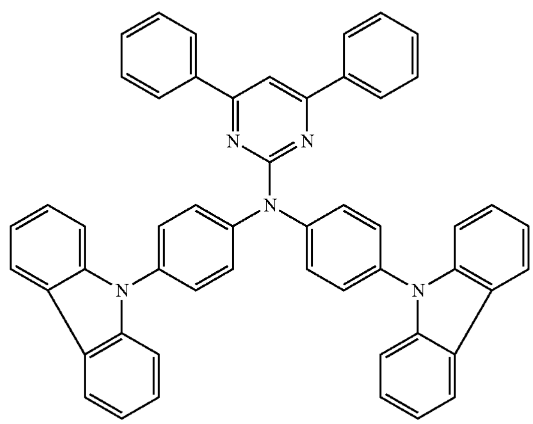
203
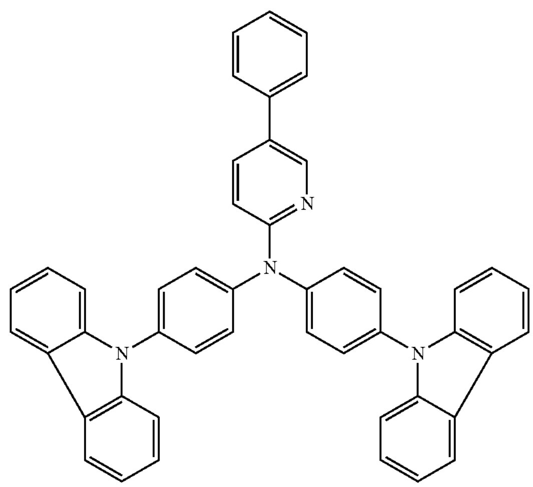
-continued
204
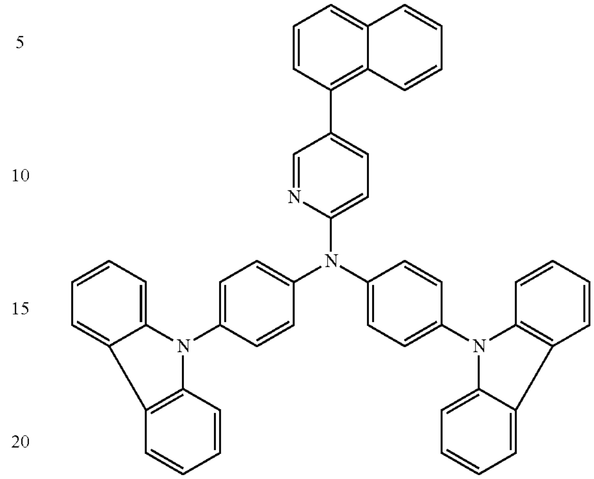
205
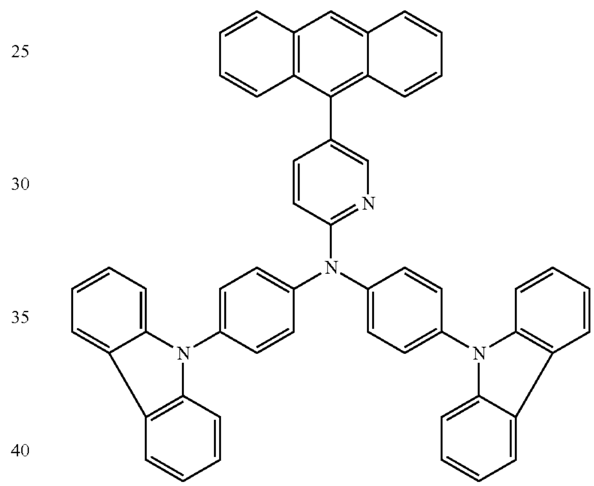
206
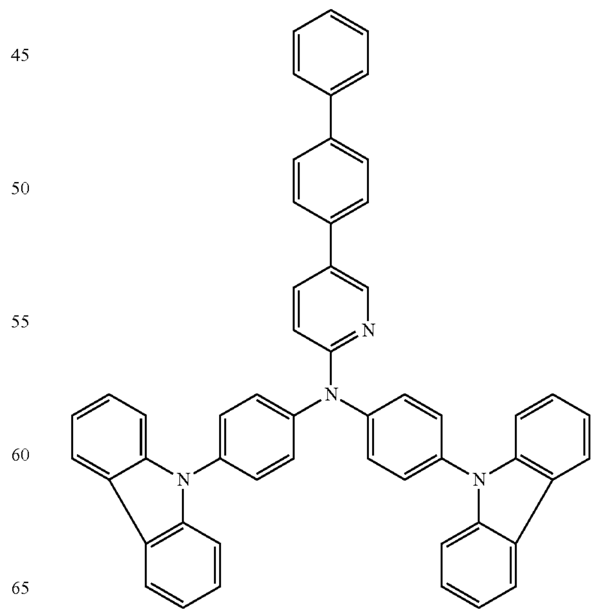

-continued

207

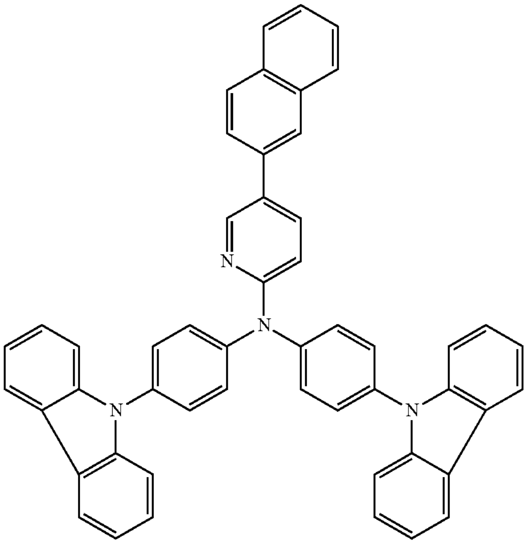

208

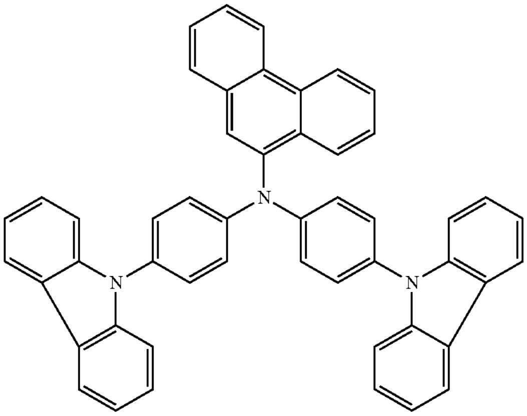

209

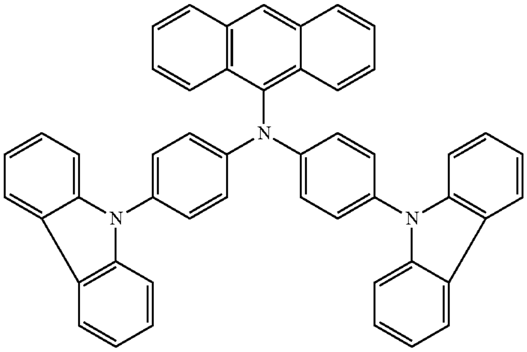

In the organic light emitting diode according to an embodiment, the transmittance of the compound represented by Formula 1 in a wavelength band of 400 to 650 nm may be greater than about 80% (an extinction coefficient (k) value may be greater than 0.02). For example, an extinction coefficient (k) of the compound represented by Formula 1 in the wavelength band of 400 to 650 nm may be 0.03 or less.

The compound represented by Formula 1 may absorb a wavelength of high energy of less than about 400 nm, and the capping layer including the compound represented by Formula 1 may minimize the damage of organic materials in a diode. In addition, the compound transmits most of the wavelengths of 400 to 650 nm or more, and the emission efficiency and external quantum efficiency of the organic light emitting diode may be improved.

The refractive index of the compound represented by Formula 1 may be 1.8 or more, and accordingly, light loss due to total reflection may be reduced.

The organic light emitting diode according to an embodiment may include one or more layers of a hole injection layer, a hole transport layer, an electron blocking layer, an emitting layer, a hole blocking layer, an electron transport layer, or an electron injection layer, and may additionally include an a charge generating layer, a hole transport auxiliary layer, an emitting auxiliary layer, an electron transport auxiliary layer, or the like.

For example, the organic light emitting diode may have a stacked structure of a first electrode (anode), a hole injection layer (HIL), a hole transport layer (HTL), an electron blocking layer (EBL), an emitting layer (EML), a hole blocking layer (HBL), an electron transport layer (ETL), an electron injection layer (EIL), and a second electrode (cathode), in order.

The first electrode may include a material which is transparent and has excellent conductivity, including indium tin oxide (ITO), indium zinc oxide (IZO), tin oxide ($SnO_2$) and zinc oxide (ZnO).

The compound of the hole injection layer or the hole transport layer is not specifically limited, and may use arbitrary compounds commonly used as the compounds of the hole injection layer or the hole transport layer. Non-limiting examples of the compound of the hole injection layer or the hole transport layer include a phthalocyanine derivative, a porphyrin derivative, a triarylamine derivative and an indolocarbazole derivative. For example, 1,4,5,8,9,11-hexaazatriphenylen-hexacarbonitrile (HAT-CN), copper phthalocyanine (CuPc), 4,4',4"-tris(3-methylphenylamino) triphenylamine (m-MTDATA), 4,4',4"-tris(3-methylphenylamino)phenoxybenzene (m-MTDAPB), 4,4',4"-tri(N-carbazolyl)triphenylamine (TCTA), 4,4',4"-tris(N-(2-naphthyl)-N-phenylamino)-triphenylamine (2-TNATA), N4,N4,N4',N4'-tetra([1,1'-biphenyl]-4-yl)-[1,1'-biphenyl]-4,4'-diamine, bis(N-(1-naphthyl-n-phenyl))benzidine (α-NPD), N,N'-di(naphthalen-1-yl)-N,N'-biphenyl-benzidine (NPB), N,N'-biphenyl-N,N'-bis(3-methylphenyl)-1,1'-biphenyl-4,4'-diamine (TPD), or the like may be included.

The compound included in the emitting layer is not specifically limited, and arbitrary compounds used as the common compounds of the emitting layer may be used. A single light-emitting compound or a light-emitting host compound may be used.

The light-emitting compound of the emitting layer may include compounds, which may emit light through phosphorescence, fluorescence, thermally activated delayed fluorescence, i.e., TADF (or referred to as E-type delayed fluorescence), triplet-triplet annililation, or combinations thereof, without limitation. The light-emitting compound may be selected from various materials according to desired emission color. Non-limiting examples of the light-emitting compound may include a fused ring derivative such as phenanthrene, anthracene, pyrene, tetracene, pentacene, perylene, naphthopyrene, dibenzopyrene, rubrene and chrysene, a benzoxazole derivative, a benzothiazole derivative, a benzoimidazole derivative, a benzotriazole derivative, an oxazole derivative, an oxadiazole derivative, a thiazole derivative, an imidazole derivative, a thiadiazole derivative, a triazole derivative, a pyrazoline derivative, a stilbene derivative, a thiophene derivative, a tetraphenylbutadiene derivative, a cyclopentadiene derivative, a bisstyryl derivative, a bisstyrylarylene derivative, a diazaindacene derivative, a furan derivative, a benzofuran derivative, an isobenzofuran derivative, a dibenzofuran derivative, a coumarine derivative, a dicyanomethylenepyran derivative, a dicyanomethylenethiopyran derivative, a polymethine derivative, a cyanine derivative, an oxobenzoanthracene derivative, a xanthene derivative, a rhodamine derivative, a fluorescein derivative, a pyrylium derivative, a carbostyryl derivative, an acridine derivative, an oxazine derivative, a phenylene oxide derivative, a quinacridone derivative, a quinazoline derivative, a pyrrolopyridine derivative, a furopyridine derivative, a 1,2,5-thiadiazolopyrene derivative, a pyrromethene derivative, a perinone derivative, a pyrrolopyrrole derivative, a squarylium derivative, a bioranthrone derivative, a phenazine derivative, an acridone derivative, a deazaflavin derivative, a fluorene derivative, a benzofluorene derivative, an aromatic boron derivative, an aromatic nitrogen boron derivative, a metal complex (complexes of a metal such as Ir, Pt, Au, Eu, Ru, Re, Ag and Cu with an aromatic heterocyclic ligand), or the like. For example, N1,N1,N6,N6-tetrakis(4-(1-silyl)phenyl)pyren-1,6-diamine, 2,12-di-tert-butyl-5,9-bis(4-(tert-butyl)phenyl)-7-(3,5-di-tert-butylphenyl)-5,9-dihydro-5,9-diaza-13b-boranaphtho[3,2,1-de]anthracene (t-DABNA-dtB), (PtOEP), Ir(ppy)3, Ir(ppy)2(acac), Ir(mppy)3, Ir(PPy)2(m-bppy), BtpIr(acac), Ir(btp)2(acac), Ir(2-phq)3, Hex-Ir(phq)3, Ir(fbi)2(acac), fac-Tris(2-(3-p-xylyl)phenyl)pyridine iridium(III), Eu(dbm)3(Phen), Ir(piq)3, Ir(piq)2(acac), Ir(Fliq)2(acac), Ir(Flq)2(acac), Ru(dtb-bpy)3·2(PF6), Ir(BT)2(acac), Ir(DMP)3, Ir(Mphq)3IR(phq)2tpy, fac-Ir(ppy)2Pc, Ir(dp)PQ2, Ir(Dpm)(Piq)2, Hex-Ir(piq)2(acac), Hex-Ir(piq)3, Ir(dmpq)3, Ir(dmpq)2(acac), FPQIrpic, FIrpic or the like, may be used.

The host compound of the emitting layer may use an emissive host, a hole transport host, an electron transport host, or combinations thereof. Non-limiting examples of the emissive host compound may include a fused ring derivative such as anthracene and pyrene, a bisstyryl derivative such as bisstyryl anthracene derivative and distyryl benzene derivative, a tetraphenylbutadiene derivative, a cyclopentadiene derivative, a fluorene derivative, a benzofluorene derivative, a N-phenylcarbazole derivative, a carbazonitrile derivative, or the like. Non-limiting examples of the hole transport host material may include a carbazole derivative, a dibenzofuran derivative, a dibenzothiophene derivative, a triarylamine derivative, an indolocarbazole derivative and a benzoxazinophenoxazine derivative. Non-limiting examples of the electron transport host material may include a pyridine derivative, a triazine derivative, a phosphine oxide derivative, a benzofuropyridine derivative, and a dibenzooxasiline derivative. For example, 9,10-bis(2-naphthyl)anthracene (ADN), tris(8-hydroxyquinolinolato)aluminum (Alq3), 8-hydroxyquinolineberyllium salt (Balq), 4,4'-bis(2,2-biphneylethenyl)-1,1'-biphenyl series (DPVBi), spiro-4,4'-bis(2,2-biphenylethenyl)-1,1'-biphenyl (spiro-DPVBi), 2-(2-benzooxazolyl)-phenollithium salt (LiPBO), bis(biphenylvinyl) benzene, an aluminum-quinoline metal complex, metal complexes of imidazole, thiazole and oxazole, or the like may be included.

An electron blocking layer (EBL) may be formed between the hole transport layer and the emitting layer. The compound of the electron blocking layer is not specifically limited and may use arbitrary compounds commonly used as the compounds of the electron blocking layer. For example, the electron blocking layer may include N-phenyl-N-(4-(spiro[benzo[d,e]anthracen-7,9'-fluorene]-2'-yl)phenyl) dibenzo[b,d]furan-4-amine), or the like.

The compound of the electron injection layer or the electron transport layer is not specifically limited, and arbitrary compounds commonly used as the compounds of the electron injection layer or the electron transport layer may be used. Non-limiting examples of the compound of the electron injection layer or the electron transport layer may include a pyridine derivative, a naphthalene derivative, an anthracene derivative, a phenanthroline derivative, a perionone derivative, a coumarine derivative, a naphthalimide derivative, an anthraquinone derivative, a diphenoquinone derivative, a diphenylquinone derivative, a perylene derivative, an oxadiazole derivative, a thiophene derivative, a triazole derivative, a thiadiazole derivative, a metal complex of an oxine derivative, a quinolinol-based metal complex, a quinoxaline derivative, a polymer of a quinoxaline derivative, benzazole compounds, a gallium complex, a pyrazole derivative, a perfluorinated phenylene derivative, a triazine derivative, a pyrazine derivative, a benzoquinoline derivative, an imidazopyridine derivative, a borane derivative, a benzoimidazole derivative, a benzoxazole derivative, a benzothiazole derivative, a quinoline derivative, an oligo pyridine derivative such as tert-pyridine, a bipyridine derivative, a tert-pyridine derivative, a naphthyridine derivative, an aldazine derivative, a carbazole derivative, an indole derivative, a phosphine oxide derivative, a bisstyryl derivative, a quinolinol-based metal complex, a hydroxyazole-based metal complex, an azomethine-based metal complex, a tropolone-based metal complex, a flavonol-based metal complex, a benzoquinoline-based metal complex, a metal salt, or the like. These materials may be used solely, and may be used as a mixture with other materials. For example, a material like 2-(4-(9,10-di(naphthalen-2-yl)anthracen-2-yl) phenyl)-1-phenyl-1H-benzo[d]imidazole, tris(8-hyroxyquinolinolato)aluminum (Alq3), LiF, Liq, LizO, BaO, NaCl, CsF, or the like may be included.

The second electrode (cathode) may include a material including lithium (Li), aluminum (Al), aluminum-lithium (Al—Li), calcium (Ca), magnesium (Mg), magnesium-indium (Mg—In), magnesium-silver (Mg—Ag), or the like. In addition, in the case of a top emission type organic light emitting diode, a transparent cathode which can transmit light may be formed using indium tin oxide (ITO) or indium zinc oxide (IZO).

On the surface of the second electrode, the capping layer according to an embodiment may be positioned. The capping layer may include one or more compounds selected from the compounds represented by Formula 1.

The organic light emitting diode may be a top emission type or a bottom emission type.

The color viewing angle (Δu'v') at viewing angles of 30°, 45° and 60° of light emitted from the organic light emitting diode according to an embodiment (light produced at an organic layer and emitted through the capping layer) may be less than about 0.010. Particularly, the color viewing angle (Δu'v') at viewing angles of 30°, 45° and 60° of light emitted from the organic light emitting diode may be less than about 0.005.

If the numerical value of the color viewing angle (Δu'v') decreases, the change of color coordinate expressing color decreases, and a color change ratio sensed by a user according to a viewing angle may be improved. In the organic light emitting diode according to an embodiment, the compound represented by Formula 1 is included, and the color viewing angle at viewing angles of 30°, 45° and 60° may be less than 0.010, and thus, a user may not sense the color change according to the viewing angle at all. In the case of blue light, which generates color shift even with subtle changes of the viewing angle, if the color viewing angle of less than 0.010 or the color viewing angle of less than 0.005 is achieved, a user may recognize the same color.

The thickness of the capping layer of the organic light emitting diode according to an embodiment may be 700 to 2000 Å, particularly, 700 to 1500 Å or 800 to 1200 Å. Within such a thickness range, the lifetime and the color viewing angle of the diode may be improved even further.

The density of the capping layer in the organic light emitting diode according to an embodiment may be about 1.15 to 1.30 g/cm$^3$, particularly, about 1.15 to 1.25 g/cm$^3$, or about 1.20 to 1.25 g/cm$^3$. Within such a density range, the lifetime and the color viewing angle of the diode may be improved even further.

The organic light emitting diode according to an embodiment may be used in a display device. Particularly, the organic light emitting diode may be applied in a transparent display device, a mobile display device, a flexible display device, or the like, without limitation. The capping layer according to an embodiment shows high transmittance that is suitable for a transparent display device and has high tensile strength that is suitable for a flexible display device.

Hereinafter, typical synthetic methods of the compounds will be explained for illustrations. However, the synthetic method of the compound of the present disclosure is not limited thereto.

Synthetic Examples

1. Synthesis of SUB 1

SUB 1 may be synthesized as follows, but is not limited thereto.

[Reaction 1]

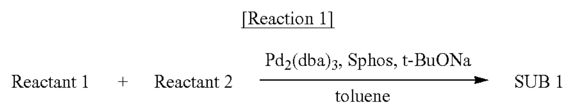

Under a nitrogen stream, to a 500 mL flask, Reactant 1 (80 mmol), Reactant 2 (80 mmol), t-BuONa (160 mmol), $Pd_2(dba)_3$ (1.6 mmol), Sphos (3.2 mmol) and toluene (300 mL) were added and stirred under reflux conditions for 12 hours. After finishing the reaction, an organic layer was extracted using $CH_2Cl_2$ and water. The extracted solution was treated with $MgSO_4$ to remove residual water, concentrated under a reduced pressure, and purified using a column chromatography method and recrystallized to obtain SUB 1.

The synthetic results of SUB 1 are shown in Table 1 below.

TABLE 1

| Category | Reactant 1 | Reactant 2 | SUB 1 | Yield | [M + H]$^+$ |
|---|---|---|---|---|---|
| SUB 1-1 | 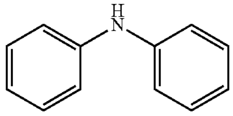 [SMILES: c1ccc(Nc2ccccc2)cc1] | 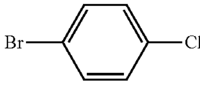 | 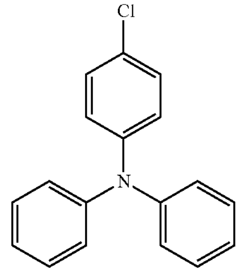 [SMILES: Clc1ccc(N(c2ccccc2)c2ccccc2)cc1] | 19.0 g (85%) | 279.07 |
| SUB 1-2 | 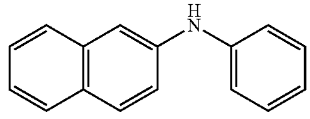 [SMILES: c1ccc(Nc2ccc3ccccc3c2)cc1] | 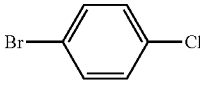 | 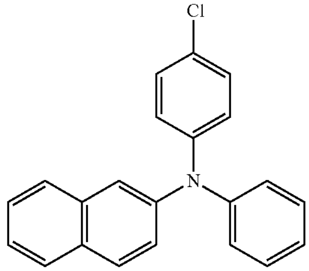 [SMILES: Clc1ccc(N(c2ccccc2)c2ccc3ccccc3c2)cc1] | 21.9 g (83%) | 329.08 |
| SUB 1-3 | 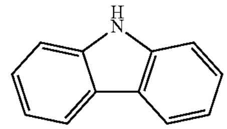 [SMILES: c1ccc2c(c1)[nH]c1ccccc12] | 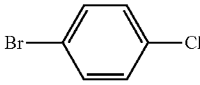 | 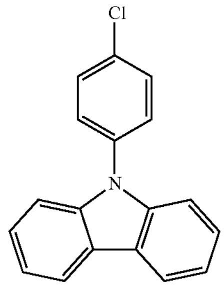 [SMILES: Clc1ccc(-n2c3ccccc3c3ccccc32)cc1] | 18.8 g (85%) | 277.07 |

2. Synthesis of SUB 2

SUB 2 may be synthesized as follows, but is not limited thereto.

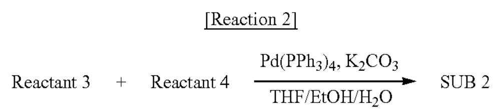

Under a nitrogen stream, to a 500 mL flask, Reactant 3 (77 mmol), Reactant 4 (70 mmol), $K_2CO_3$ (210 mmol), $Pd(PPh_3)_4$ (3.5 mmol), and 250 mL of THF/EtOH/$H_2O$ (10:1:1) were added and stirred under reflux conditions for 6 hours. After finishing the reaction, an organic layer was extracted using $CH_2Cl_2$ and water. The extracted solution was treated with $MgSO_4$ to remove residual water, concentrated under a reduced pressure, and purified using a column chromatography method and recrystallized to obtain SUB 2.

The synthetic results of SUB 2 are shown in Table 2 below.

TABLE 2

| Category | Reactant 3 | Reactant 4 | SUB 2 | Yield | [M + H]+ |
|---|---|---|---|---|---|
| SUB 2-1 | 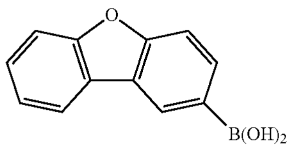 [SMILES: OB(O)c1ccc2oc3ccccc3c2c1] | 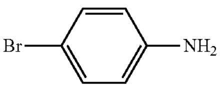 | 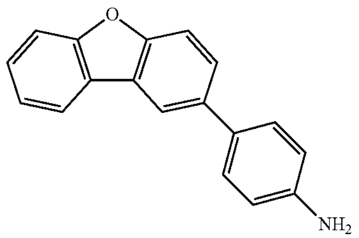 [SMILES: Nc1ccc(-c2ccc3sc4ccccc4c3c2)cc1] | 16.9 g (93%) | 259.09 |
| SUB 2-2 | 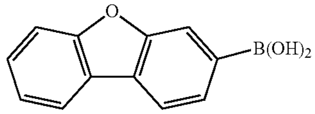 [SMILES: OB(O)c1ccc2c(c1)sc1ccccc12] | 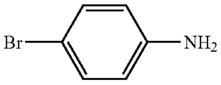 | 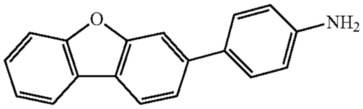 [SMILES: Nc1ccc(-c2ccc3c(c2)sc2ccccc23)cc1] | 16.3 g (90%) | 259.09 |
| SUB 2-3 | 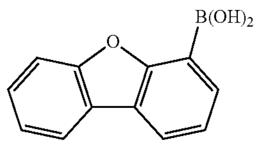 [SMILES: OB(O)c1cccc2c1sc1ccccc12] | 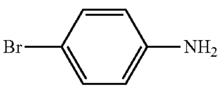 | 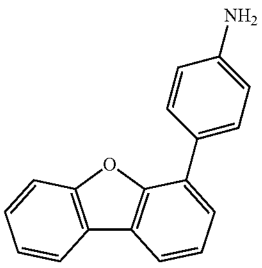 | 17.2 g (95%) | 259.09 |
| SUB 2-4 | 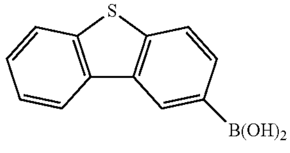 | 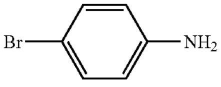 | 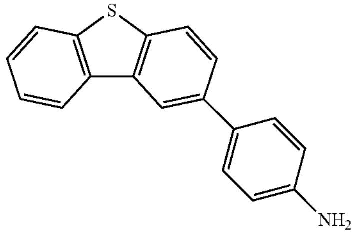 | 17.7 g (92%) | 275.07 |
| SUB 2-5 | 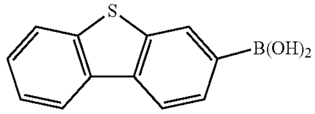 | 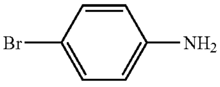 | 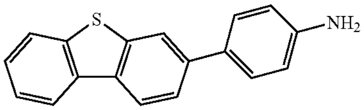 | 18.5 g (96%) | 275.07 |

TABLE 2-continued

| Category | Reactant 3 | Reactant 4 | SUB 2 | Yield | [M + H]+ |
|---|---|---|---|---|---|
| SUB 2-6 | 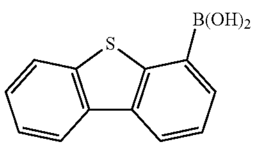 | 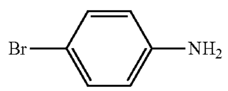 | 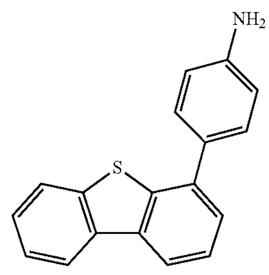 [SMILES: Nc1ccc(-c2cccc3c2sc2ccccc23)cc1] | 17.9 g (93%) | 275.07 |
| SUB 2-7 | 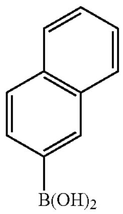 [SMILES: OB(O)c1ccc2ccccc2c1] | 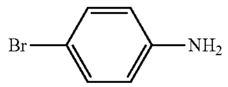 | 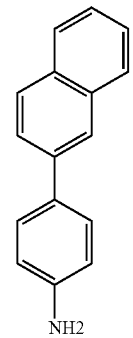 [SMILES: Nc1ccc(-c2ccc3ccccc3c2)cc1] | 14.5 g (86%) | 219.10 |
| SUB 2-8 | 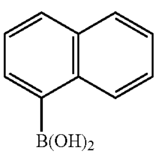 [SMILES: OB(O)c1cccc2ccccc12] | 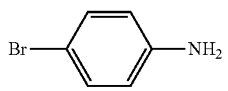 | 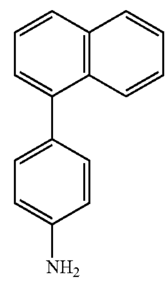 [SMILES: Nc1ccc(-c2cccc3ccccc23)cc1] | 14.3 g (85%) | 219.10 |

3. Synthesis of Compounds

A Product may be synthesized as follows, but is not limited thereto.

[Reaction 3]

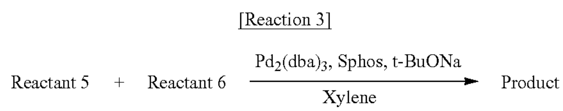

Under a nitrogen stream, to a 200 mL flask, Reactant 5 (30 mmol), Reactant 6 (15 mmol), t-BuONa (60 mmol), $Pd_2(dba)_3$ (1.2 mmol), Sphos (2.4 mmol) and toluene (100 mL) were added and stirred under reflux conditions for 24 hours. After finishing the reaction, an organic layer was extracted using $CH_2Cl_2$ and water. The extracted solution was treated with $MgSO_4$ to remove residual water, concentrated under a reduced pressure, and purified using a column chromatography method and recrystallized to obtain a Product.

The synthetic results of the compounds are shown in Table 3 below.

TABLE 3

| Reactant 5 | Reactant 6 | Product | Yield | [M + H]+ |
|---|---|---|---|---|
| SUB 1-1 | 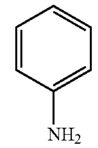 | Compound 1 | 7.0 g (81%) | 579.26 |
| SUB 1-1 | 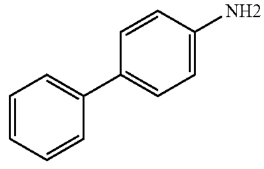 [SMILES: Nc1ccc(-c2ccccc2)cc1] | Compound 2 | 7.5 g (76%) | 655.30 |

TABLE 3-continued

| Reactant 5 | Reactant 6 | Product | Yield | [M + H]+ |
|---|---|---|---|---|
| SUB 1-1 | 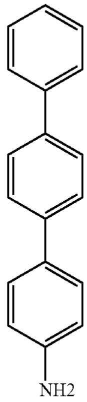 | Compound 8 | 7.9 g (72%) | 731.32 |
| SUB 1-1 | SUB 2-1 | Compound 25 | 8.5 g (76%) | 745.30 |
| SUB 1-1 | SUB 2-2 | Compound 26 | 8.7 g (78%) | 745.92 |
| SUB 1-1 | SUB 2-3 | Compound 27 | 9.2 g (82%) | 745.30 |
| SUB 1-1 | SUB 2-4 | Compound 40 | 9.1 g (80%) | 761.28 |
| SUB 1-1 | SUB 2-2 | Compound 41 | 8.7 g (76%) | 761.28 |
| SUB 1-1 | SUB 2-6 | Compound 42 | 8.8 g (77%) | 761.28 |
| SUB 1-1 | 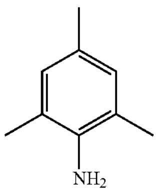 | Compound 175 | 6.52 g (70%) | 621.83 |
| SUB 1-1 | 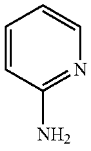 | Compound 199 | 5.92 g (68%) | 580.74 |
| SUB 1-2 | 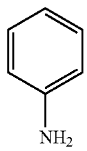 | Compound 52 | 8.3 g (81%) | 679.29 |
| SUB 1-2 | 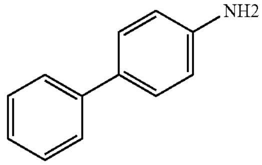 [SMILES: Nc1ccc(-c2ccccc2)cc1] | Compound 53 | 8.6 g (76%) | 755.33 |

TABLE 3-continued

| Reactant 5 | Reactant 6 | Product | Yield | [M + H]+ |
|---|---|---|---|---|
| SUB 1-2 | 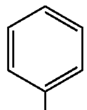 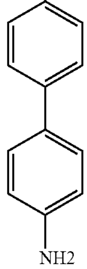 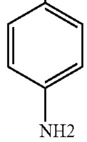 | Compound 59 | 9.0 g (72%) | 831.36 |
| SUB 1-2 | SUB 2-1 | Compound 76 | 9.6 g (76%) | 845.34 |
| SUB 1-2 | SUB 2-2 | Compound 77 | 9.9 g (78%) | 845.34 |
| SUB 1-2 | SUB 2-3 | Compound 78 | 10.4 g (82%) | 845.34 |
| SUB 1-2 | SUB 2-4 | Compound 91 | 10.3 g (80%) | 861.31 |
| SUB 1-2 | SUB 2-5 | Compound 92 | 9.8 g (76%) | 861.31 |
| SUB 1-2 | SUB 2-6 | Compound 93 | 9.9 g (77%) | 861.31 |
| SUB 1-3 | 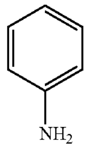 | Compound 103 | 12.9 g (75%) | 575.24 |
| SUB 1-3 | 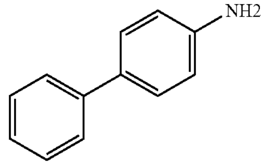 [SMILES: Nc1ccc(-c2ccccc2)cc1] | Compound 104 | 13.7 g (70%) | 651.27 |
| SUB 1-3 | SUB 2-7 | Compound 106 | 14.7 g (70%) | 701.28 |
| SUB 1-3 | SUB 2-8 | Compound 108 | 15.5 g (68%) | 761.28 |
| SUB 1-3 | 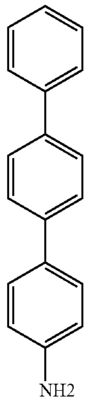 [SMILES: Nc1ccc(-c2ccc(-c3ccccc3)cc2)cc1] | Compound 110 | 7.9 g (72%) | 731.32 |

TABLE 3-continued

| Reactant 5 | Reactant 6 | Product | Yield | [M + H]+ |
|---|---|---|---|---|
| SUB 1-3 | 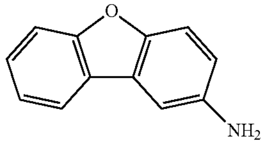 | Compound 124 | 13.0 g (65%) | 665.25 |
| SUB 1-3 | SUB 2-1 | Compound 127 | 14.7 g (66%) | 741.28 |
| SUB 1-3 | 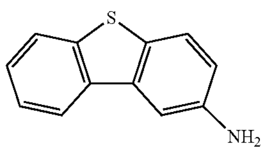 [SMILES: Nc1ccc2sc3ccccc3c2c1] | Compound 139 | 14.3 g (70%) | 681.22 |
| SUB 1-3 | SUB 2-4 | Compound 142 | 16.1 g (71%) | 757.26 |
| SUB 1-3 | 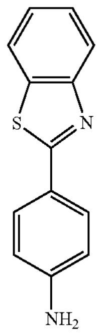 [SMILES: Nc1ccc(-c2nc3ccccc3s2)cc1] | Compound 163 | 8.4 g (79%) | 708.89 |
| SUB 1-3 | 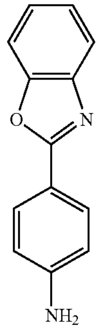 [SMILES: Nc1ccc(-c2nc3ccccc3o2)cc1] | Compound 164 | 8.1 g (78%) | 693.83 |
| SUB 1-3 | 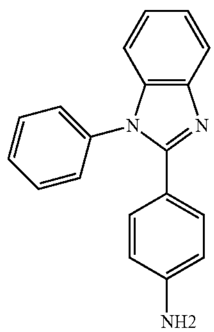 [SMILES: Nc1ccc(-c2nc3ccccc3n2-c2ccccc2)cc1] | Compound 165 | 9.4 g (82%) | 768.94 |

TABLE 3-continued

| Reactant 5 | Reactant 6 | Product | Yield | [M + H]+ |
|---|---|---|---|---|
| SUB 1-3 | 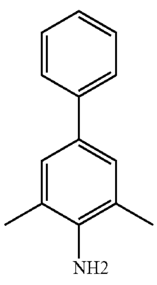 | Compound 191 | 6.12 g (60%) | 679.87 |
| SUB 1-3 | 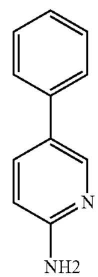 [SMILES: Nc1ccc(-c2ccccc2)cn1] | Compound 203 | 6.36 g (65%) | 652.80 |

Experimental Example 1—Verification of Single Film Properties

In order to measure the optical properties and density of the compounds, each of the compounds of Table 3 was deposited to 1,000 Å on a glass substrate (0.7 T) at a rate of 1 Å/see under a vacuum degree of 9×10−7 torr to form a single film.

In addition, single films were formed by the same manner except for using Compound A, Compound B, Compound C and Compound D (Table 4).

[Compound A]

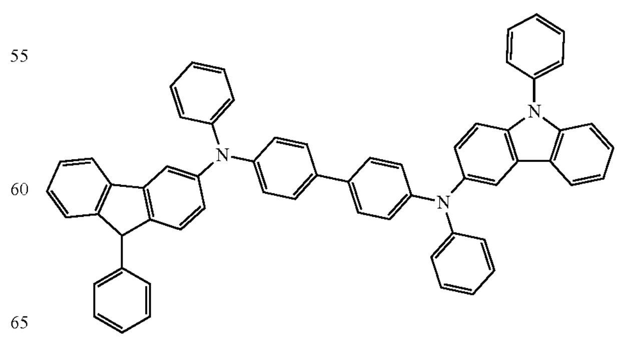

-continued

[Compound B]

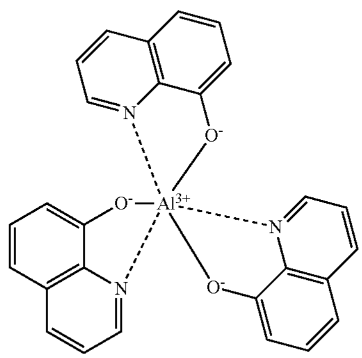

[Compound C]

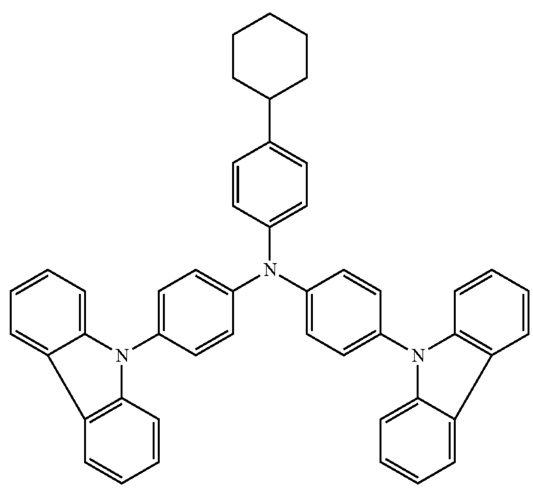

[Compound D]

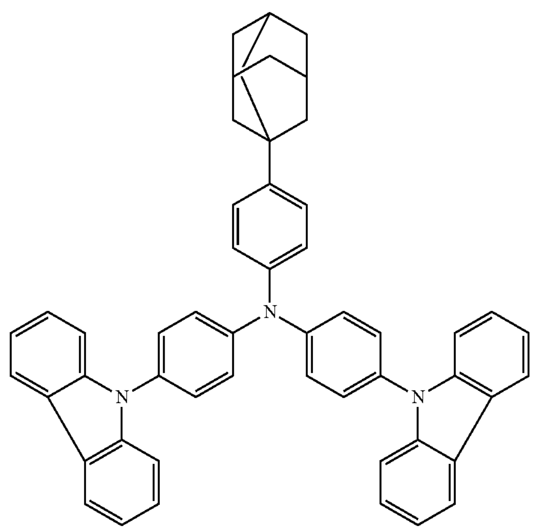

As shown in Table 4 below, for each material compound for forming a single film, the "n" (refractive index) and "k" (extinction coefficient) of the single film for evaluating optical properties were measured using an Ellipsometer equipment of J. A. WOOLLAM Co., and the density of the single film was measured by a High Resolution X-Ray Diffractometer equipment of PHILIPS Co.

TABLE 4

| Single film forming material | Density ($g/cm^3$) | 456 nm n | 456 nm k | 550 nm n | 550 nm k | 564 nm n | 564 nm k |
|---|---|---|---|---|---|---|---|
| Compound 1 | 1.15 | 1.845 | 0.00 | 1.837 | 0.00 | 1.814 | 0.00 |
| Compound 2 | 1.16 | 1.867 | 0.00 | 1.855 | 0.00 | 1.841 | 0.00 |
| Compound 8 | 1.17 | 1.864 | 0.02 | 1.855 | 0.00 | 1.838 | 0.00 |
| Compound 25 | 1.19 | 1.954 | 0.00 | 1.941 | 0.00 | 1.922 | 0.00 |
| Compound 26 | 1.19 | 1.947 | 0.00 | 1.940 | 0.00 | 1.904 | 0.00 |
| Compound 27 | 1.17 | 1.988 | 0.00 | 1.972 | 0.00 | 1.964 | 0.00 |
| Compound 40 | 1.19 | 1.963 | 0.00 | 1.933 | 0.00 | 1.921 | 0.00 |
| Compound 41 | 1.19 | 1.957 | 0.00 | 1.945 | 0.00 | 1.932 | 0.00 |
| Compound 42 | 1.17 | 1.994 | 0.00 | 1.987 | 0.00 | 1.825 | 0.00 |
| Compound 52 | 1.16 | 1.989 | 0.00 | 1.974 | 0.00 | 1.925 | 0.00 |
| Compound 53 | 1.17 | 2.110 | 0.02 | 1.943 | 0.00 | 1.934 | 0.00 |
| Compound 59 | 1.20 | 2.113 | 0.00 | 1.974 | 0.00 | 1.963 | 0.00 |
| Compound 76 | 1.20 | 2.107 | 0.00 | 2.008 | 0.00 | 1.963 | 0.00 |
| Compound 77 | 1.20 | 2.111 | 0.00 | 2.062 | 0.00 | 2.032 | 0.00 |
| Compound 78 | 1.18 | 2.109 | 0.00 | 2.040 | 0.00 | 1.995 | 0.00 |
| Compound 91 | 1.20 | 2.134 | 0.00 | 2.084 | 0.00 | 2.042 | 0.00 |
| Compound 92 | 1.20 | 2.122 | 0.00 | 2.062 | 0.00 | 2.027 | 0.00 |
| Compound 93 | 1.18 | 2.107 | 0.00 | 2.043 | 0.00 | 2.023 | 0.00 |
| Compound 103 | 1.21 | 1.908 | 0.00 | 1.834 | 0.00 | 1.825 | 0.00 |
| Compound 104 | 1.22 | 2.011 | 0.00 | 1.944 | 0.00 | 1.908 | 0.00 |
| Compound 106 | 1.21 | 2.010 | 0.00 | 1.943 | 0.00 | 1.901 | 0.00 |
| Compound 108 | 1.20 | 1.921 | 0.00 | 1.875 | 0.00 | 1.841 | 0.00 |
| Compound 110 | 1.25 | 2.027 | 0.00 | 1.932 | 0.00 | 1.925 | 0.00 |
| Compound 124 | 1.24 | 2.024 | 0.03 | 2.001 | 0.02 | 1.975 | 0.00 |
| Compound 127 | 1.23 | 2.042 | 0.03 | 2.032 | 0.02 | 1.998 | 0.00 |
| Compound 139 | 1.22 | 2.150 | 0.02 | 2.121 | 0.02 | 2.084 | 0.00 |
| Compound 142 | 1.21 | 2.174 | 0.02 | 2.166 | 0.02 | 2.102 | 0.00 |
| Compound 163 | 1.21 | 2.436 | 0.02 | 2.310 | 0.01 | 2.357 | 0.01 |
| Compound 164 | 1.22 | 2.219 | 0.03 | 2.194 | 0.02 | 2.155 | 0.00 |
| Compound 165 | 1.24 | 2.234 | 0.03 | 2.210 | 0.02 | 2.194 | 0.02 |
| Compound 175 | 1.16 | 1.995 | 0.01 | 1.811 | 0.01 | 1.799 | 0.01 |
| Compound 191 | 1.18 | 1.999 | 0.00 | 1.803 | 0.00 | 1.756 | 0.00 |
| Compound 199 | 1.20 | 1.896 | 0.00 | 1.800 | 0.00 | 1.786 | 0.00 |
| Compound 203 | 1.20 | 1.905 | 0.01 | 1.810 | 0.00 | 1.799 | 0.00 |
| Compound A | 1.05 | 1.986 | 0.02 | 1.854 | 0.00 | 1.846 | 0.00 |
| Compound B | 1.01 | 1.788 | 0.34 | 1.734 | 0.32 | 1.690 | 0.36 |
| Compound C | 1.02 | 1.954 | 0.02 | 1.881 | 0.00 | 1.832 | 0.00 |
| Compound D | 1.00 | 1.895 | 0.02 | 1.827 | 0.00 | 1.816 | 0.00 |

Referring to Table 4, the densities of the single films formed using Compound 1 to Compound 203 all were 1.15 $g/cm^3$ or more, but the densities of the single films formed using Compound A to Compound D were 1.00 to 1.05 $g/cm^3$, and it can be confirmed that there is a remarkable difference.

If the optical properties are examined, the refractive indexes of the single films formed using Compound 1 to Compound 203 all were 1.845 or more, and it can be confirmed that the refractive indexes were high.

If examining the k values of the single films formed from Compound 1 to Compound 203 at the wavelengths of 456 nm, 550 nm and 564 nm, it can be confirmed that all had values of 0.03 or less, and it can be found that extremely high transmittance was shown.

Example 1

A substrate on which an ITO anode (100 nm) of an organic light emitting diode was stacked was patterned, while distinguishing a cathode and anode area, and an insulating layer, through a photolithography process, and then, was undergone UV-ozone treatment and the surface treatment using $O_2$:$N_2$ plasma for increasing the work-function of the anode (ITO) and cleaning.

Then, on the anode, 1,4,5,8,9,11-hexaazatriphenylen-hexacarbonitrile (HAT-CN) was formed into a thickness of 10 nm as a hole injection layer (HIL).

On the hole injection layer, N4,N4,N4',N4'-tetra([1,1'-biphenyl]-4-yl)-[1,1'-biphenyl]-4,4'-diamine was vacuum deposited into a thickness of 90 nm as a hole transport layer, and on the hole transport layer (HTL), N-phenyl-N-(4-(spiro[benzo[d,e]anthracene-7,9'-fluorene]-2'-yl)phenyl)dibenzo[b,d]furan-4-amine was formed into a thickness of 15 nm as an electron blocking layer (EBL).

On the electron blocking layer (EBL), 9,10-bis(2-naphthyl)anthracene (ADN) was deposited to 25 nm as a host and about 3 wt % of 2,12-di-tert-butyl-5,9-bis(4-(tert-butyl)phenyl)-7-(3,5-di-tert-butylphenyl)-5,9-dihydro-5,9-diaza-13b-boranaphtho[3,2,1-de]anthracene (t-DABNA-dtB) was doped as a dopant. Then, 2-(4-(9,10-di(naphthalen-2-yl)anthracen-2-yl)phenyl)-1-phenyl-1H-benzo[d]imidazole and LiQ were mixed in a weight ratio of 1:1 and deposited into 25 nm thereon as an electron transport layer (ETL), and on the electron transport layer, an electron injection layer was deposited into 1 nm, and aluminum was deposited into a thickness of 100 nm as a cathode.

On the cathode, Compound 1 of Table 3 was deposited into a thickness of 1,000 Å as a capping layer.

Then, on the capping layer (CPL), a seal cap was attached using a UV curable adhesive so as to protect an organic light emitting diode from oxygen ($O_2$) or moisture in the air to manufacture an organic light emitting diode.

Examples 2 to 34

Organic light emitting diodes were manufactured by the same manner as Example 1 except for using other compounds of Table 3 instead of Compound 1 of Table 3 as the capping layer.

Comparative Examples 1 to 6

Organic light emitting diodes were manufactured by the same manner as Example 1 except for using Compound A (Comparative Example 1), Compound B (Comparative Example 2), Compound C (Comparative Example 3), Compound D (Comparative Example 4), Compound E (Comparative Example 5), and Compound F (Comparative Example 6), used in Experimental Example 1 instead of the compounds of Table 3 as the capping layer.

[Compound E]

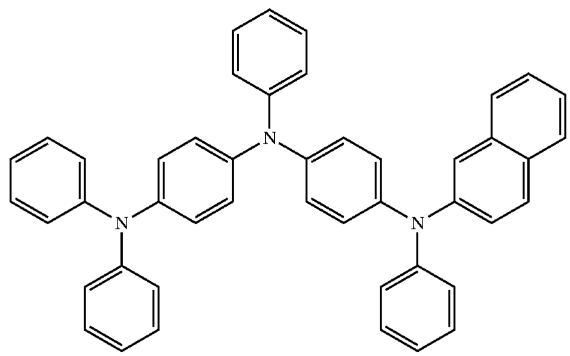

-continued

[Compound F]

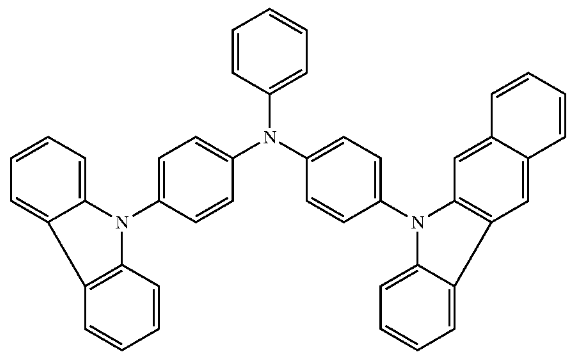

Experimental Example 2—Verification of Blue Diode Properties

For each of the organic light emitting diodes manufactured, CIE1976 color coordinate was measured with a slanted look by 30°, 45° and 80°, regarding the front as 0°, by CS-2000 of KONICA MINOLTA Co.

The color change of a measured viewing angle was calculated by the equation below based on CIE1976. In the equation, u'a and v'a are u' and v' color coordinates measured at specific angles, u'o and v'o are u' and v' color coordinates measured at a viewing angle of 0° (front). In this experiment, "a" is 30°, 45° or 60°.

$$\Delta u'v' = \sqrt{(u'_a - u'_0)^2 + (v'_a - v'_0)^2}$$

Experimental results are shown in Table 5 below.

TABLE 5

| Example/ Comparative Example | Material for capping layer | 30° color viewing angle (Δu'v') | 45° color viewing angle (Δu'v') | 60° color viewing angle (Δu'v') |
|---|---|---|---|---|
| Example 1 | Compound 1 | 0.003 | 0.003 | 0.003 |
| Example 2 | Compound 2 | 0.003 | 0.003 | 0.003 |
| Example 3 | Compound 8 | 0.003 | 0.003 | 0.003 |
| Example 4 | Compound 25 | 0.003 | 0.003 | 0.003 |
| Example 5 | Compound 26 | 0.003 | 0.003 | 0.003 |
| Example 6 | Compound 27 | 0.003 | 0.003 | 0.003 |
| Example 7 | Compound 40 | 0.003 | 0.003 | 0.003 |
| Example 8 | Compound 41 | 0.003 | 0.003 | 0.003 |
| Example 9 | Compound 42 | 0.003 | 0.003 | 0.003 |
| Example 10 | Compound 52 | 0.003 | 0.003 | 0.003 |
| Example 11 | Compound 53 | 0.003 | 0.004 | 0.004 |
| Example 12 | Compound 59 | 0.005 | 0.006 | 0.005 |
| Example 13 | Compound 76 | 0.003 | 0.003 | 0.003 |
| Example 14 | Compound 77 | 0.003 | 0.003 | 0.003 |
| Example 15 | Compound 78 | 0.003 | 0.003 | 0.003 |
| Example 16 | Compound 91 | 0.003 | 0.003 | 0.003 |
| Example 17 | Compound 92 | 0.003 | 0.003 | 0.003 |
| Example 18 | Compound 93 | 0.003 | 0.003 | 0.003 |
| Example 19 | Compound 103 | 0.003 | 0.003 | 0.003 |
| Example 20 | Compound 104 | 0.003 | 0.003 | 0.003 |
| Example 21 | Compound 106 | 0.003 | 0.003 | 0.003 |
| Example 22 | Compound 108 | 0.003 | 0.003 | 0.004 |
| Example 23 | Compound 110 | 0.003 | 0.004 | 0.004 |
| Example 24 | Compound 124 | 0.003 | 0.004 | 0.004 |
| Example 25 | Compound 127 | 0.003 | 0.004 | 0.004 |
| Example 26 | Compound 139 | 0.003 | 0.004 | 0.004 |
| Example 27 | Compound 142 | 0.003 | 0.003 | 0.003 |

TABLE 5-continued

| Example/ Comparative Example | Material for capping layer | 30° color viewing angle (Δu'v') | 45° color viewing angle (Δu'v') | 60° color viewing angle (Δu'v') |
|---|---|---|---|---|
| Example 28 | Compound 163 | 0.003 | 0.003 | 0.003 |
| Example 29 | Compound 164 | 0.003 | 0.003 | 0.003 |
| Example 30 | Compound 165 | 0.003 | 0.004 | 0.004 |
| Example 31 | Compound 175 | 0.003 | 0.004 | 0.004 |
| Example 32 | Compound 191 | 0.003 | 0.003 | 0.003 |
| Example 33 | Compound 199 | 0.003 | 0.003 | 0.003 |
| Example 34 | Compound 203 | 0.003 | 0.004 | 0.004 |
| Comparative Example 1 | Compound A | 0.010 | 0.010 | 0.011 |
| Comparative Example 3 | Compound C | 0.010 | 0.011 | 0.011 |
| Comparative Example 4 | Compound D | 0.010 | 0.010 | 0.010 |

Referring to Table 5, the color viewing angle of the organic light emitting diodes including the capping layers according to embodiments are 0.05 or less and show very excellent properties, and it can be found that a user can not recognize color change regardless of the viewing angle.

On the contrary, Comparative Examples 1, 3 and 4, having refractive indexes of 1.8 or more in Experimental Example 1, showed color viewing angles of 0.010 or more, and it can be found that the color viewing angles are large in contrast to the Examples.

Experimental Examples 3—Measurement of Driving Voltage, Efficiency and Lifetime

For the organic light emitting diodes of Examples 1 to 34 and Comparative Examples 1, 5 and 6, by using CS-2000 of KONICA MINOLTA Co., a current of 10 mA/$cm^2$ was applied, and a driving voltage (Op V), and efficiency (Cd/A) were measured, and lifetime (LT95) was measured by a method of verifying the time of the reduction of luminance from an initial luminance to 95% level by operating at a constant current of 10 mA/$cm^2$ using M6000 of McScience Co.

Measurement results are shown in Table 6.

TABLE 6

| Example/ Comparative Example | Material for capping layer | Driving voltage (Op V) | Efficiency (Cd/A) | Lifetime (LT95) |
|---|---|---|---|---|
| Example 1 | Compound 1 | 4.3 | 5.3 | 188 |
| Example 2 | Compound 2 | 4.5 | 5.4 | 189 |
| Example 3 | Compound 8 | 4.3 | 5.6 | 192 |
| Example 4 | Compound 25 | 4.4 | 5.2 | 194 |
| Example 5 | Compound 26 | 4.7 | 5.4 | 195 |
| Example 6 | Compound 27 | 4.2 | 5.3 | 194 |
| Example 7 | Compound 40 | 4.3 | 5.5 | 192 |
| Example 8 | Compound 41 | 4.6 | 5.1 | 197 |
| Example 9 | Compound 42 | 4.4 | 5.7 | 195 |
| Example 10 | Compound 52 | 4.5 | 5.8 | 196 |
| Example 11 | Compound 53 | 4.4 | 5.5 | 196 |
| Example 12 | Compound 59 | 4.5 | 5.4 | 197 |
| Example 13 | Compound 76 | 4.7 | 5.6 | 189 |
| Example 14 | Compound 77 | 4.2 | 5.4 | 191 |
| Example 15 | Compound 78 | 4.3 | 5.5 | 192 |
| Example 16 | Compound 91 | 4.5 | 6.0 | 187 |
| Example 17 | Compound 92 | 4.7 | 5.8 | 193 |
| Example 18 | Compound 93 | 4.4 | 5.5 | 195 |
| Example 19 | Compound 103 | 4.5 | 5.6 | 196 |
| Example 20 | Compound 104 | 4.4 | 5.7 | 192 |
| Example 21 | Compound 106 | 4.5 | 6.0 | 199 |
| Example 22 | Compound 108 | 4.4 | 5.8 | 193 |
| Example 23 | Compound 110 | 4.4 | 5.9 | 195 |

TABLE 6-continued

| Example/ Comparative Example | Material for capping layer | Driving voltage (Op V) | Efficiency (Cd/A) | Lifetime (LT95) |
|---|---|---|---|---|
| Example 24 | Compound 124 | 4.2 | 6.2 | 192 |
| Example 25 | Compound 127 | 4.4 | 6.1 | 194 |
| Example 26 | Compound 139 | 4.3 | 5.8 | 197 |
| Example 27 | Compound 142 | 4.7 | 5.9 | 201 |
| Example 28 | Compound 163 | 4.2 | 5.8 | 198 |
| Example 29 | Compound 164 | 4.3 | 6.2 | 196 |
| Example 30 | Compound 165 | 4.5 | 6.1 | 195 |
| Example 31 | Compound 175 | 4.5 | 5.6 | 196 |
| Example 32 | Compound 191 | 4.4 | 5.8 | 193 |
| Example 33 | Compound 199 | 4.4 | 6.1 | 189 |
| Example 34 | Compound 203 | 4.3 | 5.8 | 192 |
| Comparative Example 1 | Compound A | 4.5 | 6.3 | 162 |
| Comparative Example 5 | Compound E | 4.8 | 3.6 | 82 |
| Comparative Example 6 | Compound F | 4.9 | 3.8 | 86 |

It is generally known that materials with excellent color viewing angles tend to have reduced efficiency. In contrast, referring to Table 6, it can be confirmed that the efficiency of the Examples was excellent to the level of the Comparative Examples.

In addition, for Comparative Examples 5 and 6, including E and F, which are asymmetric compounds, it can be confirmed that thin film uniformity was not good, and the efficiency and lifetime of the diodes were significantly deteriorated.

Experimental Example 4—Measurement of Density, Refractive

Index and Color Viewing Angle according to Film Thickness

In Experimental Example 1, by changing the thickness of the single film formed using Compound 104, density and refractive indexes at a wavelength of 456 nm were measured.

In addition, in Experimental Example 2, by changing the thickness of the capping layer of the organic light emitting diode according to Example 20 (Compound 104), a 45° color viewing angle (Δu'v') was measured.

Measurement results are shown in Table 7 below.

TABLE 7

| Single film thickness | Density (g/$cm^3$) | 456 nm refractive index | 45° color viewing angle (Δu'v') |
|---|---|---|---|
| 500 Å | 1.21 | 1.744 | 0.003 |
| 700 Å | 1.22 | 1.876 | 0.004 |
| 800 Å | 1.22 | 1.894 | 0.004 |
| 1,000 Å | 1.22 | 2.011 | 0.004 |
| 1,200 Å | 1.22 | 2.012 | 0.004 |
| 1,500 Å | 1.22 | 2.013 | 0.008 |
| 2,000 Å | 1.21 | 2.013 | 0.008 |
| 2,500 Å | 1.21 | 2.013 | 0.010 |

Referring to Table 8, with a single film thickness of 500 Å, a refractive index of less than 1.8 was shown, and it is inappropriate as a capping layer, and with a single film thickness of 2,000 Å, refractive index values were not gradually increased in contrast to Example 15. In addition, with a single film thickness of 2,500 Å, a 45° color viewing angle was 0.010, and a viewing angle tended to increase. Through this, it can be found that by using a thickness range of 700 Å to 2,000 Å, it is appropriate to use a material having a high refractive index and an excellent viewing angle, and the consumption of the material of a protection layer can be reduced, and thus, commercialization is more effective.

The organic light emitting diode according to an embodiment of the present disclosure may have excellent color viewing angle characteristics, include a capping layer having a high refractive index to minimize light loss by total reflection, have excellent emission efficiency, external quantum efficiency, stability, driving voltage characteristics and life-characteristics, have excellent economic feasibility during manufacture, and excellent thin film uniformity.

Although the embodiments of the present invention have been described, it is understood that the present invention should not be limited to these embodiments, but various changes and modifications can be made by one ordinary skilled in the art within the spirit and scope of the present invention as hereinafter claimed.

What is claimed is:

1. An organic light emitting diode, comprising:

a first electrode;

a second electrode disposed opposite to the first electrode;

one or more organic layers positioned on the inside of the first electrode and the second electrode; and a capping layer positioned on at least one outside of the first electrode and the second electrode, wherein the capping layer comprises a compound represented by the following Formula 1, and a color viewing angle ($\Delta u'v'$) at viewing angles of 30°, 45° and 60° of light produced from the organic layer and emitted through the capping layer, is less than 0.010:

[Formula 1]

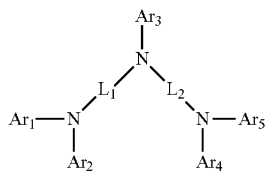

where $L_1$ and $L_2$ are the same or different, and are each independently selected from the group consisting of a single bond, a substituted or unsubstituted arylene group of 6 to 30 carbon atoms, a substituted or unsubstituted arylalkylene group of 7 to 30 carbon atoms, a substituted or unsubstituted heteroarylene group of 5 to 60 carbon atoms and a substituted or unsubstituted heteroarylalkylene group of 6 to 60 carbon atoms, $Ar_1$, $Ar_2$, $Ar_3$, $Ar_4$ and $Ar_5$ are the same or different, and are each independently selected from the group consisting of a substituted or unsubstituted aryl group of 6 to 30 carbon atoms, a substituted or unsubstituted arylalkyl group of 7 to 30 carbon atoms, a substituted or unsubstituted heteroaryl group of 5 to 60 carbon atoms, a substituted or unsubstituted heteroarylalkyl group of 6 to 60 carbon atoms, a substituted or unsubstituted arylamino group of 6 to 30 carbon atoms, a substituted or unsubstituted arylalkylamino group of 6 to 30 carbon atoms, a substituted or unsubstituted heteroarylamino group of 5 to 60 carbon atoms, a substituted or unsubstituted arylsilyl group of 6 to 30 carbon atoms and a substituted or unsubstituted aryloxy group of 6 to 30 carbon atoms, or combined with an adjacent group from each other to form a substituted or unsubstituted ring, and the substituents of $L_1$, $L_2$, $Ar_1$, $Ar_2$, $Ar_3$, $Ar_4$ and $Ar_5$ are each independently substituted with one or more substituents selected from the group consisting of deuterium, a cyano group, a trifluoromethyl group, a nitro group, a halogen group, a hydroxyl group, a trimethylsilylethynyl (TMS) group, an alkyl group of 1 to 30 carbon atoms, a cycloalkyl group of 3 to 20 carbon atoms, an alkenyl group of 2 to 30 carbon atoms, a cycloalkenyl group of 3 to 20 carbon atoms, an alkynyl group of 2 to 30 carbon atoms, a cycloalkynyl group of 3 to 20 carbon atoms, an aryl group of 6 to 30 carbon atoms, an arylalkyl group of 7 to 30 carbon atoms, a heteroaryl group of 5 to 60 carbon atoms, a heteroarylalkyl group of 6 to 60 carbon atoms, an amine group, an alkylamino group of 1 to 30 carbon atoms, an arylalkylamino group of 7 to 30 carbon atoms, an arylamino group of 6 to 30 carbon atoms, a heteroarylamino group of 5 to 60 carbon atoms, a silyl group, an alkylsilyl group of 1 to 30 carbon atoms, an arylsilyl group of 6 to 30 carbon atoms, an alkoxy group of 1 to 30 carbon atoms, an aryloxy group of 6 to 30 carbon atoms, an alkylthio group of 1 to 30 carbon atoms and an arylthio group of 6 to 30 carbon atoms, where if multiple substituents are introduced, the multiple substituents are the same or different.

2. The organic light emitting diode of claim 1, wherein $Ar_1$ and $Ar_5$ are the same, and $Ar_2$ and $Ar_4$ are the same.

3. The organic light emitting diode of claim 1, wherein $Ar_1$, $Ar_2$, $Ar_4$ and $Ar_5$ are the same or different and are each independently selected from the following Formula 2 or Formula 3:

[Formula 2]

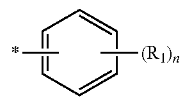

[Formula 3]

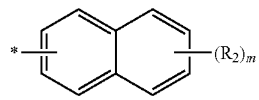

where "*" means a bonding part,

"n" is an integer of 0 to 5,

"m" is an integer of 0 to 7, and $R_1$ and $R_2$ are each independently selected from the group consisting of hydrogen, deuterium, an alkyl group of 1 to 30 carbon atoms, an aryl group of 6 to 30 carbon atoms and a heteroaryl group of 5 to 60 carbon atoms.

4. The organic light emitting diode of claim 1, wherein $Ar_1$ and $Ar_2$ are combined from each other to form a substituted or unsubstituted heteroaryl group of 5 to 60 carbon atoms, and $Ar_4$ and $Ar_5$ are combined from each other to form a substituted or unsubstituted heteroaryl group of 5 to 60 carbon atoms.

5. The organic light emitting diode of claim 1, wherein Ara is selected from the group consisting of the following Formula 4 to Formula 9:

[Formula 4]

[Formula 5]

[Formula 6]

[Formula 7]

[Formula 8]

[Formula 9]

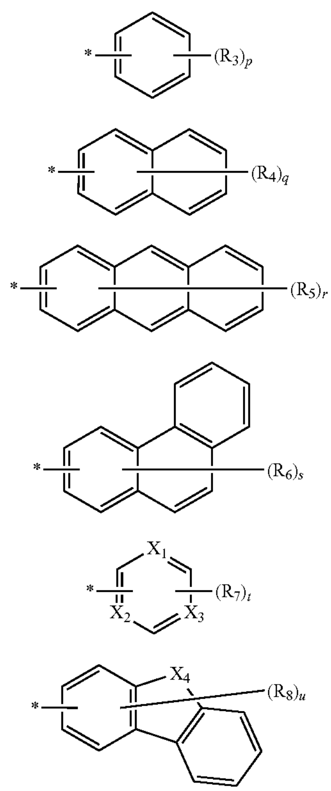

where

"*" means a bonding part,

"p" is an integer of 0 to 5,

"q" is an integer of 0 to 7,

"r" is an integer of 0 to 9,

"s" is an integer of 0 to 9,

"t" is an integer of 0 to 2,

"u" is an integer of 0 to 7, $X_1$, $X_2$, $X_3$ and $X_4$ are each independently selected from the group consisting of $C(R_9)$, $C(R_{10})(R_{11})$, N, $N(R_{12})$, O and S, and $R_3$, $R_4$, $R_5$, $R_6$, $R_7$, $R_8$, $R_9$, $R_{10}$, $R_{11}$ and $R_{12}$ are each independently selected from the group consisting of hydrogen, deuterium, an alkyl group of 1 to 30 carbon atoms, an aryl group of 6 to 30 carbon atoms and a heteroaryl group of 5 to 60 carbon atoms.

6. The organic light emitting diode of claim 1, wherein a thickness of the capping layer is 700 to 2000 Å.

7. The organic light emitting diode of claim 1, wherein a density of the capping layer is 1.15 to 1.30 $g/cm^3$.

8. The organic light emitting diode of claim 1, wherein the compound represented by Formula 1 has an extinction coefficient (k) in a wavelength band of 400 to 650 nm of 0.03 or less, and a refractive index of 1.8 or more.

9. The organic light emitting diode of claim 1, wherein the organic layer comprises one or more layers of a hole injection layer, a hole transport layer, an electron blocking layer, an emitting layer, a hole blocking layer, an electron transport layer, or an electron injection layer.

10. A display device comprising the organic light emitting diode of claim 1.

* * * * *